US011328862B1

(12) United States Patent
Hutson et al.

(10) Patent No.: US 11,328,862 B1
(45) Date of Patent: May 10, 2022

(54) DISTRIBUTION TRANSFORMER MONITOR

(71) Applicant: Ubicquia LLC, Fort Lauderdale, FL (US)

(72) Inventors: Bradford Brian Hutson, Fort Lauderdale, FL (US); Jeffrey T. Root, Fort Lauderdale, FL (US); Yevgeny Frenkel, Fort Lauderdale, FL (US); Tyler Edison Cone, Fort Lauderdale, FL (US)

(73) Assignee: Ubicquia, Inc., Fort Lauderdale, FL (US)

( * ) Notice: Subject to any disclaimer, the term of this patent is extended or adjusted under 35 U.S.C. 154(b) by 0 days.

(21) Appl. No.: 17/273,291

(22) PCT Filed: Jul. 17, 2020

(86) PCT No.: PCT/US2020/042653
§ 371 (c)(1),
(2) Date: Mar. 3, 2021

(87) PCT Pub. No.: WO2021/011918
PCT Pub. Date: Jan. 21, 2021

Related U.S. Application Data

(60) Provisional application No. 62/875,411, filed on Jul. 17, 2019.

(51) Int. Cl.
*H01F 27/40* (2006.01)
*H01F 27/42* (2006.01)
(Continued)

(52) U.S. Cl.
CPC ........... *H01F 27/402* (2013.01); *G01R 31/00* (2013.01); *H01F 27/02* (2013.01); *H01F 27/422* (2013.01)

(58) Field of Classification Search
CPC ...... H01F 27/402; H01F 27/02; H01F 27/422; G01R 31/00
(Continued)

(56) References Cited

U.S. PATENT DOCUMENTS 2,066,935 A   1/1937   Hodnette
3,035,802 A   5/1962   Wyman et al.
(Continued)

OTHER PUBLICATIONS arresterworks.com, "What is a Lightning Arrester?", http://www.arresterworks.com/ArresterFacts_files/ArresterFacts%20009%20What%20is%20an%20Arrester%20R3.pdf, Rev. 6, Aug. 2016, 18 pages.
(Continued)

*Primary Examiner* — Farhana A Hoque
(74) *Attorney, Agent, or Firm* — Daniel C. Crilly; Thomas Satagaj

(57) ABSTRACT

A distribution transformer monitor includes a housing arranged for positioning in proximity to a distribution transformer vessel. The monitor also includes a sensor arranged in the housing, which is positioned to generate digital data associated with at least one environmental condition that exists inside the distribution transformer vessel, and a processing circuit arranged to determine from the generated digital data that the at least one environmental condition has crossed a threshold. The sensor may include any one or more of a temperature sensor, a camera, an accelerometer, a pressure sensor, and a microphone.

18 Claims, 18 Drawing Sheets

(51) Int. Cl.
*H01F 27/02* (2006.01)
*G01R 31/00* (2006.01)

(58) Field of Classification Search
USPC .......................................................... 324/500
See application file for complete search history.

(56) References Cited

U.S. PATENT DOCUMENTS

| | | |
|---|---|---|
| 3,462,645 A | 8/1969 | Leonard |
| 3,739,226 A | 6/1973 | Seiter et al. |
| 3,772,624 A | 11/1973 | Keogh |
| 5,131,283 A | 7/1992 | Canfield |
| 6,147,581 A | 11/2000 | Rancourt et al. |
| 6,711,512 B2 | 3/2004 | Noh |
| 6,914,195 B2 | 7/2005 | Archambault et al. |
| 7,548,054 B2 | 6/2009 | Tan et al. |
| 7,701,357 B2 | 4/2010 | Deaver, Sr. et al. |
| 7,834,736 B1 | 11/2010 | Johnson et al. |
| 8,013,702 B2 | 9/2011 | Haj-Maharsi et al. |
| 8,174,268 B2 | 5/2012 | Bose et al. |
| 8,400,320 B2 | 3/2013 | Santos |
| 8,461,823 B2 | 6/2013 | de Buda |
| 8,824,109 B2 | 9/2014 | Ciesielski et al. |
| 10,014,791 B2 | 7/2018 | Bala |
| 10,259,634 B2 | 4/2019 | Bennett |
| 10,761,147 B2 | 9/2020 | Beaudet et al. |
| 2006/0251147 A1 | 11/2006 | Balan |
| 2010/0315190 A1 | 12/2010 | Haj-Maharsi et al. |
| 2013/158897 A1 | 6/2013 | Jain |
| 2015/0276890 A1 | 10/2015 | Turner et al. |
| 2016/0203694 A1* | 7/2016 | Högasten ........... G08B 21/0476 348/164 |
| 2021/0043373 A1 | 2/2021 | Ortiz et al. |

OTHER PUBLICATIONS

Hubbell Power Systems, Inc., "Surge Arresters IEC Line Discharge Classes 2, 3, 4 & 5", Feb. 2015, 17 pages, Hubbell/Ohio Brass, Aiken, South Carolina, USA.

* cited by examiner

DISTRIBUTION TRANSFORMER MONITOR

BACKGROUND

Technical Field

The present disclosure generally relates to high-voltage distribution transformers. More particularly, but not exclusively, the present disclosure relates to monitoring certain conditions associated with a distribution transformer's vessel such as temperature, pressure, and a surge arrestor.

Description of the Related Art

Distribution transformers receive power at a first, higher voltage from a feeder or primary distribution main and transform that power to a second, lower voltage. The transformed power is supplied to a secondary distribution main, a consumer service line, or some other lower voltage power conduit. In many cases, the feeder and primary distribution mains, and the consumer lines and secondary distribution mains are constructed overhead and particularly subject to lightning disturbances. In other cases, the transformers are constructed at ground-level, constructed in subterranean vaults, or constructed at some other location.

It has been known since the early 1900s that such distribution transformers can fail catastrophically. The failure of the distribution transformer may be caused by a lightning strike at the site of the transformer, a lightning strike in proximity to the transformer, an excessive overload (e.g., short-circuit, heavy load) on a consumer service line or secondary distribution main, a failure of the transformer itself (e.g., an insulation failure, an internal fault in the transformer winding, or the like), an unexpected and environmental condition such as flooding or exceptionally high ambient temperature, or some other event or condition.

In some cases, when a distribution transformer fails, the failure can cause inconvenience via a service outage. In some cases, the failure may also cause property damage, environmental damage, injuries or death to living things, or some combination thereof. If a distribution transformer explodes, for example due to excessive internal temperature or pressure, the explosion may cause a sustained power outage, damage to the structure around the transformer (e.g., a light pole), damage to structures or vehicles in proximity to the exploding transformer, a release of known environmentally hazardous materials (e.g., polychlorinated biphenyls (PCBs)), or other damages.

A catastrophic failure of a transformer that results in an explosion is often precipitated by an increased pressure within the transformer vessel. To prevent such a catastrophic failure, it has been known for many decades to provide electrical distribution transformers with pressure relief means.

FIG. 1A is a known distribution transformer bearing a known pressure relief valve. FIG. 1B is the pressure relief valve 40 of FIG. 1A in more detail. Collectively, FIGS. 1A and 1B may be referred to herein as FIG. 1. Structures earlier identified are not repeated for brevity.

U.S. Pat. No. 3,772,624 to Keogh teaches the known pressure relief valve of FIG. 1A. The pressure relief valve of FIG. 1A opens automatically to limit the total pressure rise within a transformer vessel 10. In more detail, an electrical distribution transformer has a cylindrical metal vessel 10 supported on a vertical wooden pole 11 by bolts 12, which extends through hanger brackets 14 welded to a sidewall 15 of the vessel 10 and protrude through the wooden pole 11.

The vessel 10 is closed by a metallic cover 16 with a resilient nitrile rubber gasket 17 compressed therebetween, and cover 16 is releasably attached to the vessel 10 by a flexible banding strap 19. The ends of banding strap 19 are connected by releasable tensioning means 20. Cover 16 may have a hand hole 22, which permits access to an interior of the vessel 10, and which is normally closed by a hand hole cover 23 with a resilient nitrile rubber gasket 24 compressed therebetween.

A distribution transformer core and coil assembly 26 is immersed in and insulating dielectric fluid 27 such as transformer oil. The core and coil assembly 26 may include a pair of magnetic cores 28 wound from magnetic steel having back-to-back sides defining a core winding leg, which is encircled by a winding assembly 29 having a primary winding coil connected by suitable conductors 32 to primary insulating bushings 36 mounted on cover 16 and a secondary winding connected by suitable conductors 33 to secondary insulating bushings 34 affixed to the sidewall 15 of the vessel 10.

Nitrile rubber gasket 17 is intended to prevent the transformer oil from deteriorating in dielectric strength as a result of moisture and air entering the vessel 10. When this happens, dangerous over pressures may build up internal to the vessel 10 as a result of arcing beneath the oil or as a result of incipient fault current, which is not of sufficiently high magnitude to rupture a primary fuse link 35.

To relieve the elevated pressure, a pressure relief valve 40 is mounted in a sidewall 15 of the vessel 10 adjacent to pole 11. The pressure relief valve 40 is positioned above and upper level of the oil 27. The pressure relief valve 40 is arranged to automatically operate to an open position when a first predetermined pressure (e.g., five pounds per square inch (5 psi)) builds up within the vessel 10. Opening the pressure relief valve 40 vents to the atmosphere and towards the pole 11 an explosive gas mixture resulting from arcing under the oil. When enough venting has occurred that pressure in the vessel falls below a predetermined level (e.g., 2 psi), the pressure relief valve 40 will reclose and reseal the vessel 10.

FIG. 1B is the pressure relief valve 40 of FIG. 1A shown in cross-section and with a handle 71 affixed thereto. The pressure relief valve 40 includes a cylindrical metal valve body 41, which extends through an aperture 43 in the sidewall 15 of the vessel 10. The pressure relief valve 40 has external threads 44, which engage internal threads in a metallic ring 46 welded to the sidewall 15 of the vessel 10. The internal threads of the metallic ring 46 surround the aperture 43. A resilient gasket 48 is compressed between a circumferential flange 49 intermediate the ends of valve body 41 external of the vessel 10 and the vessel sidewall 15. The resilient gasket 48 forms a hermetic seal for the pressure relief valve 40 at aperture 43.

Pressure relief valve body 41 has a conical axial opening defining a tapered valve seat 51 and a conical axial compartment 52. The pressure relief valve body 41 is arranged having a hexagonal tool engaging surface 53, which facilitates rotatably joining the valve body 41 with the vessel 10 using a suitable socket, wrench, or other tool.

The pressure relief valve body 41 has an integral spring retainer formed via an annular valve stem guide 55 Co. axial with the valve body 41 and disposed in a plane normal to the axis of valve body 41 adjacent the smaller diameter end of conical compartment 52 and spaced from the wall of valve body 41 defining conical compartment 52 and also being integral with a plurality of ribs 56, which extend radially from the annular valve stem 55. The axial conical openings 51 and 52 at opposite ends of the pressure relief valve body 41 communicate through a cylindrical axial opening 57 in the valve body 41. An elongated valve stem 59 is reciprocable axially of axial opening 57 in the pressure relief valve body 41 and protrudes through the annular valve stem guide 55.

At its outer end, valve stem 59 has a circular valve head 63 with a substantial dimension in the axial direction. Valve head 63 has a circumferential tapered peripheral face 64, which is complementary to conical valve seat 51. A circumferential groove 66 is provided in tapered face 64, and a resilient gasket 67 is disposed within circumferential groove 66. Valve stem 59 may be threaded at its inner end and a cylindrical compression spring 68 circumferentially adjacent to valve stem 59 is compressed between the annular valve stem guide portion 55 and a nut 70 threaded on the inner end of valve stem 59 to urge gasket 67 on valve head 63 against conical valve seat 51 to seal pressure relief valve 40.

In operation, pressure internal to the vessel 10 is exerted against the valve head 63. When the first predetermined pressure exists within the vessel 10, valve stem 59 is lifted from a position shown in full lines in FIG. 1B to the position shown in dashed lines, and such lifting vents the vessel 10 to the atmosphere and limits the rising pressure. The predetermined pressure at which the pressure relief valve 40 operates to lift the valve stem 59 to the open position may be adjusted by turning nut 70 relative to valve stem 59, which changes the loading on compression spring 68.

The pressure relief valve 40 in FIG. 1B has a handle 71 affixed to valve head 63. The handle 71 is accessible from the exterior of vessel 10 and may be manually operated to vent vessel 10. The manual operation includes pulling handle 71 to move valve stem 59 longitudinally against the bias of spring 68. As described in the present disclosure, known pressure relief valves are arranged automatically, manually, or automatically and manually to vent a distribution transformer vessel and prevent a catastrophic failure of the distribution transformer.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which, in and of itself, may also be inventive.

BRIEF SUMMARY

The following is a summary of the present disclosure to provide an introductory understanding of some features and context. This summary is not intended to identify key or critical elements of the present disclosure or to delineate the scope of the disclosure. This summary presents certain concepts of the present disclosure in a simplified form as a prelude to the more detailed description that is later presented.

The device, method, and system embodiments of the new distribution transformer monitor described in this disclosure (i.e., the teachings of this disclosure) improve on known protection schemes for distribution transformers. In addition to a known pressure relief valve, the inventive distribution transformer monitor embodiments described herein are arranged to provide additional protections for distribution transformers, living things, and property by monitoring any one or more of in-vessel oil temperature, in-vessel oil level, in-vessel air pressure, exterior air temperature proximate to the distribution transformer vessel, electrical output parameters of the distribution transformer, and certain parameters of a surge arrestor (e.g., the continuity of a metal-oxide varistor (MOV)). These additional protections may be further or alternatively provided by monitoring other parameters, properties, conditions, and the like, and in at least some cases, additional protections may be provided by aggregating data from a plurality of distribution transformer monitors. In these cases, some or all of the aggregated data may be analyzed with an artificial intelligence engine to identify impending fault conditions, maintenance conditions, or other conditions. In at least some embodiments, the monitor system embodiments described herein also include a perceptible user interface (e.g., a controllable pilot light, a transceiver, an audio output, or the like) that permits ground crews or others to verify, for example from ground level, that no reportable faults have been detected in a particular transformer.

In a first embodiment, a distribution transformer monitor includes a housing arranged for positioning proximate to a distribution transformer vessel that is filled with a non-conductive medium; a processing circuit arranged in the housing and configured to determine, from generated digital data, that at least one environmental condition existing inside the distribution transformer vessel has crossed a threshold; and a sensor electrically coupled to the processing circuit, the sensor positioned to generate at least some of the digital data associated with the at least one environmental condition.

In some cases, the sensor of the first embodiment includes an infrared camera sensor. In these and other cases, the housing is mechanically coupleable to the distribution transformer vessel in an orientation that aligns a field of view of the infrared camera sensor with a sidewall portion of the distribution transformer vessel that windows a fill level of the non-conductive medium. Sometimes in the first embodiment, the processing circuit is further arranged to generate an alert based on a determination that the at least one environmental condition has crossed the threshold. In these and other cases, the at least one environmental condition includes a temperature, a pressure, an electrical voltage, or an electrical current; and these and still other cases, the distribution transformer monitor includes a transceiver arranged to wirelessly communicate the alert to a remote computing device.

In some cases, the distribution transformer monitor of the first embodiment includes a pressure sensor electrically coupled to the processing circuit, the pressure sensor arranged to generate pressure data representative of a pressure inside the distribution transformer vessel, wherein the generated digital data includes at least some of the pressure data. In some cases, the distribution transformer monitor includes a Rogowski circuit electrically coupled to the processing circuit, the Rogowski circuit arranged to generate electrical data representative of at least one of an electrical voltage and an electrical current inside the distribution transformer vessel, wherein the generated digital data includes at least some of the electrical data. And in some cases, the housing of the distribution transformer monitor is between about three inches long (3 in.) and about twenty-four inches long (24 in.), the housing is between about two inches wide (2 in.) and about eight inches wide (8 in.), and between about one inch tall (1 in.) and about eight inches tall (8 in.). Sometimes, the housing of the distribution transformer monitor of the first embodiment includes at least one indicator legend arranged to facilitate positioning of the housing in a substantially vertical orientation relative to the distribution transformer vessel.

In a second embodiment, a method comprises: collecting data with at least one electronic sensor positioned outside of a distribution transformer vessel, said distribution transformer vessel containing a distribution transformer that is immersed in a non-conductive medium and electrically coupled to a high voltage line; receiving the collected data from the at least one electronic sensor at a processing device arranged inside a housing of a distribution transformer monitor that is positioned proximate to a distribution transformer vessel; monitoring, with the processing device, one or more environmental conditions present inside the distribution transformer vessel, said one or more environmental conditions being represented by at least some of the collected data; based on the monitoring, asserting a warning signal when a first environmental condition has crossed a predetermined threshold; and communicating digital data to a remote computing device, the digital data including at least one digital data value drawn from the collected data and the warning signal.

In some cases of the second embodiment, the at least one electronic sensor includes at least one of an infrared camera sensor, a pressure sensor, and a Rogowski circuit. In these and other cases, the one or more environmental conditions include a level of non-conductive medium inside the distribution transformer vessel. And sometimes, the one or more environmental conditions include at least one of a temperature, a pressure, an electrical voltage, and an electrical current.

In some cases of the second embodiment, the method also comprises: processing, at the remote computing device, a plurality of sets of digital data received, respectively, from a plurality of distribution transformer monitors; determining from the processing at least one pattern formed from data included in the plurality of sets of digital data; and identifying an impending maintenance condition in at least one distribution transformer based on the at least pattern. In some cases of the second embodiment, the method also comprises: positioning the housing of the distribution transformer monitor in a substantially vertical orientation relative to the distribution transformer vessel based at least in part on an indicator legend formed on the housing.

In a third embodiment, a non-transitory computer-readable storage medium includes stored contents that configure a computing system to perform a method, and the method comprises: receiving electronic data generated by at least one sensor located external and proximate to a distribution transformer vessel, said distribution transformer vessel containing a distribution transformer that is immersed in a non-conductive medium and electrically coupled to a high voltage line, said electronic data being a representation of at least one condition inside the distribution transformer vessel; comparing at least some of the received electronic data to a predetermined threshold; and based on the comparing, asserting an alert indicating that at least some of the received electronic data has crossed the predetermined threshold.

In some cases of the third embodiment, the method further comprises: wirelessly communicating the alert to a remote computing device. Sometimes, the electronic data includes data representing at least one of a temperature, a pressure, an electrical voltage, and an electrical current present inside the distribution transformer vessel. And in some cases, the method still further comprises: wirelessly communicating the alert to a remote computing device; receiving a plurality of electronic data generated by a respective plurality of sensors located external and proximate to a respective plurality of distribution transformer vessels, each of said distribution transformer vessels containing a respective distribution transformer that is immersed in a respective non-conductive medium and electrically coupled to a respective high voltage line, said plurality of electronic data being a representation of at least one condition inside the respective distribution transformer vessel; detecting at least one pattern in the plurality of received electronic data; and identifying at least one impending maintenance condition in at least one of the plurality of distribution transformers based on the at least one pattern.

In a fourth embodiment, a monitor system for a distribution transformer, comprises: a processing circuit; a pressure sensor coupled to the processing circuit, the pressure sensor arranged to generate pressure data representing a pressure inside a distribution transformer vessel; a first camera coupled to the processing circuit, the first camera arranged to generate infrared temperature data representing temperature information inside the distribution transformer vessel; a thermometer coupled to the processing circuit, the thermometer arranged to generate ambient temperature data representing ambient temperature information outside the distribution transformer vessel; a second camera coupled to the processing circuit, the second camera arranged to generate digital picture information representing a state of a surge arrestor; an audio sensor coupled to the processing circuit, the audio sensor arranged to capture audio information in proximity to the distribution transformer; an electrical parameter detection circuit coupled to the processing circuit, the electrical parameter detection circuit arranged to generate electrical state information representing at least one of a voltage, a current, and a power generated in the distribution transformer; at least one accelerometer coupled to the processing circuit, the accelerometer arranged to generate physical status information associated with the distribution transformer; a location determination circuit coupled to the processing circuit, the location determination circuit arranged to generate location information associated with the distribution transformer; a transceiver coupled to the processing circuit; and a memory having processor circuit-executable instructions stored therein. In this embodiment, the processing circuit-executable instructions are arranged to cause the processing circuit to: generate a first determination, based on the pressure data, whether a pressure threshold has been crossed; generate a second determination, based on the infrared temperature data, whether a first temperature threshold has been crossed; generate a third determination, based on the ambient temperature data, whether a second temperature threshold has been crossed; generate a fourth determination, based on the audio information, whether a surge arrestor has been utilized, exhausted, depleted, expended, consumed, deteriorated, or otherwise exercised; generate a fifth determination, based on the electrical state information, whether an electrical threshold has been crossed; generate a sixth determination, based on the physical status information whether the distribution transformer has tilted beyond a first tilt threshold; and direct the transceiver to communicate an alert message in response to at least one of the determinations, said alert message including the location information.

This Brief Summary has been provided to describe certain concepts in a simplified form that are further described in more detail in the Detailed Description. The Brief Summary does not limit the scope of the claimed subject matter, but rather the words of the claims themselves determine the scope of the claimed subject matter.

BRIEF DESCRIPTION OF THE SEVERAL VIEWS OF THE DRAWINGS

Non-limiting and non-exhaustive embodiments are described with reference to the following drawings, wherein like labels refer to like parts throughout the various views unless otherwise specified. The sizes and relative positions of elements in the drawings are not necessarily drawn to scale. For example, the shapes of various elements are selected, enlarged, and positioned to improve drawing legibility. The particular shapes of the elements as drawn have been selected for ease of recognition in the drawings. One or more embodiments are described hereinafter with reference to the accompanying drawings in which.

DETAILED DESCRIPTION

The present disclosure may be understood more readily by reference to this detailed description and the accompanying figures. The terminology used herein is for the purpose of describing specific embodiments only and is not limiting to the claims unless a court or accepted body of competent jurisdiction determines that such terminology is limiting. Unless specifically defined herein, the terminology used herein is to be given its traditional meaning as known in the relevant art.

The present disclosure generally relates to high-voltage distribution transformers. In more detail, the present disclosure relates to monitoring certain conditions associated with distribution transformer's vessel such as temperature, pressure, and a surge arrestor.

Figure 1A:
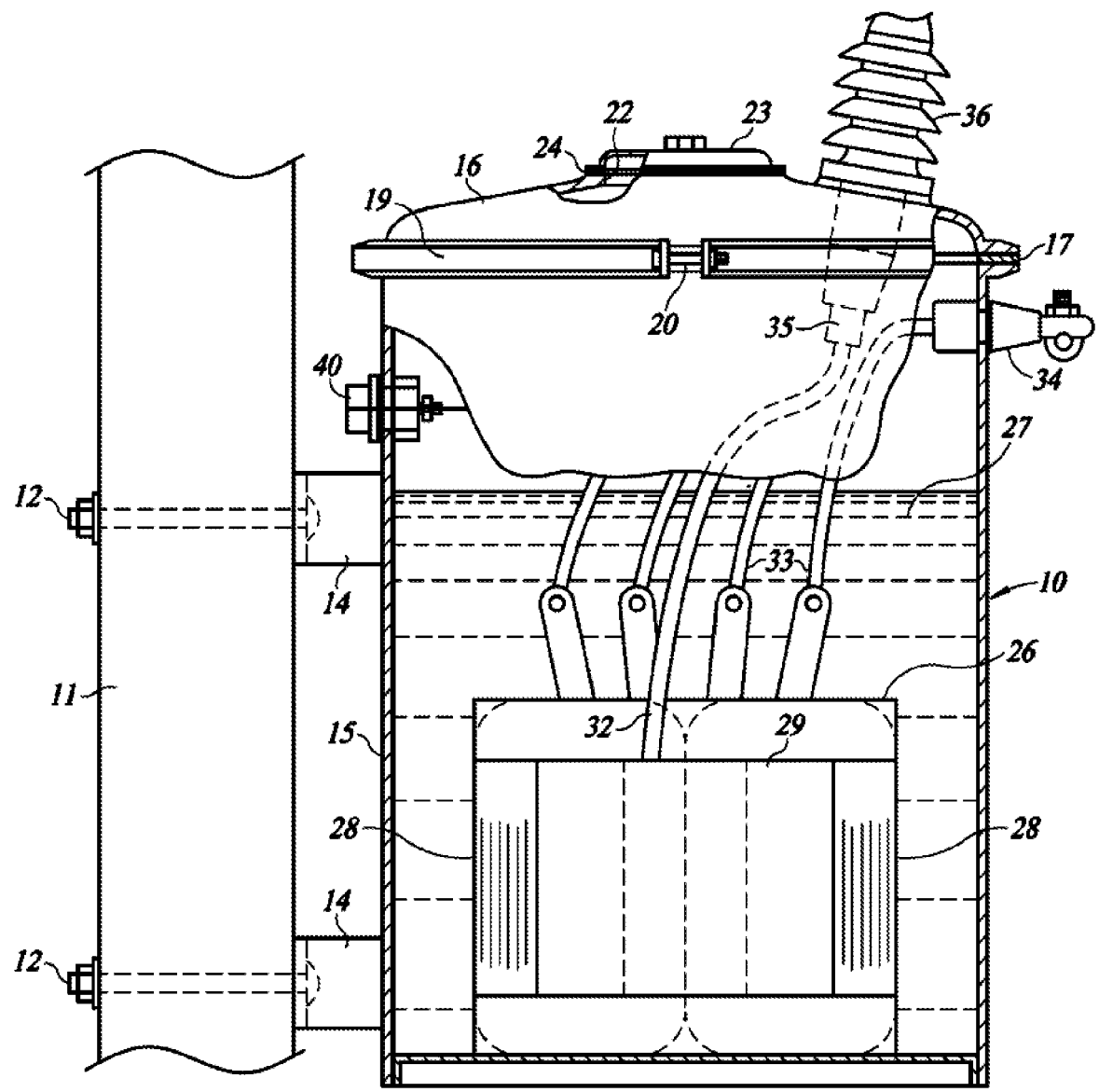
FIG. 1A is a known distribution transformer bearing a known pressure relief valve.
Figure 1B:
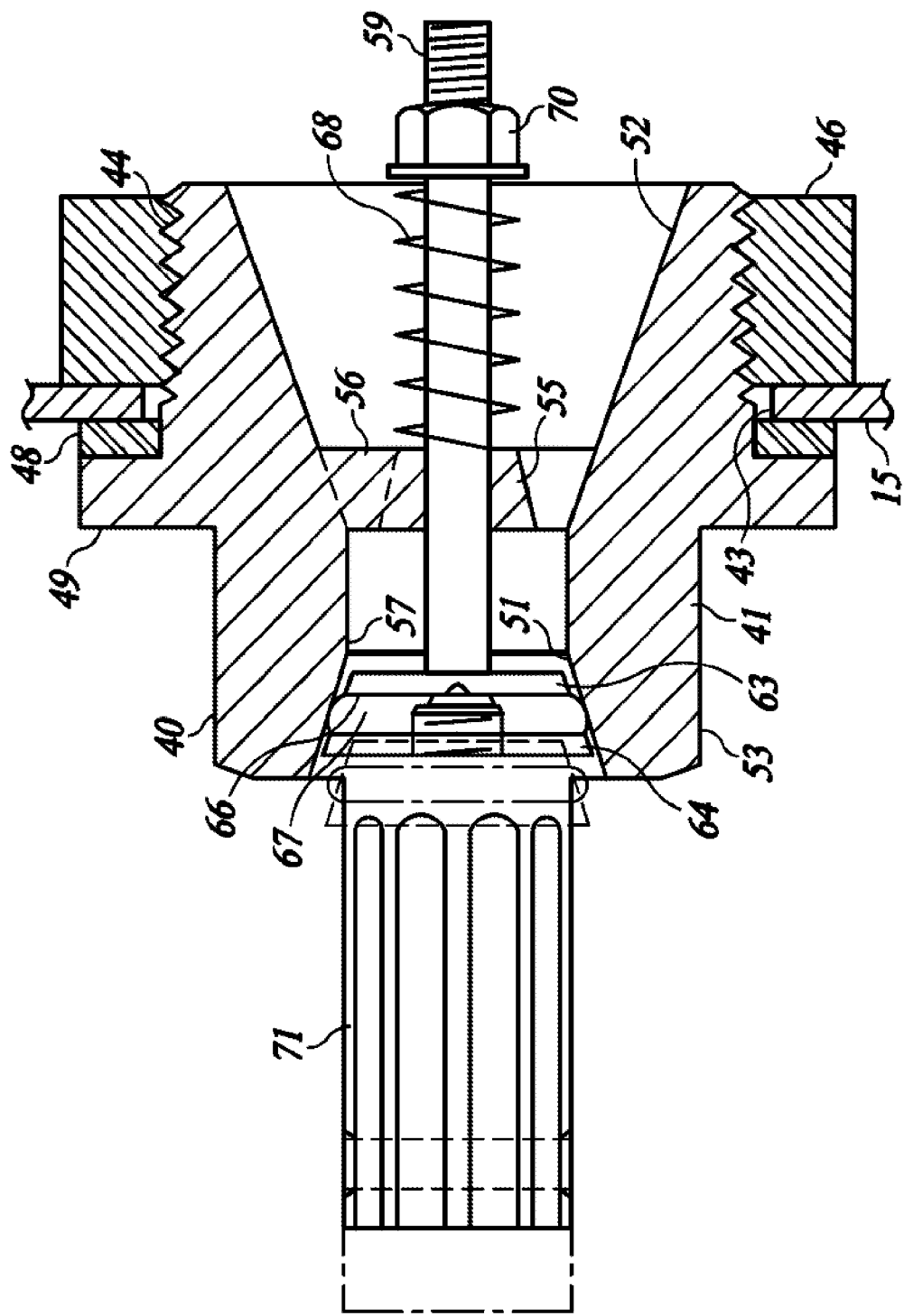
FIG. 1B is the pressure relief valve 40 of FIG. 1 with a handle 71 affixed thereto.

The present inventors have recognized that conventional distribution transformers and their safety mechanisms have not changed in decades. Distribution transformers are generally deployed in one of only a few different ways. For example, distribution transformers may be aerially mounted (e.g., on poles, buildings, or other structures), configured at or below ground level, configured in vaults, or arranged to operate at some other location. Once deployed, these distribution transformers rely on a conventional pressure relief valve 40 (FIG. 1) and a conventional surge arrestor for safety. In view of this recognition, the inventors have devised a new distribution transformer monitor. The device, method, and system embodiments of the new distribution transformer monitor described in this disclosure (i.e., the teachings of this disclosure) improve on the known protection schemes (e.g., pressure relief valves, surge arrestors) for distribution transformers.

In addition to known pressure relief valves and known surge arrestors, the inventive distribution transformer monitor embodiments described herein are arranged to provide additional protections for distribution transformers, living things, and property by monitoring any number of parameters, conditions, and circumstances that exist or arise inside of distribution transformer vessels and in proximity to distribution transformers. A non-limiting, and non-exhaustive list of parameters, conditions, and circumstances include monitoring in-vessel oil temperature, in-vessel oil level, in-vessel air pressure, exterior air temperature proximate to the distribution transformer vessel, electrical input, output, or input and output parameters of the distribution transformer, and certain parameters of a surge arrestor. These additional protections may be further or alternatively provided by monitoring other parameters, properties, conditions, and the like, and in at least some cases, additional protections may be provided by aggregating data from a plurality of distribution transformer monitors. In these cases, some or all of the aggregated data may be analyzed with an artificial intelligence engine to identify impending fault conditions, maintenance conditions, or other conditions.

In at least some cases, the monitor system embodiments described herein also include a perceptible user interface (e.g., a controllable pilot light, a transceiver, an audio output, or the like) that permits ground crews or others to verify, for example from ground level, that no reportable faults have been detected in a particular transformer. In these cases, the ground crew may determine that the distribution transformer is operating normally. In these and in other embodiments, a perceptible user interface may further include a website or other network accessible construct that permits a user to monitor, in real time, the status of a plurality of distribution transformers. In such a system, a computing server, which may be referred to as a cloud server or other like device, may collect and process data communicated from the plurality of distribution transformers.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with computing systems including client and server computing systems, as well as networks have not been shown or described in detail to avoid unnecessarily obscuring descriptions of the embodiments.

Figure 2A:
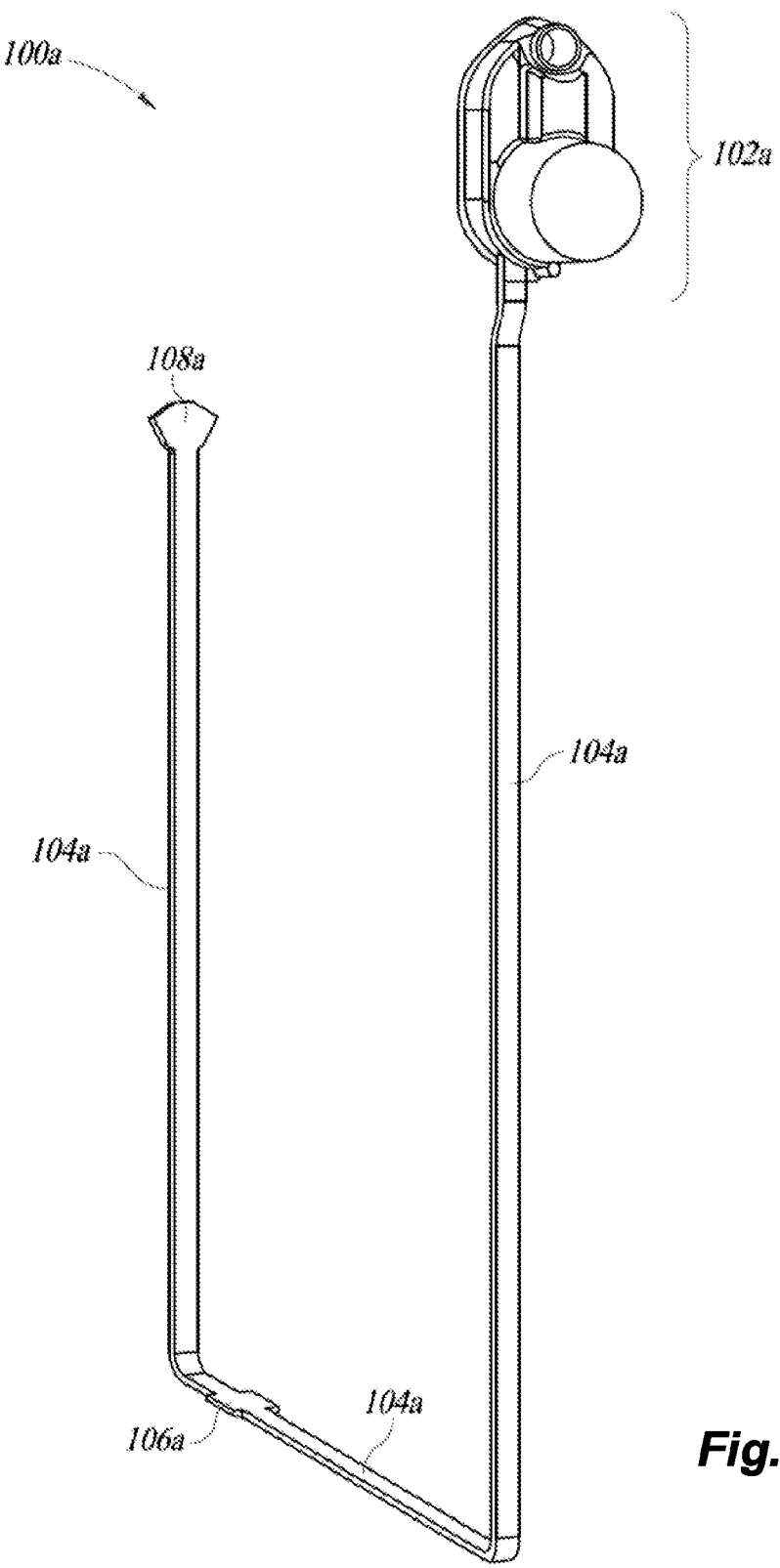
FIG. 2A is a perspective view of a first embodiment of a distribution transformer monitor.
Figure 2B:
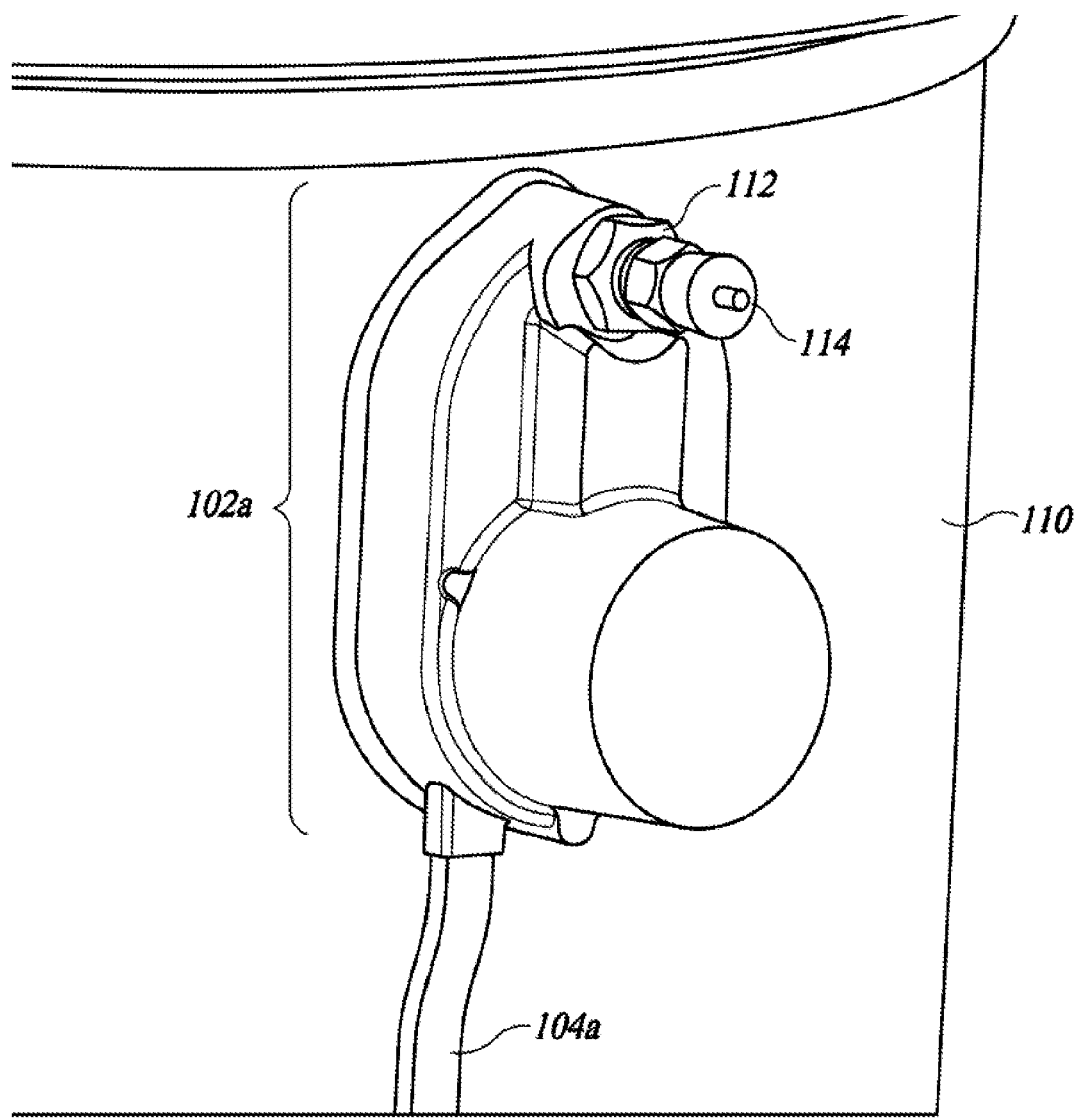
FIG. 2B is a perspective view of a first portion of the first distribution transformer monitor embodiment of FIG. 2A mounted on a distribution transformer vessel.
Figure 2C:
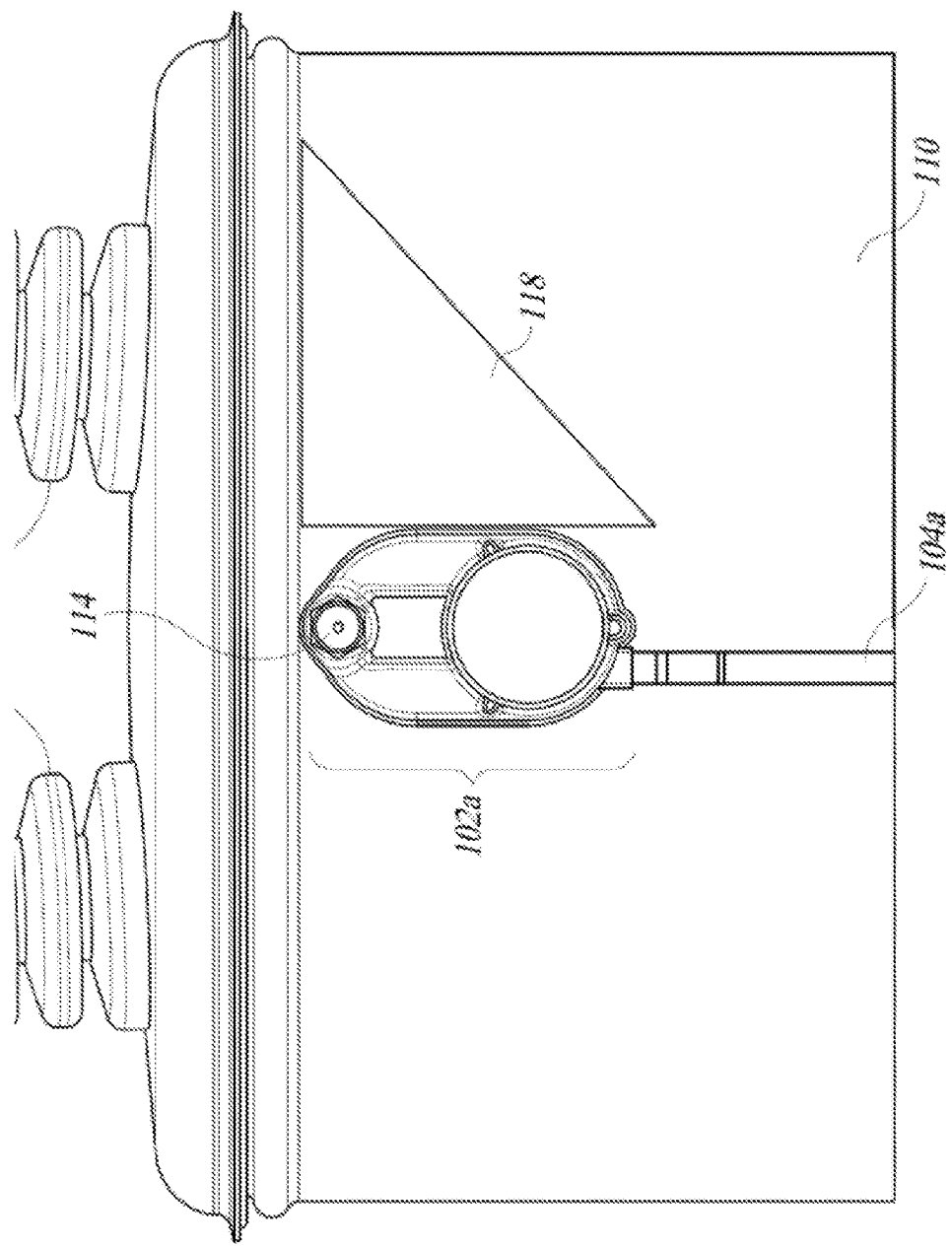
FIG. 2C is a front facing view of the first portion of the first distribution transformer monitor embodiment of FIG. 2B.
Figure 2D:
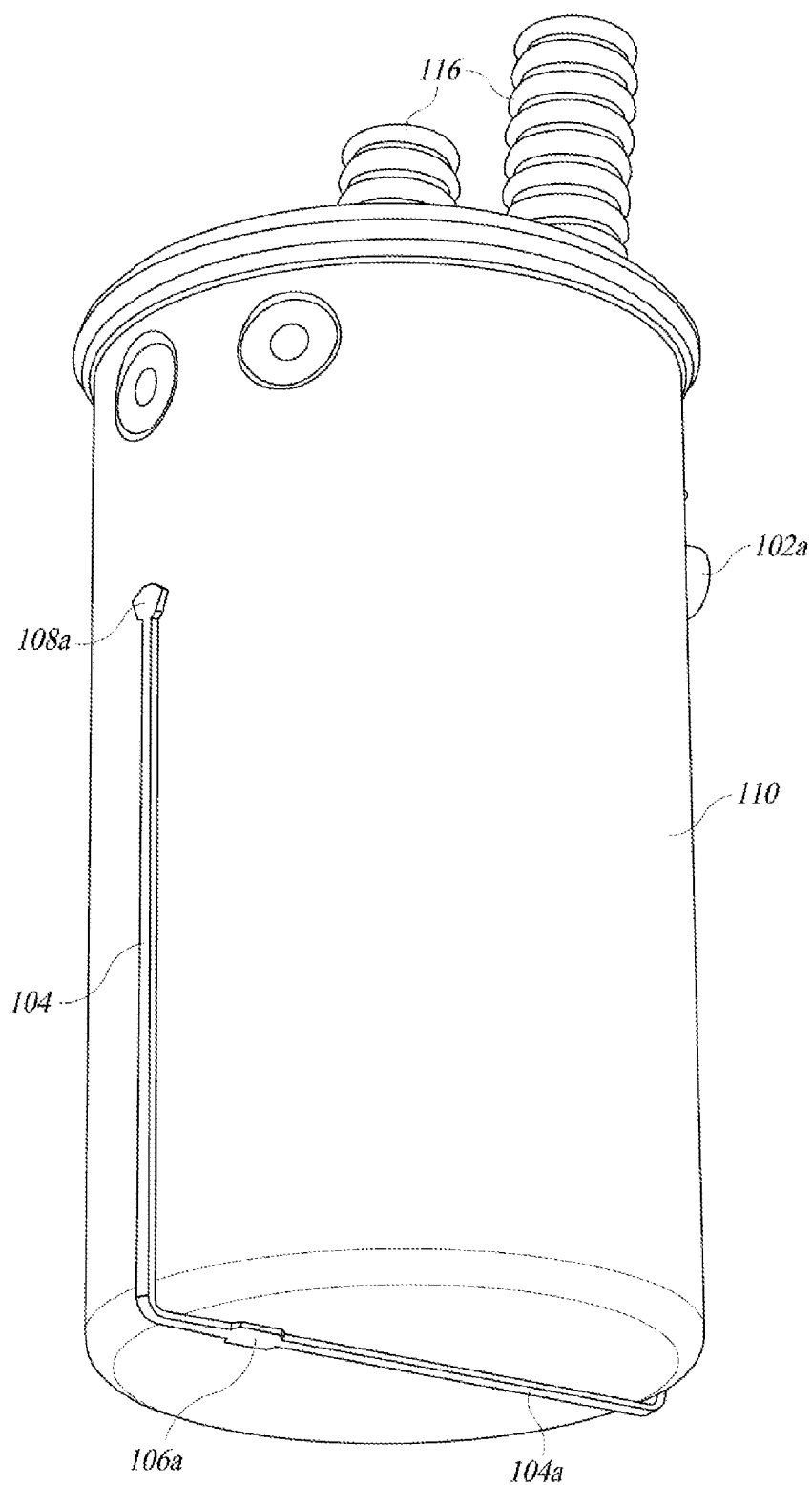
FIG. 2D is another perspective view of a $2^{nd}$ portion of the first distribution transformer monitor embodiment of FIG. 2A.

FIG. 2A is a perspective view of a first embodiment of a distribution transformer monitor 100a. FIG. 2B is a perspective view of a first portion of the first distribution transformer 100a of FIG. 2A mounted on a distribution transformer vessel 110. FIG. 2C is a front facing view of the first portion of the first distribution transformer monitor 100a of FIG. 2B. FIG. 2D is another perspective view of a second portion of the first distribution transformer monitor 100a embodiment of FIG. 2A. Collectively, any of FIGS. 2A-2D may be referred to herein as FIG. 2. Structures earlier identified are not repeated for brevity.

The first embodiment of a distribution transformer monitor 100a includes four identified portions. A first portion includes a housing 102a, a second portion includes signal conduction means 104a, a third portion includes a securing means 106a, and a fourth portion includes an operational testing means 108a.

The housing 102a of the distribution transformer monitor 100a may be formed of any suitable shape or combination of shapes. For example, in at least some cases, the housing 102a is between about four inches long (4 in.) and about fourteen inches long (14 in.), the housing 102a is between about two inches wide (2 in.) and about seven inches wide (7 in.), and between about one inch tall (1 in.) and about six inches tall (6 in.). Other dimensions are also contemplated. (e.g., FIG. 9E). The housing 102a may include one or more chambers to contain any number of electronic circuits and sensors including a processing circuit or two or more processing circuits working cooperatively, one or more cameras, one or more audio circuits (e.g., microphone, piezo-sensor, speaker), one or more accelerometer circuits, one or more temperature (e.g., thermometer) circuits, one or more current detection (e.g., Rogowski) circuits, one or more location (e.g., global positioning system (GPS)) circuits, one or more transceiver circuits (e.g., cellular-based, IEEE 802.11-based, LAN-based, optically-based, or any other suitable communications medium), one or more human interface device (HID) circuits, and any other suitable circuits.

The housing 102a may be formed of any suitable material or combination of materials. For example, the housing 102a may be formed from any one or more of a steel-based material, an aluminum-based material, an alloy, fiberglass, plastic resin material, a composite material, a glass-filled material, a nylon material, a polycarbonate material, a heat stabilizing material, a heat conductive material, an electrical insulator material, an ultraviolet (UV) radiation resistant material, or any other metallic and non-metallic materials. In at least some cases, the housing 102a is substantially formed from a material that is substantially non-conductive electrically. In at least some cases, the housing 102a is formed from a material having an operating range that includes at least 140 degrees Fahrenheit.

The housing 102a may be internally coated, externally coated, internally and externally coated, or not coated at all. The coating, if applied, may be partial coating or a complete coating, and the coating, if applied, may be arranged as any suitable number of layers. Any coating, if applied, may be a paint, a dye, a polymer, or some other suitable material. The coating may be sprayed, anodized, sputtered, brushed, immersed, layered, baked-on, or formed from some other suitable process. In at least some cases, the coating may be arranged as a protective barrier. In such cases, the coating may be a barrier to protect against weather elements (e.g., low temperature such as below 32 degrees Fahrenheit, high temperature such as above 90 degrees Fahrenheit, wind, moisture such as by rain, humidity, fog, snow, and the like), animal damage, insect damage, vandalism, and any other physical assaults.

As discussed in the present disclosure, the housing 102a is arranged to contain a plurality of structures that monitor one or more features of an associated distribution transformer.

The signal conduction means 104a is formed in three identified sections of the distribution transformer monitor 100a of FIG. 2A. Other distribution transformer monitor embodiments may have more or fewer sections including, in some cases, a single flexible section that is positioned to contact and follow one or more contours of the transformer vessel. In some cases, a distribution transformer monitor embodiment may not have any signal conduction means 104a outside of the housing 102a.

The signal conduction means 104a may conduct power, control signals, or power and control signals. The signal conduction means 104a may have one, two, or any number of separate and distinct conductors. Individual conductors of the signal conduction means 104a may be formed of solid wire, stranded wire, or some other conduit. Some or all of the conductors of a signal conduction means 104a may have the same structure (e.g., stranded, solid, or the like), the same conductive material (e.g., copper, aluminum, or the like), the same insulative material (e.g., plastic, rubber, silicone, or the like), and the same dimensions (e.g., gauge, diameter, or the like). Some or all of the conductors of a signal conduction means 104a may have different structure, conductive material, insulative material, dimensions, or any other characteristics. In at least some cases, some portion of a signal conduction means 104a may be formed with one or more transceivers arranged for wireless communications.

In at least some cases, the signal conduction means 104a includes two separate and distinct conductors arranged to provide power into the housing 102a. In at least some of these cases and other cases, the signal conduction means 104a includes two other or additional separate and distinct conductors to carry signals that represent current flowing through a distribution transformer located in an associated distribution transformer vessel.

A suitable signal conduction means 104a may be any suitable length and any suitable shape. The signal conduction means 104a of the distribution transformer monitor 100a is arranged to "wrap" around a substantially cylindrical distribution transformer vessel having certain dimensions. In some cases, each signal conduction means 104a is arranged with defined dimensions and shapes for a particular distribution transformer vessel, and in other cases, signal conduction means are arranged with flexible dimensions and shapes suitable for adaptation to a plurality of distribution transformer vessels.

The distribution transformer monitor 100a of FIG. 2A includes a single securing means 106a. In other cases, a distribution transformer monitor may have zero, two, or some other number of securing means 106a. The securing means is arranged to fixedly or removably couple one or more structures such as a signal conduction means 104a and an operational testing means 108a to a distribution transformer vessel. The signal securing means 106a in some cases is formed from a magnet or magnetic material. In these and other cases, a signal securing means may be arranged with a chemical adhesive (e.g., glue, epoxy, or the like), a clamp, a weld, screws, bolts, a shaped compartment, or any other suitable bonding structure.

The distribution transformer monitor 100a of FIG. 2A includes at least one operational testing means 108a. Other distribution transformer monitors may include some other number of operational testing means 108a. Still other distribution transformer monitors do not include any operational testing means 108a. In some cases, the operational testing means 108a includes a circuit to detect, measure, or otherwise determine the presence and in some cases the amount of electromagnetic energy associated with a distribution transformer. In at least one case, the operational testing means 108a includes a Rogowski coil circuit.

In at least some cases, the same or similar materials and coatings used or otherwise available to form the housing 102a may also be used to form one or more protective structures about the signal conduction means 104a, the securing means 106a, and the operational testing means 108a. Along these lines, the distribution transformer monitor 100a may be arranged to resist environmental damage, nuisance damage (e.g., animals, insects, human vandalism), and the like. The distribution transformer monitor 100a may further be arranged via color, shape, texture, and the like to blend with a distribution transformer vessel environment and thereby be unobtrusive, un-noticeable, unremarkable, or otherwise disguised. Conversely, the distribution transformer monitor 100a may be arranged to stand out from an associated distribution transformer vessel and thereby be easily noticed, wherein such notice can signal an observer that the distribution transformer is being monitored.

FIG. 2B is a perspective view of a first portion of the first distribution transformer monitor embodiment of FIG. 2A mounted on a distribution transformer vessel 110. In particular, FIG. 2B shows the housing 102a and a portion of the signal conduction means 104a of the distribution transformer monitor 100a. The distribution transformer monitor 100a in FIG. 2A is mounted to a distribution transformer vessel 110. In the embodiment of FIG. 2B, the housing 102a is positioned about a pressure conveyance adapter (See FIG. 3; not shown in FIG. 2B), but other means of mounting a distribution transformer monitor are also contemplated. A locking collar 112 secures the housing 102a of the distribution transformer monitor 100a to the distribution transformer vessel 110. A pressure relief valve 114 is rotatably positioned in the pressure conveyance adapter.

FIG. 2C is a front facing view of the first portion of the first distribution transformer monitor 100a embodiment of FIG. 2B. The housing 102a, signal conduction means 104a, and distribution transformer vessel 110 are identified. The pressure relief valve 114 is also identified. Two distribution transformer insulators 116 are identified, and a right-angle indicator legend 118 is indicated in FIG. 2C. In some cases, the legend 118 is a virtual legend that is not visible on the distribution transformer vessel. In other cases, the right-angle indicator legend 118 or some other such indicia is a registration feature printed, etched, painted, molded, engraved, adhered, or otherwise present in or on the distribution transformer vessel 110.

The right-angle indicator legend 118 may be useful, in at least some cases, to position the housing 102a of the distribution transformer monitor 100a in a substantially vertical orientation relative to the distribution transformer vessel 110.

FIG. 2D is another perspective view of a second portion of the first distribution transformer monitor embodiment of FIG. 2A. In FIG. 2D, the distribution transformer monitor 100a is positioned in proximity to a distribution transformer vessel 110. The housing 102a of the distribution transformer monitor 100a and the signal conduction means 104a of the distribution transformer monitor 100a are identified. The securing means 106a and operational testing means 108a are also identified. The distribution transformer vessel 110 includes two distribution transformer insulators 116.

Figure 3A:
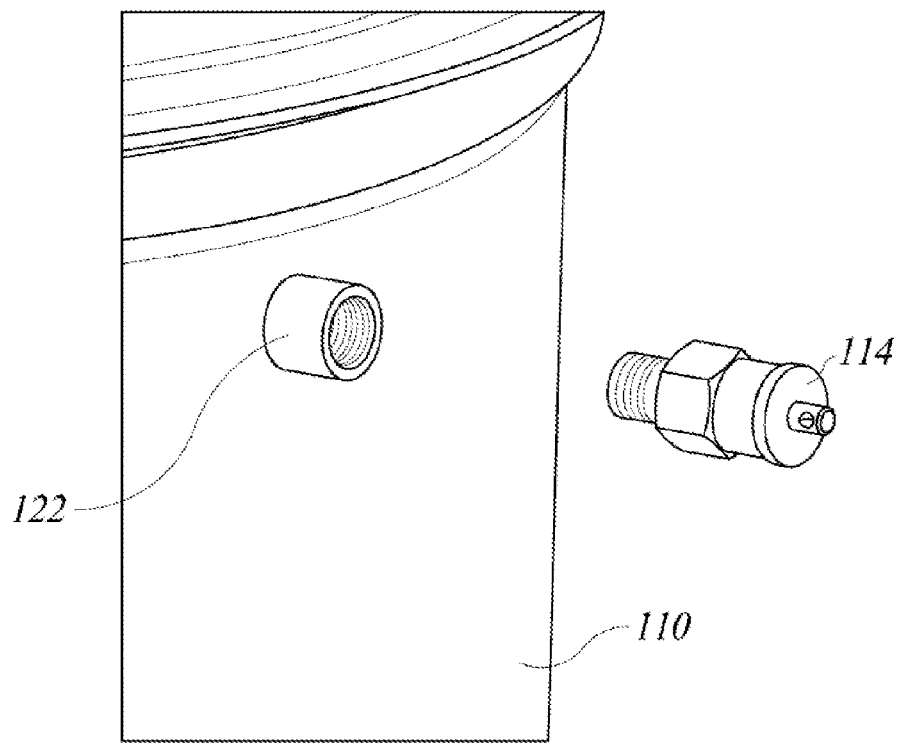
FIG. 3A is a conventional pressure relief valve removed from a distribution transformer vessel.
Figure 3B:
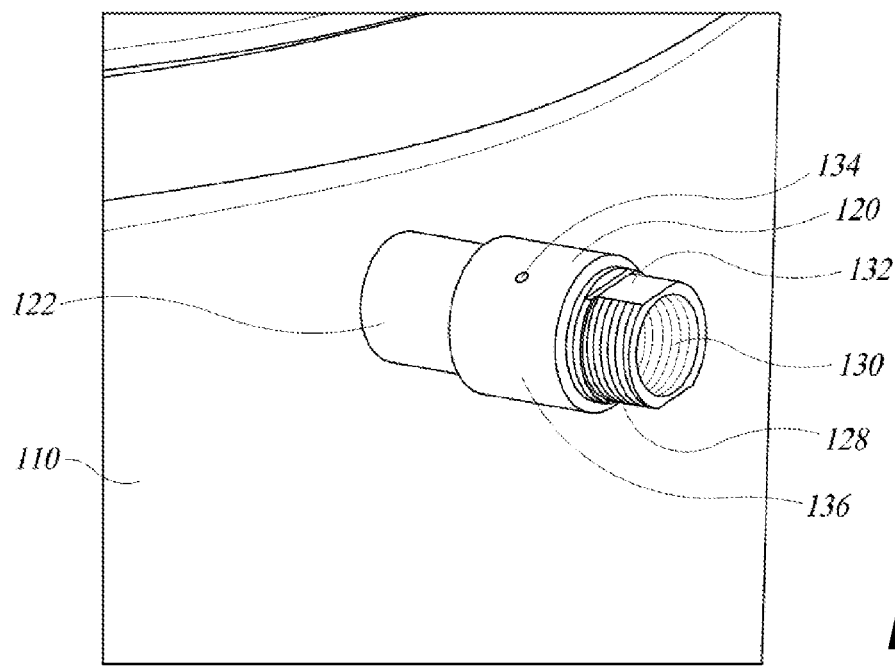
FIG. 3B is a pressure conveyance adapter removably positioned in a through-vessel aperture of a distribution transformer vessel.
Figure 3C:
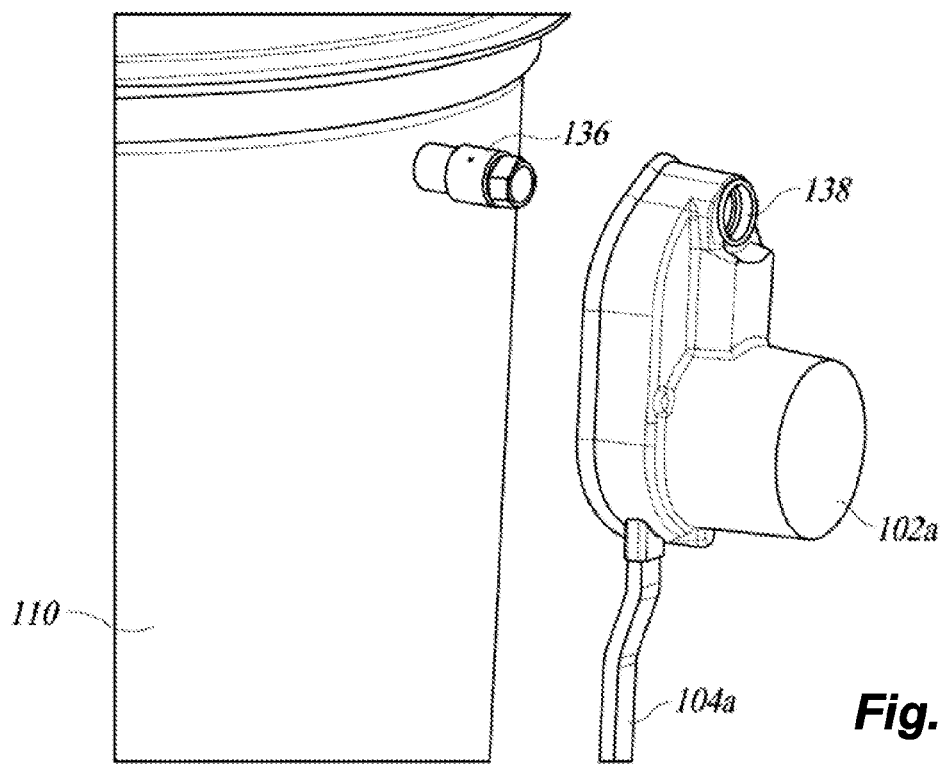
FIG. 3C is the first distribution transformer monitor embodiment of FIG. 2A in the process of being mounted on the distribution transformer vessel.
Figure 3D:
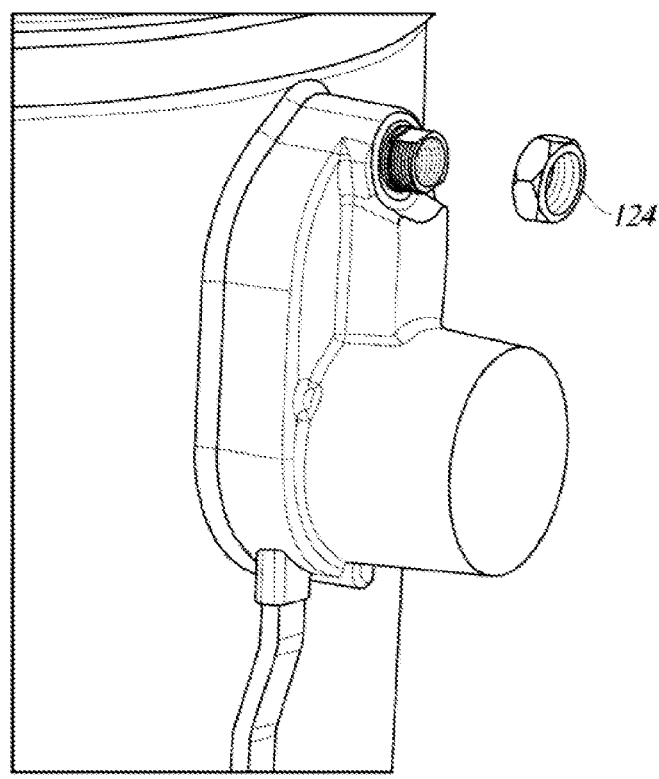
FIG. 3D is the first distribution transformer monitor embodiment of FIG. 2A positioned on the pressure conveyance adapter of FIG. 3B.
Figure 3F:
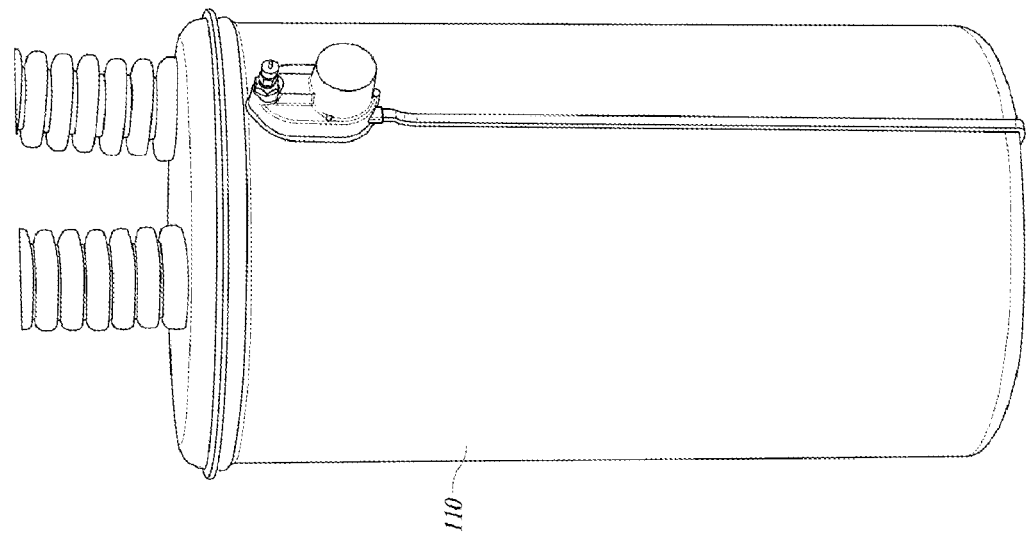
FIG. 3F is a perspective view of the first distribution transformer monitor embodiment of FIG. 2A mounted on a distribution transformer vessel.
Figure 3E:
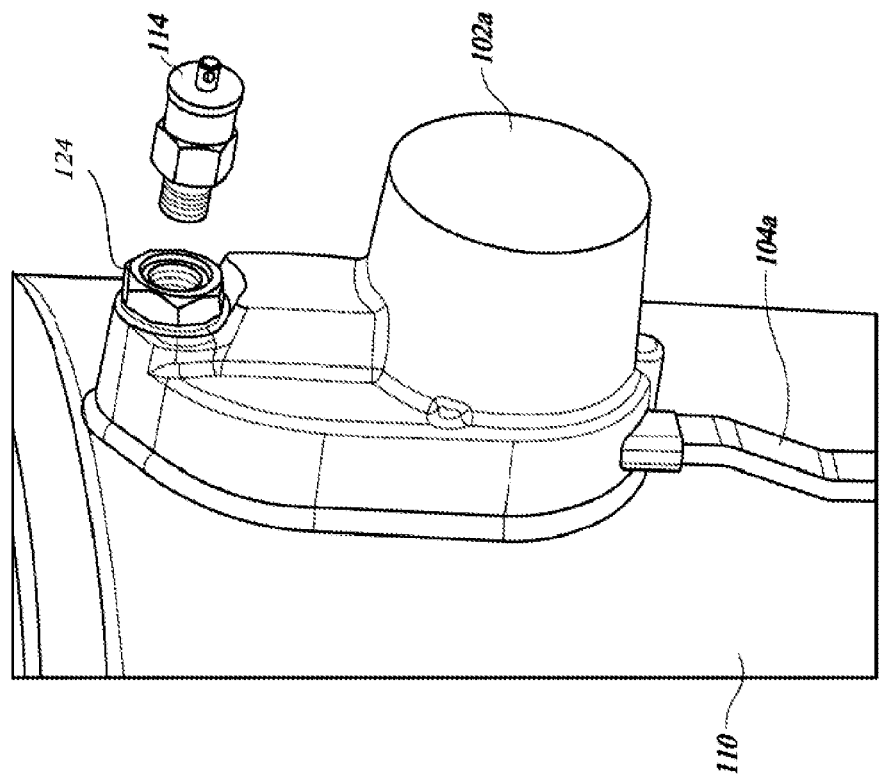
FIG. 3E is the first distribution transformer monitor embodiment of FIG. 2A removably secured via a locking collar to the distribution transformer vessel and the pressure conveyance adapter is in the process of receiving a pressure relief valve.

FIGS. 3A-3F illustrate an embodiment of an installation procedure to mount a distribution transformer monitor 100a onto a distribution transformer vessel 110. In FIG. 3A, a conventional pressure relief valve 114 has been removed from a distribution transformer vessel 110. In FIG. 3B, a pressure conveyance adapter 120 has been removably positioned in a through-vessel aperture 122 of a distribution transformer vessel 110. In FIG. 3C, a housing 102a of the first distribution transformer monitor 100a embodiment of FIG. 2A is in the process of being mounted on the distribution transformer vessel 110, and in FIG. 3D, the housing 102a is positioned on the pressure conveyance adapter 120 embodiment of FIG. 3B. In FIG. 3E, the housing 102a of the first distribution transformer monitor 100a embodiment of FIG. 2A is removably secured via a locking collar 124 to the distribution transformer vessel 110, and the pressure conveyance adapter 120 is in the process of receiving a pressure relief valve 114. FIG. 3F is a perspective view of the first distribution transformer monitor 110A embodiment of FIG. 2A mounted on a distribution transformer vessel 110. Collectively, any of FIGS. 3A-3F may be referred to herein as FIG. 3. Structures earlier identified are not repeated for brevity.

FIG. 3A is a conventional pressure relief valve 114 removed from a distribution transformer vessel 110. The pressure relief valve 114 of FIG. 3 is along the lines of the pressure relief valve 40 of FIG. 1.

FIG. 3B is a pressure conveyance adapter 120 removably positioned in a through-vessel aperture 122 of a distribution transformer vessel 110. The pressure conveyance adapter 120 has a substantially cylindrical barrel portion with a proximal end a distal end. An external surface of the proximal end of the barrel portion has integrated threads 126 (FIG. 6) arranged to mate with the threaded aperture 122 (FIG. 6) in the distribution transformer vessel 110. An external surface of the central portion 136 of the barrel portion is arranged to receive the housing 102a of a distribution transformer monitor such as the distribution transformer monitor 100a embodiment of FIG. 2A. An internal surface of the distal end of the barrel portion 130 is threaded to rotatably receive a pressure relief valve 114, and an external surface of the distal end of the barrel portion 128 is threaded to rotatably receive a locking collar 124 (FIG. 3D).

To affix the pressure conveyance adapter 120 into the through-vessel aperture 122, and to remove the pressure conveyance adapter 120 from the through-vessel aperture 122, the distal end of the pressure conveyance adapter 120, or some other portion, may optionally include a pressure conveyance adapter engagement means 132. The engagement means 132 may be one or more flattened surfaces, knurled surfaces, shaped surfaces, or some other suitable feature to engage a tool (e.g., a wrench, pliers, gloved fingers, or the like) that is used to rotate (e.g., loosen, tighten) the pressure conveyance adapter 120.

The barrel portion of the pressure conveyance adapter 120 has at least one through-barrel aperture 134 arranged to communicate a same level of pressure present inside the distribution transformer vessel 110 through the pressure conveyance adapter 120. In at least some cases, as will be discussed herein, a sensor is positioned proximate to the at least one through-barrel aperture 13 and arranged to generate digital data based on a pressure internal to the distribution transformer vessel 110. In other embodiments, an electronic pressure sensor is arranged to detect a same or otherwise representative level of pressure present within inside the distribution transformer vessel 110 in a different way.

FIG. 3C is the distribution transformer monitor 110A embodiment of FIG. 2A in the process of being mounted on the distribution transformer vessel 110. The housing 102a of the distribution transformer monitor 110A has a sealable aperture 138. The pressure conveyance adapter 120 has an external surface at its central portion 136, which is arranged to receive the housing 102a of the distribution transformer monitor 110A at the sealable aperture 138. As explained in the present disclosure, after the housing 102a is received by the pressure conveyance adapter 120, the through-barrel aperture 134 is sealed from the outside environment.

FIG. 3D is the housing 102a of the first distribution transformer monitor 110A embodiment of FIG. 2A positioned on the pressure conveyance adapter 120, and a locking collar 124 is in the process of being applied. Once applied, the locking collar 124 will bind the housing 102a to the distribution transformer vessel 110. The binding may be permanent or temporary. The locking collar may be arranged as a nut, a pin, an adhesive, a clamp, or any other suitable locking means.

FIG. 3E is the distribution transformer monitor 110A embodiment of FIG. 2A removably secured via a locking collar (e.g., a locking nut) to a distribution transformer vessel 110. In FIG. 3E, the pressure conveyance adapter 110 is in the process of receiving a pressure relief valve 114. The pressure relief valve 114 may be the same pressure relief valve 114 as was removed in FIG. 3A. Alternatively, the pressure relief valve 114 of FIGS. 3A and 3E may be different. In at least some cases, the through-vessel aperture 122 and the aperture in the distal end of the pressure conveyance adapter 120 may have a same thread pattern. Alternatively, the through-vessel aperture 122 and the aperture in the distal end of the pressure conveyance adapter 120 may have a different thread pattern.

FIG. 3F is a perspective view of the first distribution transformer monitor 110A embodiment of FIG. 2A mounted on a distribution transformer vessel 110.

In one exemplary embodiment, FIG. 3 illustrates the removal of a pressure relief valve 114, which is saved. In another act, a pressure conveyance adapter 120 is installed in the distribution transformer vessel 110. The housing 102a of the distribution transformer monitor 110A is pressed or otherwise fitted onto pressure conveyance adapter 120. A locking collar 124 (e.g., a nut) is screwed onto the pressure conveyance adapter 120, and the pressure relief valve 114 that was removed earlier is screwed into pressure conveyance adapter 120. A signal conduction means (e.g., a wire harness) is routed, and remote sensors (e.g., a harness built with integral operational testing means 108a (e.g., Rogowski coil)) and securing means 106a (e.g., magnetic/adhesive anchors) are used to suitably attach the signal conduction means 104a to the distribution transformer vessel 110.

Figure 4:
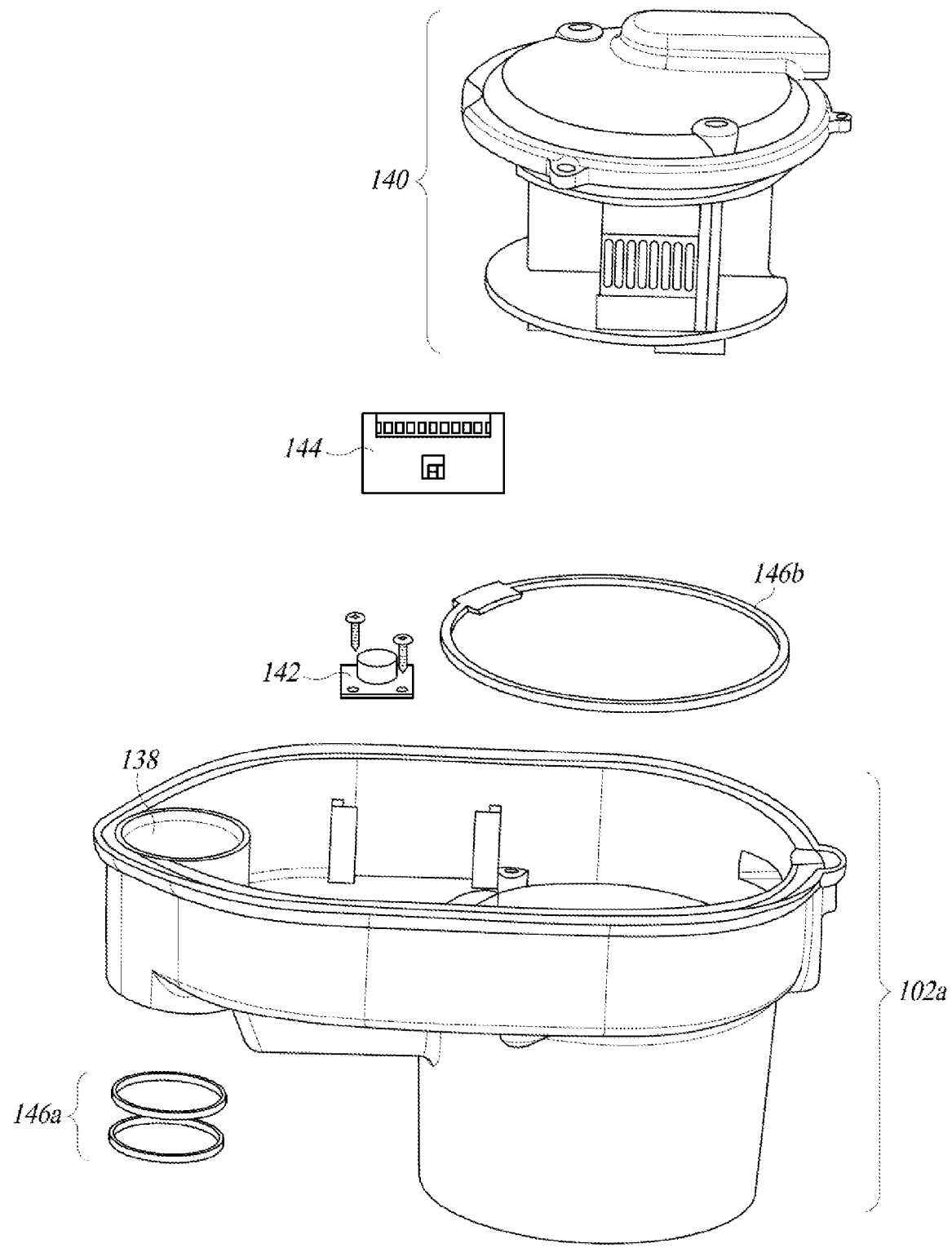
FIG. 4 is a breakout view of the housing of the first distribution transformer monitor embodiment of FIG. 2A.

FIG. 4 is a breakout view of the housing 102a of the first distribution transformer monitor 100a embodiment of FIG. 2A. The housing 102a is expressly identified, and the sealable aperture 138 of the housing 102a is expressly identified. When assembled, the housing contains several structures including an electronics module 140, an infrared image sensor 142, a micro-electrical-mechanical-system (MEMS) based pressure sensor 144, a first sealing means 146a arranged as a pair of gaskets to seal the sealable aperture 138, and a second sealing means 146b arranged as a gasket to seal the electronics module 140 against any moisture that may otherwise ingress the housing 102a after the monitor is bound to a wall of the distribution transformer vessel 110.

Components arranged within one or more chambers of the housing 102a in the embodiment of FIG. 4 are exemplary. Other components arranged to perform similar functions in similar ways to achieve similar results may be implemented in other embodiments. Accordingly, the circuitry, modules, elements, features, and other structures may be further understood in view of the description herein of FIG. 7.

Figure 5:
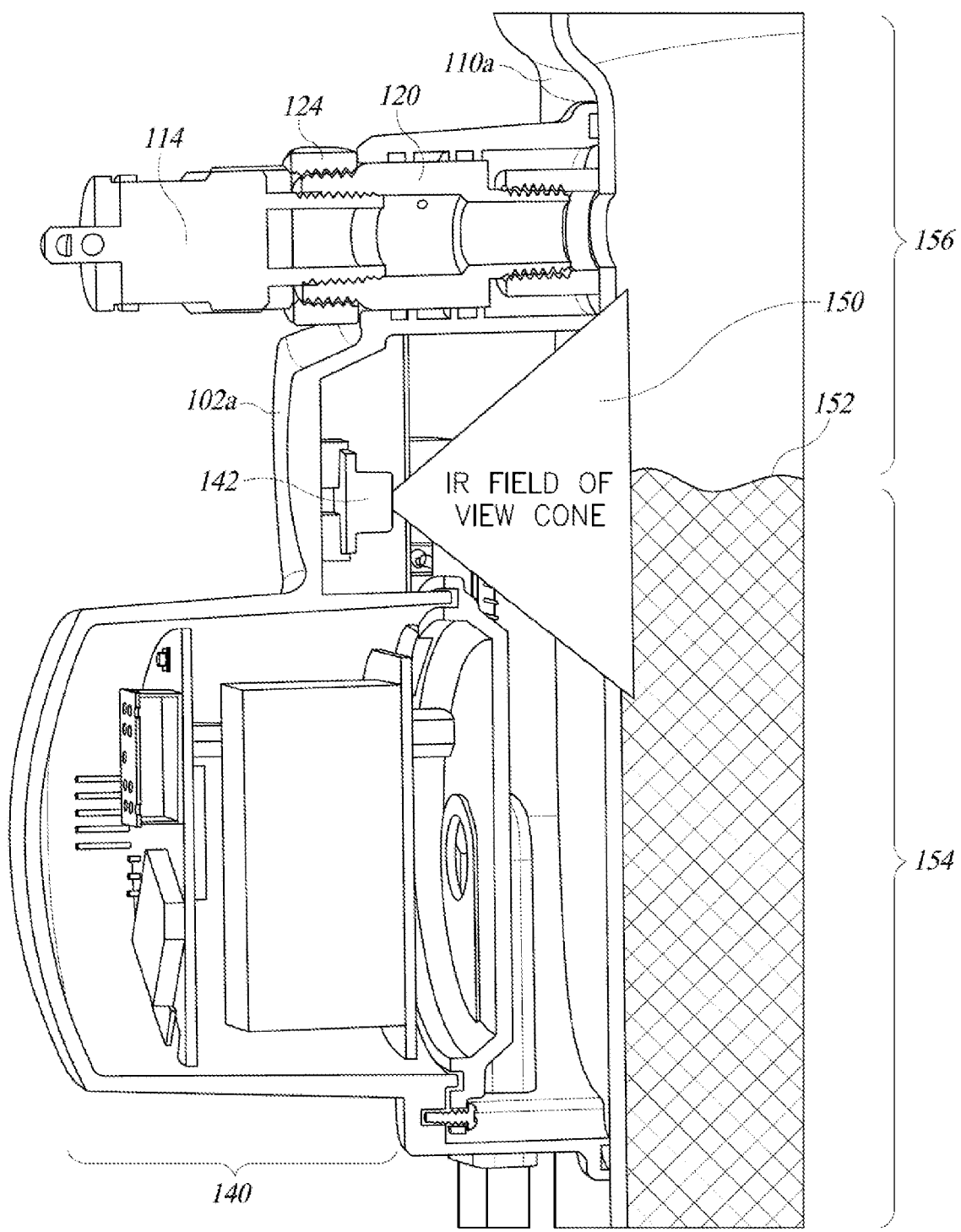
FIG. 5 is a cross-sectional view the first distribution transformer monitor embodiment of FIG. 2A.

FIG. 5 is a cross-sectional view of the housing 102a of the first distribution transformer monitor 110A embodiment of FIG. 2A. A pressure relief valve 114 is removably coupled to a pressure conveyance adapter 120. A sealable aperture 138 (FIG. 4) of the housing 102a is engaged with the external surface of the central portion of the pressure conveyance adapter 120. The locking collar 124 binds the housing 102a to the distribution transformer vessel 110 in a substantially vertical orientation.

The distribution transformer vessel 110 is filled in a known way to a determined level 152 with a known non-conductive medium 154 such as oil. The non-conductive medium 154 may be used to transfer or dissipate heat from a distribution transformer located in the distribution transformer vessel 110. As is known, operational use of the distribution transformer will produce heat, and the non-conductive medium 154 will transfer at least some of the heat to the wall 110a of the distribution transformer vessel 110 where the heat energy may be further transferred through the wall 110a of the distribution transformer vessel 110. An increase in temperature of the non-conductive medium 154 can cause an accumulation of pressure in the distribution transformer vessel 110. One reason for such an increase in temperature is a loss of some or all of the non-conductive medium 154 from the distribution transformer vessel 110 due to a leak. Another reason for such an increase is a high ambient temperature outside of the distribution transformer vessel 110 that prevents dissipation of heat. Still other reasons for an increase in temperature of the non-conductive medium 154 include a partial or complete failure of certain components of the distribution transformer, an operation of the distribution transformer in excess of certain operating parameters (e.g., over-voltage, excess load, and the like), and a chemical breakdown of the non-conductive medium 154. One of skill in the art will recognize that the temperature of the non-conductive medium 154 may increase for other reasons. If the temperature within the distribution transformer vessel 110 is too high, the distribution transformer or the distribution transformer vessel 110 may fail.

As evident in FIG. 5, a first sensor module is an infrared (IR) image sensor 142. The module may include electronic circuitry (i.e., hardware), operative software, or circuitry and operative software. The infrared image sensor 142 has an IR field of view cone 150 that is generally aimed at a portion of the wall of the distribution transformer vessel 110. The IR field of view cone 150 is desirably formed to "window" the determined level 152 of the non-conductive medium 154 as evident in FIG. 5. Generally, the determined level 152 is not visible from outside the distribution transformer vessel 110, but the determined level 152 may be estimated based on a position of a "fill port" on the sidewall of the distribution transformer vessel 110 and a position of a pressure relief valve on the sidewall of the distribution transformer vessel 110. For example, in many cases, it is reasonably believed that the distribution transformer vessel 110 will be filled with the non-conductive medium 154, via the fill port, to a level at or near the height on the distribution transformer vessel 110 of the fill port.

It has been recognized by the inventors that an IR image sensor 142 may be deployed to detect the determined level 152 of the non-conductive medium 154 based on a difference in temperature of the non-conductive medium 154 and the void or space 156 in the distribution transformer vessel 110 that is above the non-conductive medium 154. The different temperature values are conducted through the wall 110a of the distribution transformer vessel 110 and detectable by the IR image sensor 142. When the IR image sensor 142 is operated, a plurality of the energy levels within the IR field of view cone 150 are captured. The different energy levels may be analyzed to identify the determined level 152 of the non-conductive medium 154.

Any suitable algorithm may be used to analyze the IR image data generated by the IR image sensor 142. In some cases, for example, a spectra algorithm is applied. In other case, a black-and-white algorithm or iron algorithm is applied. In still other cases, a different algorithm may be applied. The algorithm may arrange or otherwise represent various points on the wall 110a of the distribution transformer vessel 110 as an array or "window." Energy levels captured at the points in the array or window are generated as digital information that corresponds to point-by-point temperature values on the wall 110a. In this way, a "map" of the various temperatures may be used to identify the liquid/non-liquid boundary (e.g., the interface) at the surface of the non-conductive medium 154.

In some cases, the determined level 152 is tracked over time. Temperature data readings may, for example, be captured and stored over seconds, minutes, hours, days, weeks, months, years, or any suitable length of time. In this way, the distribution temperature monitor 110A can track the level of non-conductive medium 154 (e.g., a dielectric, a non-conductive oil, an insulating oil, a mineral oil, a vegetable oil, a fluorocarbon-based oil, a silicone-based compound, a pentaerythritol tetra fatty acid natural or synthetic ester, a nanofluid, or some other insulating gas or liquid or gel or solid that is inert and substantially non-conductive) in the distribution temperature vessel 110. If the level crosses a determined threshold, then action can be taken to generate an alert, and the alert may be used to schedule further diagnosis, repair, or some other action for the distribution transformer.

In some cases, the determined level 152 of the non-conductive medium 154 in a plurality of distribution transformer vessels 110 is tracked. The information may be stored in a particular repository (e.g., a database). The accumulation of temperature data for a plurality of distribution transformer vessels 110 may, for example, be used to adjust one or more determined thresholds monitored by the distribution temperature monitor 110A. Such analysis can be used to more efficiently determine when alerts are triggered, and such analysis can additionally or alternatively be used to determine what action is taken when certain determined thresholds are crossed. In this way, a plurality of distribution transformers can be maintained with an increased level of service (e.g., "up-time") and an increased level of safety (e.g., avoidance of a distribution transformer vessel explosion or other catastrophic failure).

Figure 6:
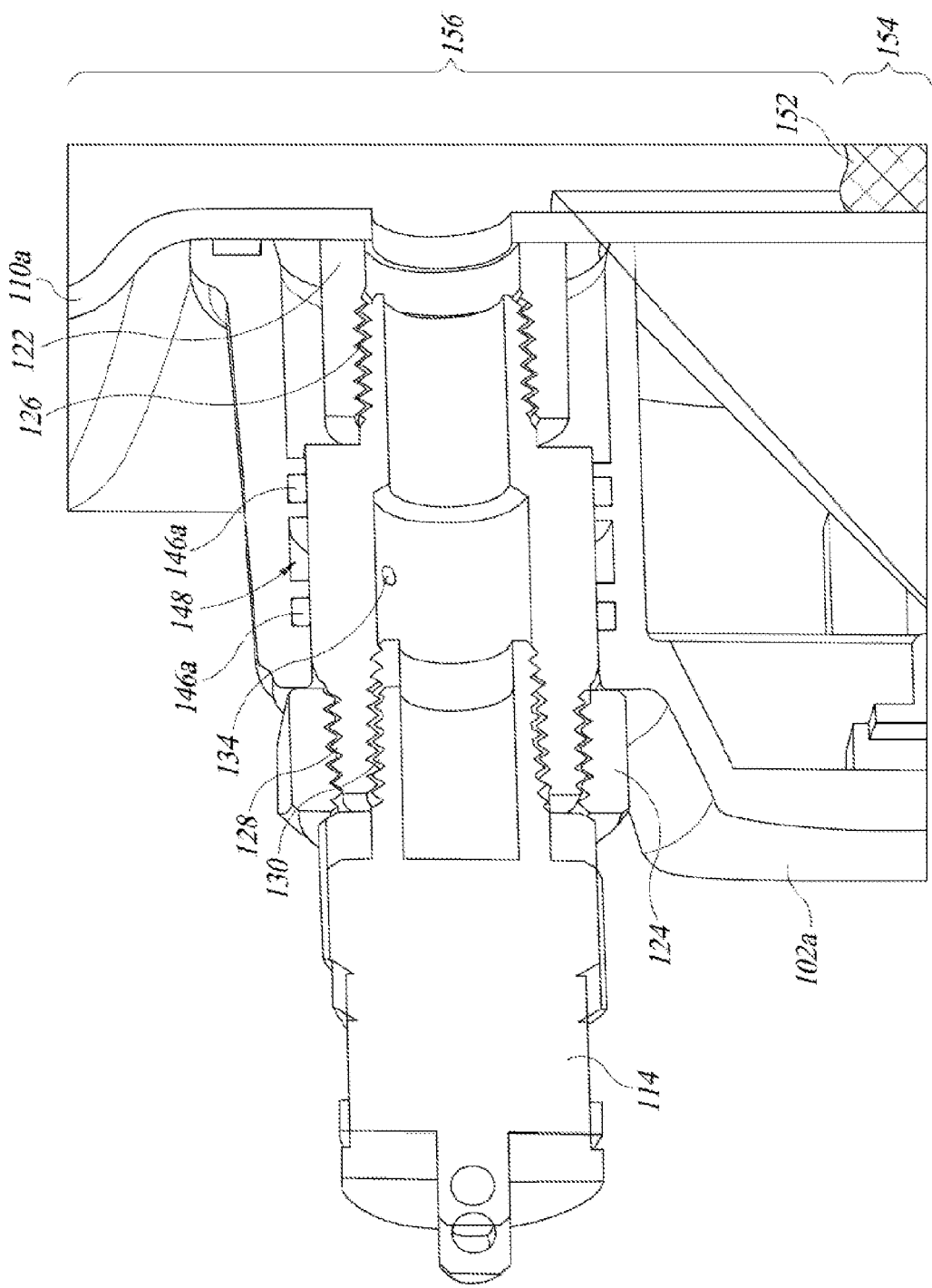
FIG. 6 is a cross-sectional view of a pressure conveyance adapter embodiment.

FIG. 6 is a cross-sectional view of a pressure conveyance adapter 120 embodiment. The pressure conveyance adapter 120 is rotatably coupled to a through-vessel aperture 122. In FIG. 6, a wall 110a of the distribution transformer vessel 110a is identified. The through-vessel aperture 122 is represented as a distinct structure adhered (e.g., welded) to the wall 110a, but such an aperture can be formed in any other suitable way. Generally speaking, the through-vessel aperture 122 will have a set of internal threads arranged in a standardized configuration to receive a cooperatively standardized pressure relief valve 114. The proximate end of the pressure conveyance adapter 120 includes a first standardized structure (e.g., set of external threads 126) that is along the lines of the standardized structure on the pressure relief valve 114. The distal end of the pressure conveyance adapter 120 includes a second standardized structure (e.g., set of internal threads 130) that is along the lines of the standardized structure in the through-vessel aperture 122.

Also in FIG. 6, a means of binding the housing 102a to the distribution transformer vessel 110 includes a first binding structure (e.g., external threads 128 on the distal end of the through-vessel aperture 122) and a second binding structure (e.g., locking collar 124).

As evident in FIG. 6, the housing 102a includes a pressure cavity 148, sealed by a particular sealing means 146a, which in this embodiment includes two pressure sensor gaskets. After the housing 102a is fit over the external surface of the central portion 136 of the pressure conveyance adapter 120, the pressure cavity 148 will equalize to the same pressure as inside the distribution transformer vessel 110 via the through-barrel aperture 134. If a pressure sensor (not shown in FIG. 6) is positioned in the pressure cavity 148, a pressure inside the distribution transformer vessel 110 can be determined.

Figure 7:
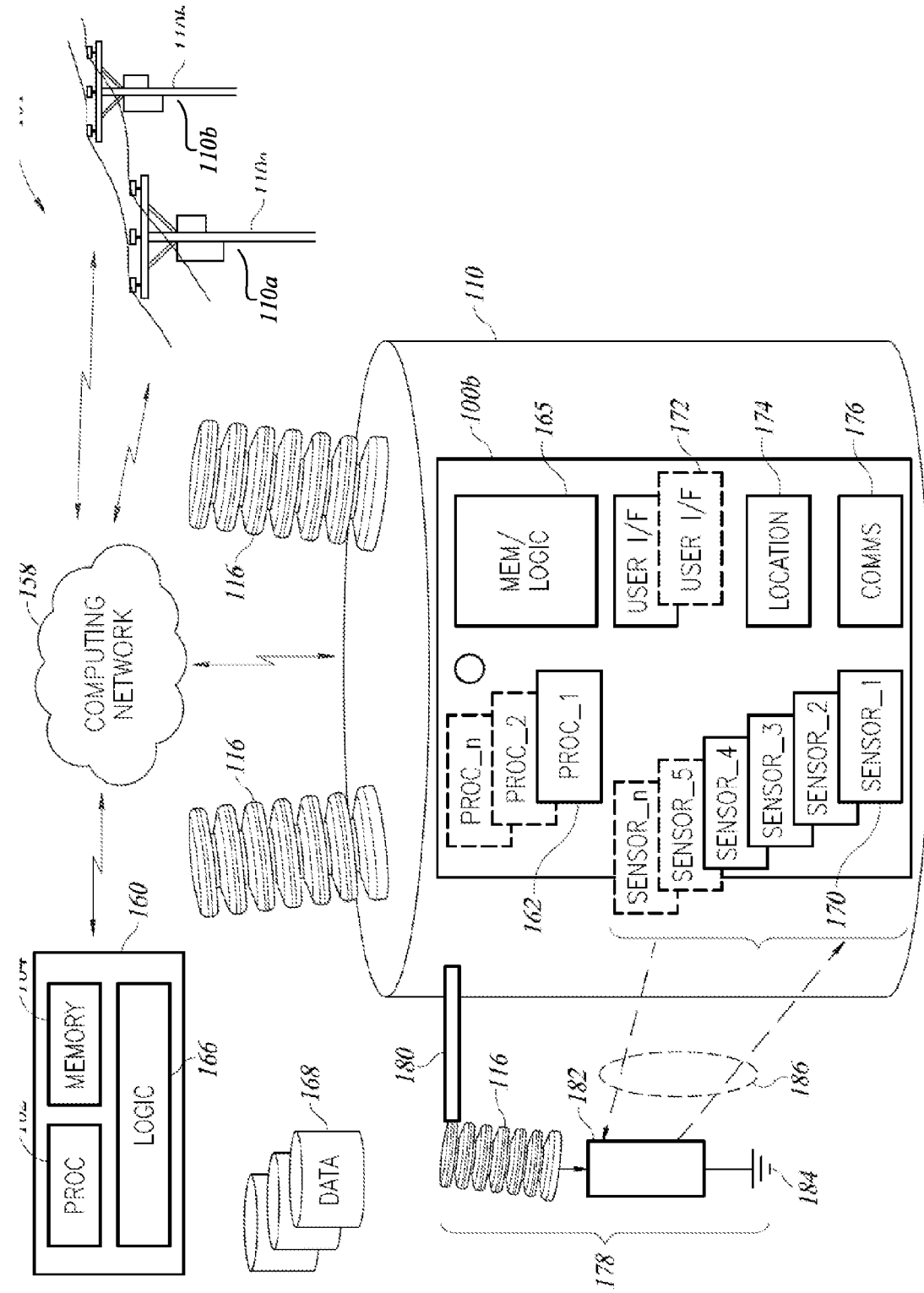
FIG. 7 is a schematic of a system distribution transformer monitors.

FIG. 7 is a schematic of a system 101 of distribution transformer monitors 100b. The distribution transformer monitor system 101 includes a plurality of distribution transformer monitors 100b, each of the plurality of monitors being arranged to monitor a respective distribution transformer.

The distribution transformers in the system 101 of FIG. 7 are represented as aerially mounted distribution transformers mounted to a plurality of power distribution poles, but other arrangements are contemplated. In some cases, power distribution poles have two or more distribution transformers, and in some other cases, power distribution poles do not have any distribution transformers. Distribution transformers mounted aerially, distribution transformers mounted at ground level (e.g., mounted in ground-level vaults, mounted on platforms or pads of concrete or other materials, mounted behind fences, mounted in buildings, and the like), and subterranean distribution transformers (e.g., mounted in below ground-level vaults) are all contemplated. Distribution transformers submersed in any suitable dielectric-filled vessel are contemplated, and distribution transformers not mounted in such vessels or mounted in vessels without a dielectric are also contemplated.

In FIG. 7, a first transformer vessel 110 is illustrated, and a distribution transformer monitor 100b is illustrated in detail. For convenience, in FIG. 7, second and third transformer vessels 110a, 110b are illustrated as mounted on respective power poles, which power poles are not expressly identified. In addition, each of the second and third transformer vessels 110a, 110b has a distribution transformer monitor 100b mounted thereon, but to avoid unnecessarily crowding FIG. 7, these additional distribution transformer monitors 100b are not identified. Power lines (i.e., power distribution electricity conduits), distribution transformer mounting means, and other such structures are illustrated in FIG. 7, but not expressly identified either.

The distribution transformers contemplated in the present disclosure may in some cases each weigh several hundred pounds. For this reason, a strong, reliable, safe mounting means (i.e., brackets, bolts, and the like) will be employed, as known by ones of skill in the art, to secure the distribution transformer to its respective power pole. The present inventors have recognized that due to such weight, the vibration, tilt, torque, substantially lateral pressure (e.g., wind pressure), and other physical forces on a power pole may contribute to a failure of the distribution transformer and put people and property at risk if the distribution transformer fails. Accordingly, at least some of the distribution transformer monitors of the present disclosure may be optionally arranged to monitor any one or more of such forces, and based on the monitoring, at least some of the distribution transformer monitors may optionally direct that one or more corresponding actions be taken.

The distribution transformer monitor system 101 of FIG. 7 may include any number of distribution transformer monitors arranged to monitor any number of corresponding distribution transformers (e.g., one, ten, one hundred, one thousand, ten thousand, or any other number), and the number of devices in the system 101 may change dynamically. That is, at any time, in real time, or at proscribed times, one or more new transformers may be added to a functioning distribution transformer monitoring system 101, and the distribution transformer monitoring system 101 may stop monitoring distribution transformers that were previously monitored. In some cases, a same distribution transformer may enter and exit the distribution transformer monitoring system 101 any number of times.

In the distribution transformer monitoring system 101 of FIG. 7, a computing network 158 bidirectionally, unidirectionally, or bidirectionally and unidirectionally facilitates communications between any number of computing devices. In some cases, any number of distribution transformer monitors 100b may communicate with any number of other distribution transformer monitors 100b. Communications with and between distribution transformer monitors 100b may be peer-to-peer, broadcast, or via a central computing device such as a computing server 160.

The computing server 160 includes one or more processors 162, memory 164, and functional logic 166. The memory 164 may be arranged to store processor-executable software, data, and any other information. The functional logic 166, as understood by one of skill in the art, may include circuitry, antennas and other communication components, physical structures, software, and still other logic to support the functions of the computing device that are implemented by the processor 162. Accordingly, the logic 166, in cooperation with the processor 162 and the memory 164, may receive user and machine input, direct use and machine output, and perform other expected computing functions as would be known by those of skill in the art.

The computing server 160 may optionally include or cooperate with a data repository 168 (e.g., a database). Data of any type received from any number of distribution transformer monitors 100b may be stored in the repository 168, and data of any type that is stored in the repository 168 may be communicated to any number of distribution transformer monitors 100b. One of skill in the art will recognize that in at least some embodiments, the distribution transformer monitor system 101 of FIG. 7 may be managed or otherwise arranged in a distributed computing environment, which may also be referred to as a cloud computing system, a server farm, or some other like term. By exploiting the distributed computing environment, data collected from a plurality of distribution transformer monitors 100b may be aggregated, parsed, mined, and otherwise combinatorially used to match patterns, form predictions, track environmental and other phenomena, and implement broad based services across a wide geographic area.

The distribution transformer monitor 100b includes one or more processors 162, memory and logic 165, sensor circuitry 170, user interface circuitry 172, location determination circuitry 174, and communications circuitry 176. Other circuits and operational features such as software are of course contemplated in the distribution transformer monitors described herein, but such circuits and features are not described so as to avoid unnecessarily obfuscating one or more of the circuits and features of focus in the corresponding figure.

The processor circuitry 162 of the distribution transformer monitor 100b may be along the lines of the processor 162 of computing server 160.

The memory and logic 165 includes memory arranged to store processor-executable software arranged for execution by the processor circuitry 162. The memory and logic 165 may also be arranged to store data that controls the distribution transformer monitor 100b (e.g., initialization data, control parameters, and the like), and data generated by other modules of the distribution transformer monitor 100b (e.g., sensor circuitry 170, user interface circuitry 172, and other modules). In some cases, the memory and logic 165 implements other features of the distribution transformer monitor 100b.

In at least one case, the memory and logic 165 implements an optional identity feature in the distribution transformer monitor 100b. The identity feature may include electronic, mechanical, or electromechanical switch circuitry, memory, a random number, a random number generator, a system-wide unique identifier, a world-wide unique identifier, or other such information. When combined with position information from the location determination circuitry 174, the distribution transformer monitor 100b may be able to more accurately report its identity and position to another computing device. The identity information can be used diagnostically and for other reasons. In at least some cases, identity information provided by an identity feature in the memory and logic 165 is used as a network identifier for the distribution transformer monitor 100b. The identity information may be arranged as a 32-bit number, a 64-bit number, another number having a structurally preferable bit-width, a combination of information that further conveys information about the capabilities of the distribution transformer monitor 100b (e.g., date of deployment, year of deployment, hardware version number, software version number, geographic location, or other such information).

In at least one case, the memory and logic 165 implements an optional security feature in the distribution transformer monitor 100b. The security feature may include one or more of an encryption engine, a decryption engine, a random number generator, a secure memory, a separate processing device, and the like.

The sensor circuitry 170 of FIG. 7 may include any suitable sensors. As evidenced via dashed and solid lines in FIG. 7, the sensor circuitry 170 may include sensors that are partially or completely contained in a housing (e.g., housings 102a, 102b in FIGS. 2-6 and FIG. 9, respectively). Additionally or alternatively, some or all of the sensor circuitry may be arranged outside of a housing such as a voltage sensor circuit, a current sensor circuit, a camera, a thermometer, and the like. Some or all of the sensor circuitry 170 may be contained in a single module such as electronics module 140 (FIG. 4). Some or all of the sensor circuitry may be arranged as discrete sensors such as an infrared image sensor 142 (FIG. 4), a pressure sensor 144 (FIG. 4), and any other sensor utilize by the distribution transformer monitors described in the present disclosure. A non-limiting, non-exhaustive list of exemplary sensors represented by sensor circuitry 170 include accelerometers (e.g., micro-electrical-mechanical sensors (MEMS)) of any number of axes (e.g., single-axis, two-axis, and three-axis accelerometers), IR sensors (e.g., infrared source and infrared detection circuits, object detection sensors, motion sensors, distance sensors, proximity sensors, and the like), IR image sensors (e.g., thermal imaging camera), pressure sensors (e.g., pressure transducers), vibration sensors, thermometers, current and voltage sensors (e.g., Rogowski circuits), humidity sensors, digital image sensors (e.g., cameras to capture still images, cameras to capture video, and the like), microphones, Hall effect sensors (e.g., magnetic sensors, position sensors, and other sensors based on a Hall effect), magnetometers, load cells (e.g., weight measuring sensors), ultrasonic sensors, light sensors, and the like.

The sensors of the present disclosure may, for example, capture, generate, or otherwise provide data associated with a plurality of properties of the world. A non-limiting, non-exhaustive list of such properties include sensors that provide data associated with sound, vibration, material (i.e., liquid, solid, gas) flow, material (i.e., liquid, solid, gas) presence, chemical properties, electrical properties, environmental properties, climate properties, radiation properties, optical properties, pressure, force, density, and temperature.

In addition to their native functions, data generated by the sensors contemplated in the present disclosure may be used to create geophones, hydrophones, seismometers, sound locators, airflow meters, position sensors, wind speed meters, hurricane detectors, tornado detectors, oxygen meters, carbon dioxide meters, carbon monoxide detectors, natural gas detectors, radiation detectors, torque sensors, flood detection sensors, snow level gauges, tide gauges, ozone monitors, pollen level sensors, gravimeters, and many other types of sensors and devices.

The user interface circuitry 172 may include one or more human interface device (HID) circuits, one or more machine interface circuits, or still other circuits. The user interface circuitry 172 may include, for example, any one or more of keyboards, keypads, computer mice, touch screens, button inputs, microphones, infrared sensors, bar code readers, transceivers, transducers, and the like. The user interface circuitry 172 may alternatively or additionally include, for example, any one or more of light sources (e.g., chips on board (COB) light emitting diodes (LEDs)), audio sources, video screens, vibrators, transceivers, transducers, and the like. As evidenced via dashed and solid lines in FIG. 7, the user interface circuitry 172 may include structures that are partially or completely contained in a housing (e.g., housings 102a, 102b in FIGS. 2-6 and FIG. 9, respectively). Additionally or alternatively, some or all of the user interface circuitry 172 may be arranged outside of a housing such as a button, a COB status light, a speaker or other audio output device, a display, and the like.

In some embodiments, the user interface circuitry 172 may include a light source that encodes an output message. The light from the light source, when outputting an encoded message, may or may not be visible to a human observer. In some cases, a human observer is alerted to a problem with a respective distribution transformer based on a visible output of the light source. In other cases, a machine is alerted to a problem based on a light source output that is not visible to a person. The encoded output may include any suitable information such as an identifier of the distribution transformer monitor 100b, a failure code, or some other device status information.

The location determination circuitry 174 may include global positioning system (GPS) circuitry, global navigation satellite system (GLONASS) circuitry, BeiDou navigation satellite system circuitry, or some other location determination circuitry. The location determination circuitry 174 may be a self-contained module, or the location determination circuitry 174 may include antennas, amplifiers, transceivers, or other components distributed elsewhere in the housing or external to the housing. The location determination circuitry 174 permits the distribution transformer monitor 100b embodiment to accurately report its position to another computing device such as the computing server 160. In some cases, the position may be used to positively identify the particular distribution transformer monitor 100b embodiment and distinguish data from the distribution transformer monitor 100b from other distribution transformer monitors. In some cases, the position may be used to expressly direct service personnel to the site where the distribution transformer monitor 100b is installed. The position information can be used diagnostically when a distribution transformer is determined to be failing, when a sensor crosses a particular threshold or determines some other sensor information, and for other reasons. The highly accurate time-base of the location determination circuitry 174 may also be used by the distribution transformer monitor 100b for weather data, almanac data, signal triangulation with other devices such as distribution transformer monitors, lighting controllers, motor vehicles, or some other device and for other purposes.

The communications circuitry 176 may include any suitable wired, wireless, or wired and wireless communication circuits. For example, in some cases, the communications circuitry 176 includes optical electronic circuitry to communicate information via a fiber-optic cable. In some cases, the communications circuitry 176 includes network circuitry (e.g., Ethernet transceivers) to communicate via electrically conductive wire. In still other cases, the communications circuitry 176 includes powerline communications circuitry to communicate via a power line. In these or yet other embodiments, the communications circuitry 176 may include a wireless transceiver module to provide wireless communication capability via WiFi, cellular communications, direct peer-to-peer RF communications, or via some other wireless communication protocol.

In some cases, for example, using functionality provided by the communications circuitry 176, the distribution transformer monitor 100b is arranged to operate as a WiFi access point. In this way, the distribution transformer monitor 100b permits one or more mobile devices to access the internet. Municipalities or other entities may make internet services available over a determined geographic area (e.g., a neighborhood, a city, an arena, a construction site, a campus, or the like) to remote mobile devices that are in proximity to any one of a plurality of distribution transformer monitors 100b. For example, if many power poles in a neighborhood or city are equipped with a distribution transformer monitor 100b, then WiFi service can be provided to a large number of users. What's more, based on seamless communication between a plurality of distribution transformer monitor 100b embodiments, the WiFi service can be configured as a mesh that permits users to perceive constant internet or other network connectivity even when the mobile device is in motion.

The distribution transformer vessel 110 of FIG. 7 includes a surge arrestor 178. Surge arrestor 178 may conform to a particular standard maintained by a standards setting organization such as the International Electrotechnical Commission (IEC), the American National Standards Institute (ANSI), the American Institute of Electrical and Electronics Engineers (IEEE), or some other organization. Surge arrestor 178 may conform to an exemplary, but not limiting, standard such as IEC 60099-4, ANSI/IEEEC62.11, or some other standard. In some cases, the standards setting body may assign a "type" or "class" rating to particular surge arrestors, which rating may be used to distinguish a range of energy requirements (i.e., operating parameters) of the device.

The surge arrestor 178 may be a Class 1 device (e.g., lightning arrestor), a Class 2 device (e.g., electrical fault arrestor), or a device of some other class arranged to prevent damage caused by an electromagnetic surge energy. Such surge arrestors may be arranged to handle large voltages (e.g., 10,000 volts, 30,000 volts, 50,000 volts, or some other voltage including a voltage over 1,000,000 volts), very large currents, (e.g., 1000 amps, 5000 amps, 50,000 amps, 100,000 amps, or some other current), or very large voltages and currents. Such surge arrestors may be designed to handle large surges for a very short time (e.g. a few seconds, a few hundred milliseconds, a few milliseconds, or some other time duration).

Typically, surge arrestors are coupled from a power carrying structure, such as a power line or a distribution transformer vessel, to earth (i.e., ground). In some cases, the coupling is direct, in other cases, the coupling may be indirect such as across an air gap. When an undesirable energy surge is present on the power carrying structure, the surge arrestor diverts the energy surge signal to ground, which action prevents, in at least most cases, the aberrant condition from damaging the equipment that the surge arrestor is arranged to protect.

Surge arrestors of the types described in the present disclosure may include resistor-capacitor circuits, Zener-type semiconductor circuits, or some other types of circuits. In at least some cases, such surge arrestors are formed using metal oxide varistor (MOV) structures (e.g., structures having one or more sequential of zinc-oxide (ZnO) structures), silicon carbide structures, or structures formed of some other elemental composition. In at least some of these cases, surge arrestor 178 is a MOV device surge arrestor arranged as a stack of ZnO discs encased in an insulator such as silicon. In other cases, surge arrestor 178 is formed in a different way.

Surge arrestor 178 (e.g., a MOV surge arrestor) works, in at least some embodiments, by presenting a very high impedance at normal operating levels and a rapidly decreasing impedance as voltage increases. In this way, normal and expected circuit signals are not affected at all by the surge arrestor, and a surging charge is diverted to ground. The surge condition may be caused by an atmospheric condition such as lightning, a resonance, a ferro-resonance, a system fault, a power line disconnection or short circuit, or by some other condition.

In some cases, a given surge arrestor can repeatedly divert energy for two or more over-tolerance condition events (e.g., multiple lightning strikes). In each of these cases, the equipment under protection remains un-damaged during and after the over-tolerance condition event. In other cases, after repeated over-tolerance condition events (e.g., multiple lightning strikes), the surge arrestor will destruct. In still other cases, after a single, particularly high-energy over-tolerance condition event (e.g., a "massive" lightening strike), the surge arrestor will destruct. In cases where the surge arrestor destructs, the equipment under protection may be spared (i.e., the surge arrestor has performed as designed and has not failed), but the surge arrestor may destruct and then any subsequent over-tolerance condition will be communicated through the equipment to be protected instead of around the equipment to be protected. If the equipment to be protected is exposed to the over-tolerance condition, the equipment may fail. Failure of the equipment may cause damage to living things (e.g., people, animals, plants) and non-living things (e.g., buildings, vehicles, power poles, distribution transformers, and things). In some cases, the damage may be extreme such as when a lightning strike on a power pole causes a distribution transformer vessel to explode and start a massive forest fire.

Many distribution power transformer vessels 110 are equipped with surge arrestors 178. The surge arrestor 178 may include any one or more of an insulator 116 portion, a surge arrestor MOV 182 portion, a surge arrestor support means 180, a ground path 184, and other structures that are not shown in FIG. 7 but are known to one of skill in the art. The structures may be arranged in any suitable way. For example, the surge arrestor support means 180 may arrange to support the insulator 116, the surge arrestor MOV 182 portion, and the ground path 184 in proximity to the distribution transformer vessel 110 (e.g., within two inches, within six inches, within 10 inches, within 20 inches, or within some other distance). The surge arrestor support means 180 may include any one or more of brackets, support arms, frames, welds, bolts, rods, posts, substructures, and any other suitable structures. The surge arrestor support means 180 in at least one case is permanently affixed to the distribution transformer vessel, and other components of the surge arrestor 178 (e.g., an insulator 116, a surge arrestor MOV device 182, a ground path, and other structures) may be permanently affixed, substantially permanently affixed, or removably affixed.

The inventors have recognized that a distribution monitor 100b may be configured to detect, and in some cases also count, each time an over-tolerance condition event (e.g., a lightning strike) occurs. In these or other cases, the inventors have recognized that a distribution monitor 100b may be configured to detect when a surge arrestor 178 or a portion of the surge arrestor 178 has been destructed or otherwise damaged. More specifically, the inventors have recognized that one or more sensors 170 may transmit, receive, generate, or otherwise deploy one or more surge arrestor continuity signals 186. The surge arrestor continuity signals 186, alone or in combination with other signals, may be used to count over-tolerance condition events, to determine if a surge arrestor 178 has destructed, or for some other purpose. The arrestor continuity signals 186 may be or otherwise include infrared (IR) signals, audio signals, camera images, or some other type of signals.

Figure 8:
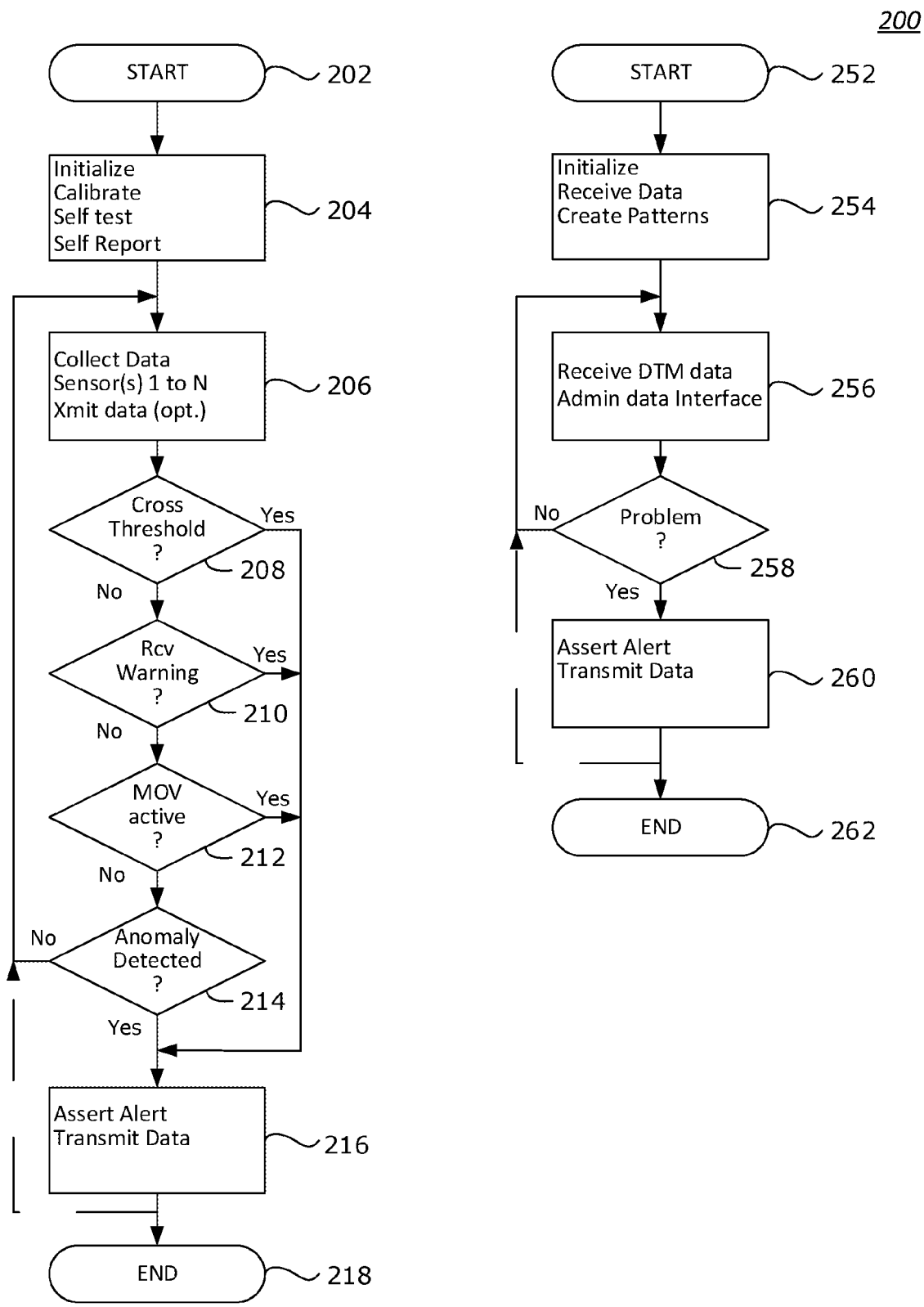
FIG. 8 is a data flow embodiment representing certain operations of a distribution transformer monitor system.

FIG. 8 is a data flow embodiment 200 representing certain operations of a distribution transformer monitor system such as the system 101 of computing server 160 and distribution transformer monitors 100b in FIG. 7. In the dataflow, processing begins in one or more distribution transformer monitors 100b at 202, and processing begins in a computing server 160 at 252. Processing in the computing server 160 is ongoing. Processing in any one or more of the distribution transformer monitors 100b may begin and end dynamically, and processing in any one or more of the distribution transformer monitors 100b may be ongoing, periodic, scheduled, or performed a finite number of one or more times. While processing at a single distribution transformer monitor 100b is described, one of skill in the art will recognize that one or more distribution transformer monitors 100b may perform the acts of FIG. 200, and while there may be synchronization (e.g., concurrent operations, simultaneous operations, cooperative operations, or the like) between multiple distribution transformer monitors 100b, any such synchronization is optional, and no synchronization is required unless otherwise expressly recited or indicated by the context of the relevant description.

At 204, the distribution transformer monitor 100b performs any one or more of initialization acts, calibration acts, self-testing acts, and self-reporting acts. The initialization, calibration, and self-testing acts may configure any number of sensors 170 to implement the teaching of the present disclosure. In some cases, any number of initialization, calibration, and self-testing acts are automatic, and in some cases, any number of initialization, calibration, and self-testing acts are manually interactive or machine interactive. The initialization, calibration, and self-testing acts may be implemented or supported via the user interface circuitry 172 location determination circuitry, and communications circuitry. The act of self-reporting may include enabling, arranging, or otherwise configuring the distribution transformer monitor 100b to communicate information to a computing server 160, a user device (e.g., a user computer, a mobile device, or the like), another one or more distribution transformer monitors 100b, or some other computing device. The information communicated may include sensor information, user command, control information, location information (e.g., street address information, coordinate information (e.g., longitude, latitude, altitude, or the like), or some other location information). Processing advances to 204.

At 206, the distribution transformer monitor 100b collects data from the logic devices (e.g., circuits, software modules, and the like) of the distribution transformer monitor 100b. Such collection acts may include any number of acts with any number of sensors. In some cases, the sensor processing is sequential, and in these or other cases, the sensor processing concurrent, polled, scheduled, dynamic, or based on any other embedded design paradigm known to those of skill in the art. The data collected, which may include any distribution transformer monitor data taught in the present disclosure, or any derivative data thereof, may be communicated in full or in part to another computing device. In addition, the collection of such data may be performed via any structures or acts expressly taught or otherwise evident from the teaching of the present disclosure. The data may be communicated to a computing server 160, another distribution transformer monitor 100b, a mobile device, a user device, or some other computing device. Processing at 206 advances to 208.

In processing at 208, 210, 212, and 214, the distribution transformer monitor 100b may collect further data, generate data, and perform any number of acts of processing to interrogate or otherwise analyze information and determine one or more subsequent courses of action. The processing at 208-214 may be performed in the order demonstrated in FIG. 8, or the processing may be performed in some other order. The processing at 208-214 may be performed in a multi-tasking operating system, an interrupt-driven system, a polling system, a task-loop, or in some other computing architecture.

At 208, as taught in the present disclosure, data from one or more sensors, or data derived therefrom, is interrogated. If it is determined that the data has crossed a threshold, processing is advanced to 216. Alternatively, processing advances to 210. The data interrogated may include temperature data (e.g., temperature data based on an oil level in a distribution transformer vessel, ambient temperature information), vibration data, pole-tilt data, pressure data (e.g., pressure data based on a pressure in a distribution transformer vessel), distribution transformer energy data (e.g., charge, voltage, current, or some other energy data), time data, or any other data taught herein.

At 210, as taught in the present disclosure, a determination is made whether or not a warning is received at the distribution transformer monitor 100b. If a warning is received, processing is advanced to 216. Alternatively, processing advances to 212. The warning received may include impending weather information or information associated with one or more atmospheric conditions, impending electrical information associated with electrical infrastructure coupled to a proximal distribution transformer, or some other information. The warning information may be received from another distribution transformer monitor 100b, a computing server 160, a mobile device, or some other computing device.

At 212, as taught in the present disclosure, a determination is made whether or not a surge arrestor 178 has been active. If a surge arrestor has been active, processing is advanced to 216. Alternatively, processing advances to 214. The surge arrestor 178 may be active based on an atmospheric condition (e.g., a lightning strike), a systemic condition in the power grid (e.g., a power surge, a switching condition, or some other aberrant electrical activity), or some other condition.

At 214, as taught in the present disclosure, a determination is made as to whether any anomalies have been detected. If any anomalies have been detected, processing advances to 216. Alternatively, processing returns to 206.

At 216, any number of crossed thresholds, received warnings, surge arrestor events, and anomalies are processed. In some cases, the processing includes asserting an alert signal (e.g., a human interface device (HID) audible or visual indicator, a wireless leak communicated alert message, an alert message communicated via a wired means). In these and in other cases, the processing may also include transmitting data to a computing device. The transmitted data may include any sensor data or data derived therefrom, location data, device identification data, and the like. The data may be communicated to another distribution transformer monitor 100*b*, a computing server 160, a mobile device, a user device, or some other computing device.

After processing at 216, processing may optionally continue and return to 206 or and at 218.

Still referring to FIG. 8, processing and the computing server 160 begins at 252 and advances to 254.

At 254, the computing server performs any number of initialization acts. The computing server 160 may receive data, create patterns, initialize communication sessions with any number of distribution transformer monitors 100*b*, initialize information for delivery via a web server, and perform any other actions.

In some cases, the computing server 160 is arranged with one or more artificial intelligence processing engines (e.g., pattern matching engine, machine vision engine, neural network, or the like). The artificial intelligence processing engines may be arranged to detect patterns such as conditions that lead to destruction of a surge arrestor (e.g., patterns of brightness, number of lightning strikes, audio patterns that indicate a lightning strike, and the like). The artificial intelligence processing may additionally all or alternatively be arranged to detect other patterns such as patterns that indicate a condition leading to failure of the distribution transformer or the distribution transformer vessel. Some patterns that may be detected include voltage or current patterns generated by data from a Rogowski circuit, temperature patterns that indicate a catastrophic distribution transformer vessel failure such as an explosion, pressure patterns that indicate a catastrophic distribution transformer vessel failure such as an explosion, and the like.

In some cases, training data may be used to initialize an artificial intelligence engine. The training data may be any useful training data set. For example, the inventors have recognized that the distribution transformer monitor system 101 as embodied, for example, in FIG. 7, may collect data from a large number (dozens, hundreds, thousands) of distribution transformer monitors 100*b*. The collected data may be from distribution transformer monitors in the same geographic area or from widely disparate geographic areas. Some or all of the data collected from any number of distribution transformer monitors 100*b* may be used to improve the quality of the artificial intelligence engine. Based on the collected data, patterns for any given distribution transformer or distribution transformer vessel may be formed, and data received from a particular distribution transformer monitor may be analyzed against the selected pattern. A determination can then be made by the computing server 160 whether or not additional action should be taken. After data is received and any number of optional patterns are created, processing advances to 256.

At 256, the computing server 160 receives data from any number of distribution transformer monitors 100*b*. The data may be received on a schedule, periodically, based on a polling scheme, asynchronously, or in any other way. The computing server 160 may store the data in a repository 168 as the data is received. Additionally, or alternatively, the computing server 160 may process the received data and determine whether or not the processed data will be stored in the repository 168.

In at least some optional cases, in processing at 256, the computing server 160 may administer a data interface. A data interface may be or otherwise include, for example, any number of Internet-based webpages. In such a case, a user (e.g., a representative of a municipality, power utility, distribution transformer maintenance, public safety entity) may observe the status of any one or more distribution transformers in real time. In at least some optional cases, the user may send control information to any one or more distribution transformers in real time. In at least some optional cases, the user may interrogate any one or more distribution transformers for additional information in real time. The processing at 256 further includes optional data aggregation, data mining, data visualization, and other such suitable actions. Processing advances to 258.

At 258, the computing server 160 will determine whether a problem has been detected. One example of a problem is that a pattern indicating that a particular distribution transformer is in need of maintenance is detected. Another example of a problem is that particular surge arrestor 178 has received a determined number of over-tolerance condition events and the determined number exceeds a determined threshold. Yet additional examples of problems include detecting that a level of oil in a particular distribution transformer vessel 110 has fallen below a determined threshold (e.g., based on temperature information, based on pressure information, or based on some other information), detecting that distribution transformer electrical parameters are out of a determined tolerance (e.g., based on data from a Rogowski circuit), detecting that a power pole and its particular distribution transformer vessel 110 have tilted past particular threshold, and detecting a level of water at the base of a power pole (e.g., a flooding condition, a storm surge condition, or the like). The detection of other such conditions as described in the teaching of the present disclosure are also contemplated. If no problems are detected at 258, processing returns to 256. If any problems are detected at 258, processing advances to 260.

At 260, action is taken based on one or more discovered problems. The action may include communicating any number and format of alert (e.g., directing an output of an audible or visible signal, directing the communication of one or more messages to one or more users via one or more computing devices, directing the communication of one or more messages via the Internet, directing the communication of one or more messages via a wired or wireless telephone call, or directing some other action). Processing in at least some cases will optionally continue by advancement back to 256. Optionally, in some other cases, processing may complete.

Figure 9A:
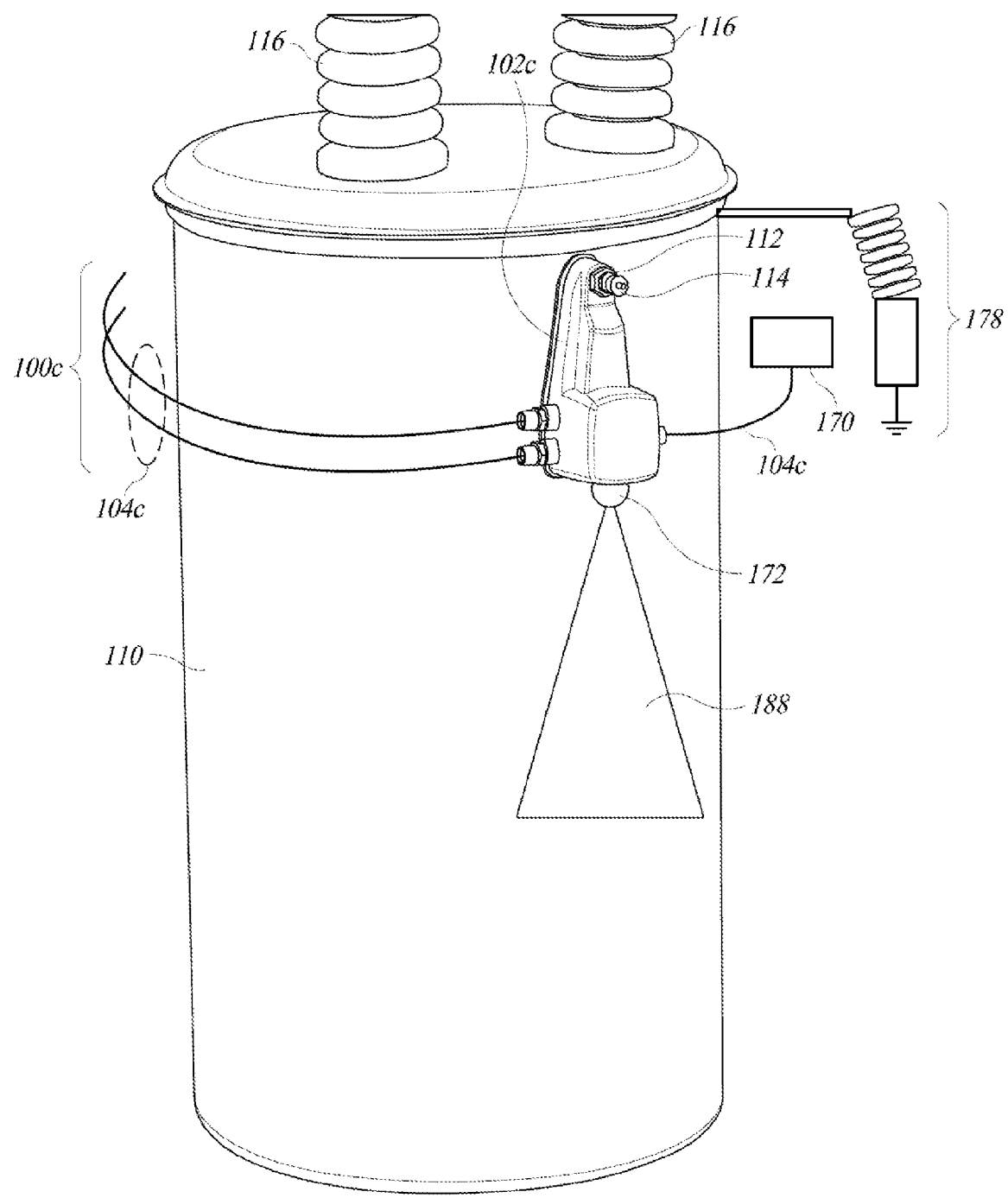
FIG. 9A is a perspective view of a third distribution transformer monitor embodiment mounted on a distribution transformer vessel.
Figure 9B:
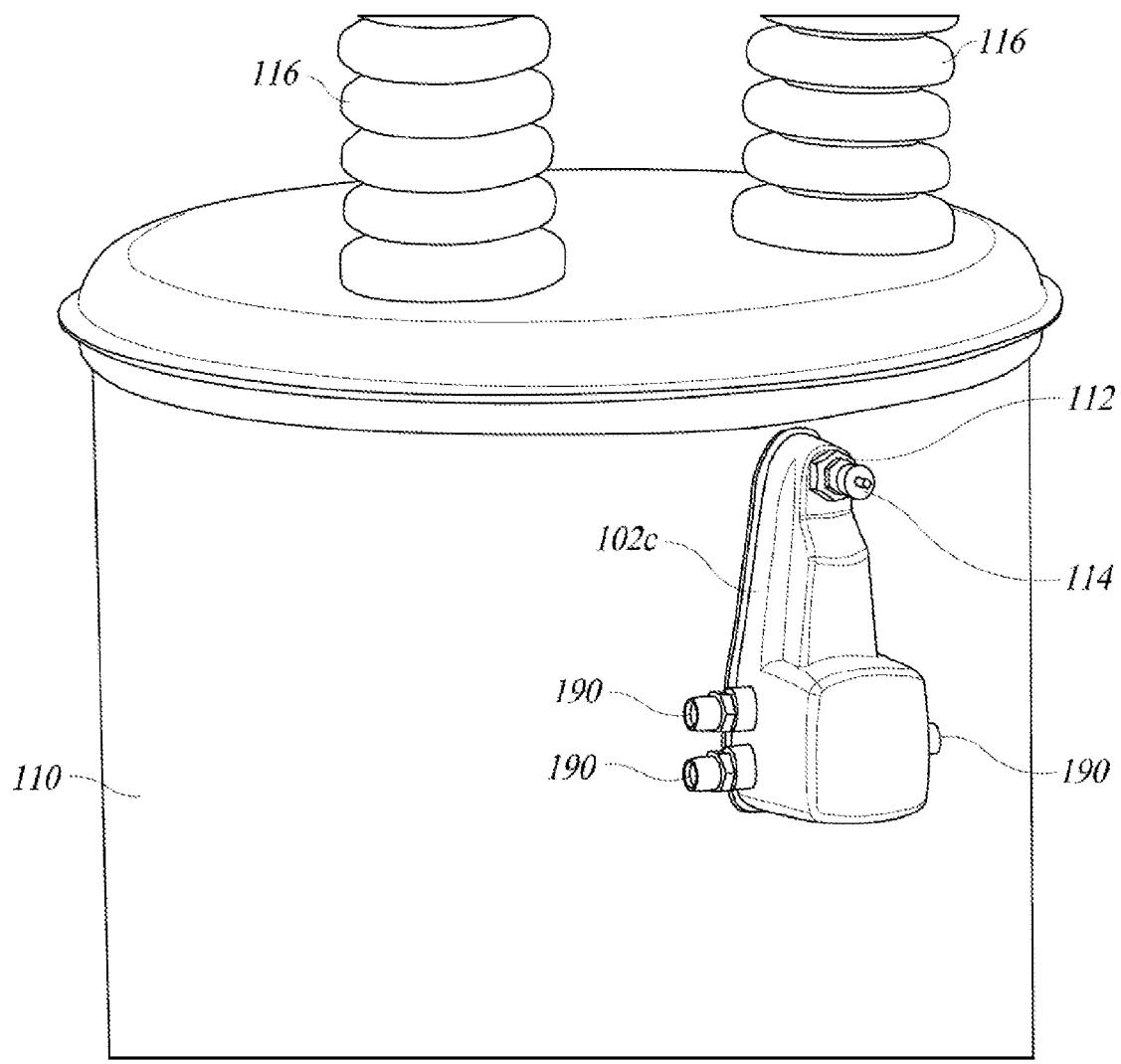
FIG. 9B is a perspective view of the third distribution transformer monitor embodiment of FIG. 9A in more detail.
Figure 9D:
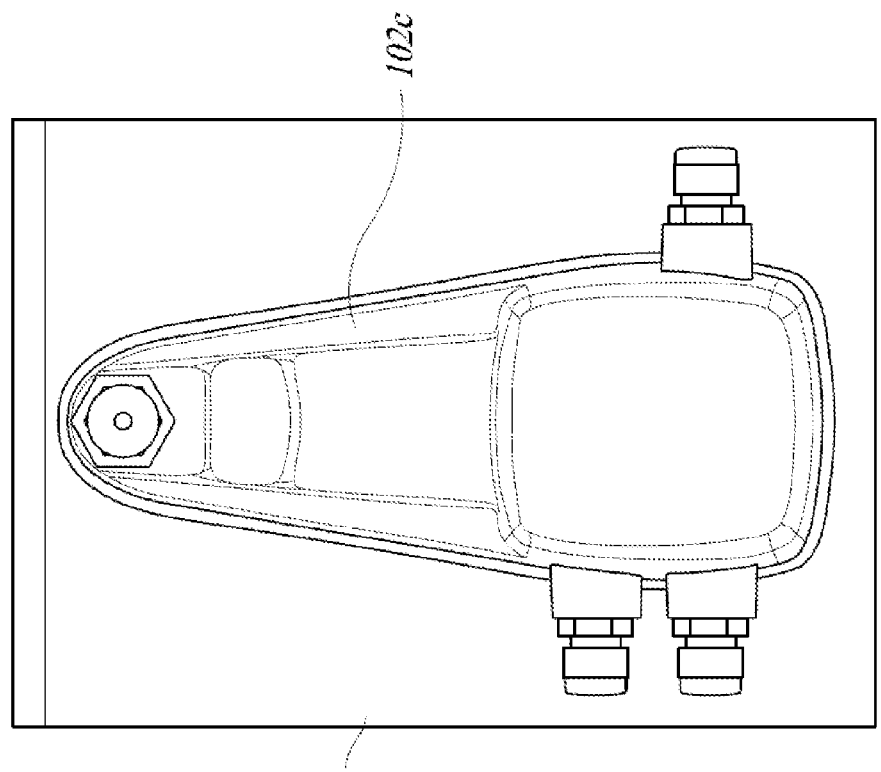
FIG. 9D is a front view of the housing of the third embodiment of the distribution transformer monitor of FIG. 9A.
Figure 9C:
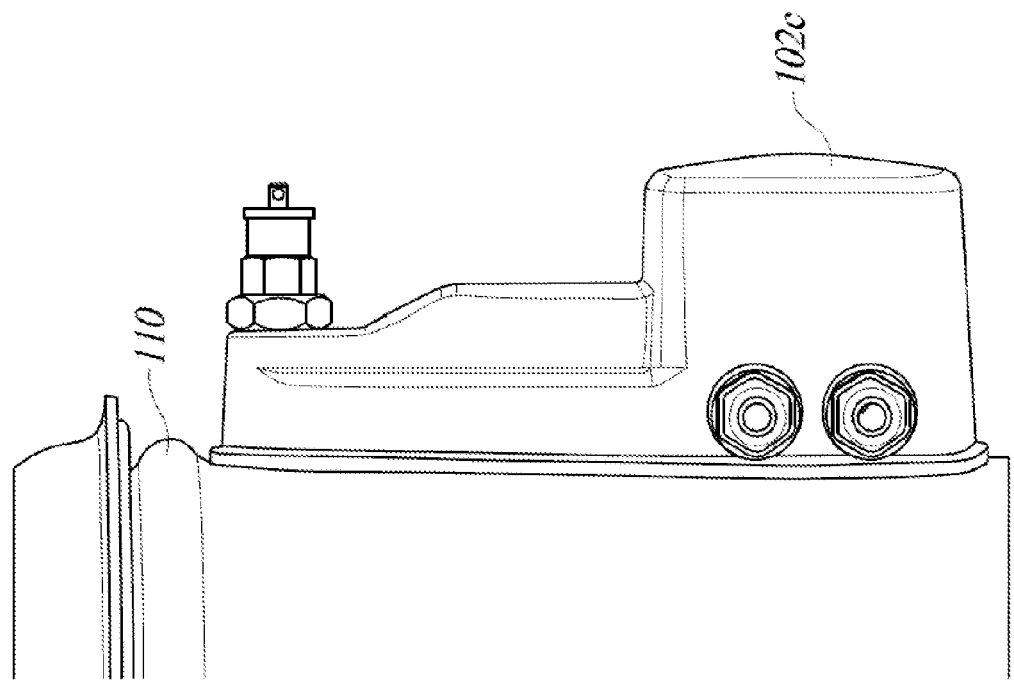
FIG. 9C is a side view of the housing of the third embodiment of the distribution transformer monitor of FIG. 9A.
Figure 9E:
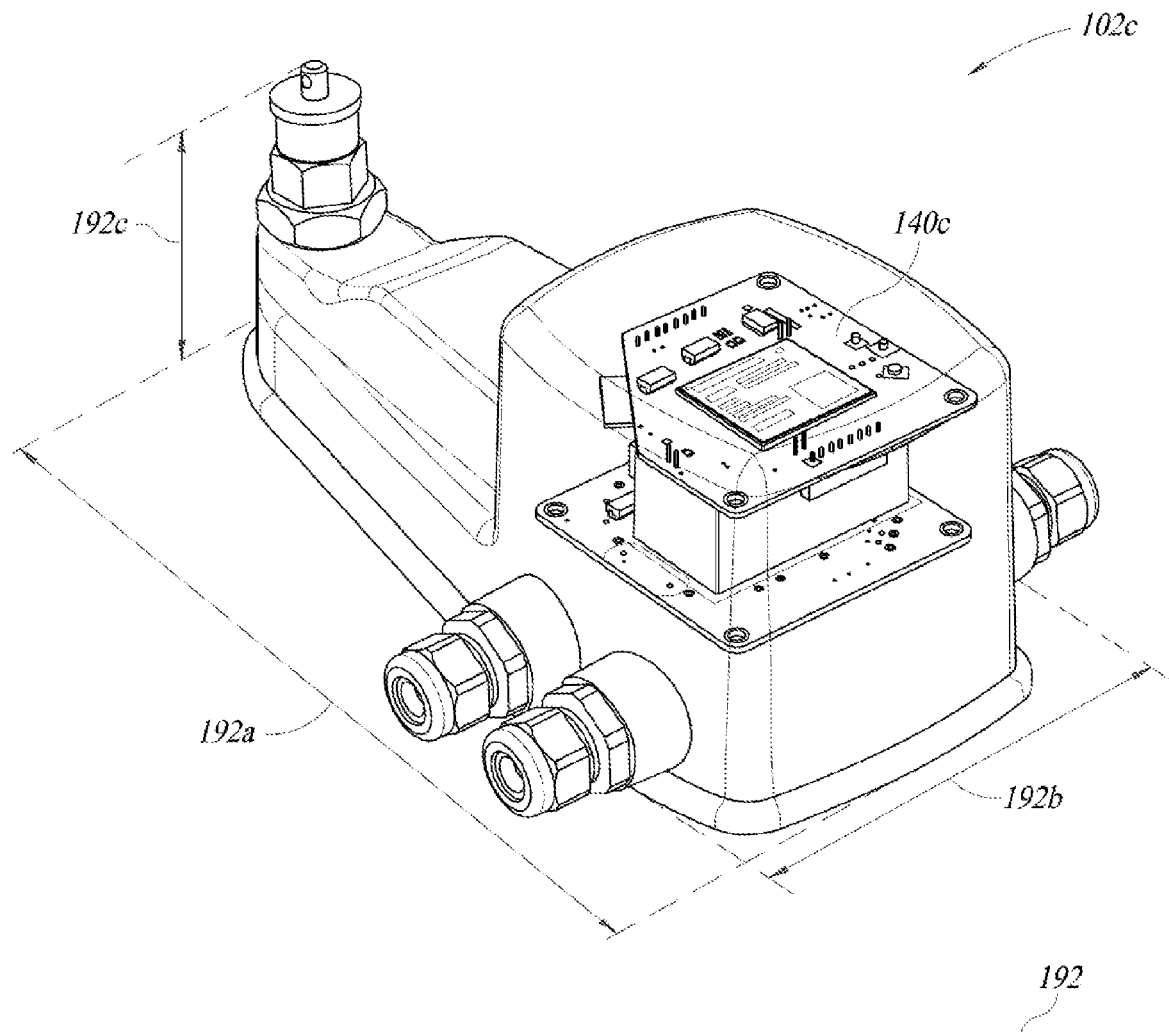
FIG. 9E is a sectional view of the housing of the third embodiment of the distribution transformer monitor of FIG. 9A.

FIG. 9A is a perspective view of a third distribution transformer monitor 100*c* embodiment mounted on a distribution transformer vessel 110. FIG. 9B is a perspective view of the third distribution transformer monitor 100*c* embodiment of FIG. 9A in more detail. FIG. 9C is a side view of the housing 102*c* of the third distribution transformer monitor 100*c* embodiment of FIG. 9A. FIG. 9D is a front view of the housing 102*c* of the third distribution transformer monitor 100*c* embodiment of FIG. 9A. And FIG. 9E is a sectional view of the housing 102*c* of the third distribution transformer monitor 100*c* embodiment of FIG. 9A. Collectively, any of FIGS. 9A-9E may be referred to herein as FIG. 9. Structures earlier identified are not repeated for brevity.

The distribution transformer monitor 100*c* is along the lines of transformer monitors 100*a*, 100*b*. That is, in the present disclosure, each of three described distribution transformer monitors 100*a*, 100*b*, 100*c* share features in common. Accordingly, the discussion of any one distribution transformer monitor is not limiting, and unless the context dictates otherwise, any one distribution transformer monitor 100*a*, 100*b*, 100*c* may be substituted for any other distribution transformer monitor 100*a*, 100*b*, 100*c* in the teaching set forth in the present disclosure.

In FIG. 9A, a distribution transformer vessel 110 is represented with 2 distribution transformer insulators 116 and a distribution transformer monitor 100c mounted on the distribution transformer vessel 110. A housing 102c may be bound to the distribution transformer vessel 110 via any suitable means. In some optional cases, the housing 102c includes one or more magnets, and adhesive, one or more brackets, or some other means to bind the housing 102c to the distribution transformer vessel 110. Alternatively, or in addition, the housing 102c may be bound to the distribution transformer vessel 110 via a locking collar 112 attached to a pressure conveyance adapter that is further attached to the distribution transformer vessel 110. A pressure relief valve 114 is coupled to the pressure conveyance adapter.

The distribution transformer monitor 100c includes a signal conduction means 104c, which in this embodiment is arranged with a plurality of means. A first signal conduction means 104c is coupled to an output connector of the distribution transformer, and this first signal conduction means provides power to the distribution transformer monitor 100c, which has been tapped off of the distribution transformer output. A second signal conduction means 104c is coupled to an electrical parameter monitoring circuit such as a Rogowski coil. The second signal conduction means 104c may be arranged to conduct charge, voltage, current, or other electrical parameter signals back to the processing circuitry of the distribution transformer monitor 100c. A third signal conduction means 104c may be in internal or external to the housing 102c. In the embodiment of FIG. 9A, the third signal conduction means 104c is external to the housing 102c. The third signal conduction means is arranged to monitor status of the surge arrestor 178 based on information from at least one sensor 170. Sensors 170 that are arranged to monitor the surge arrestor 178 may be infrared (IR) circuits, digital image circuits, audio circuits, pressure circuits, vibration circuits, or circuits based on some other technology.

The distribution transformer monitor 100c is represented having at least one portion of a user interface 172 exposed external to the housing 102c. In this embodiment, the externally exposed portion of the user interface 172 is arranged to provide or otherwise direct the communication of an alert signal 188. The alert signal 188 may be a visible alert signal, an audible alert signal, a radiofrequency (RF) alert signal, a wired alert signal, or some other alert signal. In at least some cases, the alert signal, when it is asserted, provides an indication to a user (e.g., maintenance worker, property owner, people in proximity to the distribution transformer) that a problem has been detected by the distribution transformer monitor 100c.

FIG. 9B is a perspective view of the second embodiment of the distribution transformer monitor 100c of FIG. 9A in more detail. In FIG. 9B, the housing 102c is shown without any signal conduction means. Instead, a plurality of twist lock connectors 190 identified. The twist lock connectors 190 may provide strain relief, a seal to moisture and other contaminants, and an accessible means of cable access to one or more interior chambers of the housing 102c. In at least some cases, the twist lock connectors 190 are water tight, and in these or in other cases, the twist lock connectors 190 provide strain relief to cables that pass through the connectors. The twist lock connectors 190 in at least some cases expose a gland connector for 3-15 mm diameter cable resistant to foreign material ingress according to Ingress Protection standard IP67.

FIG. 9C is a side view of the housing 102c of the second embodiment of the distribution transformer monitor 100c of FIG. 9A. FIG. 9D is a front view of the housing 102c of the second embodiment of the distribution transformer monitor 100c of FIG. 9. And FIG. 9E is a sectional view of the housing 102c of the second embodiment of the distribution transformer monitor 100c of FIG. 9A. As evident in FIG. 9E, the housing 102c is arranged to contain an electronics module 140c, which is along the lines of the electronics module 140 (FIG. 4). The housing 102c may be arranged with particular physical properties 192. For example the housing 102c may have a determined length 192a, a determined with 192b, and a determined height 192c. The housing may further have any number of additional physical properties 192 such as a particular weight, temperature rating, material of construction, seal rating, electrostatic charge dissipation rating, and other such physical properties.

Having now set forth certain embodiments, further clarification of certain terms used herein may be helpful to providing a more complete understanding of that which is considered inventive in the present disclosure.

Mobile network operators (MNOs) provide wireless cellular-based services in accordance with one or more cellular-based technologies, and in accordance with one or more cellular telecom protocols. As used in the present disclosure, "cellular-based" should be interpreted in a broad sense to include any of the variety of technologies that implement wireless or mobile communications. Exemplary cellular-based systems and protocols include, but are not limited to, time division multiple access ("TDMA") systems, code division multiple access ("CDMA") systems, and Global System for Mobile communications ("GSM") systems. Some others of these technologies are conventionally referred to as UMTS, WCDMA, 4G, 5G, and LTE. Still other cellular-based technologies are also known now or will be known in the future. The underlying cellular-based technologies and corresponding protocols are mentioned here for a clearer understanding of the present disclosure, but the inventive aspects discussed herein are not limited to any particular cellular-based technology unless expressly stated as such.

A mobile device, or mobile computing device, as the terms are used interchangeably herein, is an electronic device provisioned by at least one mobile network operator (MNO) to communicate data through the MNO's cellular-based network. The data may be voice data, short message service (SMS) data, electronic mail, world-wide web or other information conventionally referred to as "internet traffic," or any other type of electromagnetically communicable information. The data may be digital data or analog data. The data may be packetized or non-packetized. The data may be formed or passed at a particular priority level, or the data may have no assigned priority level at all. A non-comprehensive, non-limiting list of mobile devices is provided to aid in understanding the bounds of the term, "mobile device," as used herein. Mobile devices (i.e., mobile computing devices) include cell phones, smart phones, flip phone, tablets, phablets, handheld computers, laptop computers, body-worn computers, and the like. Certain other electronic equipment in any form factor may also be referred to as a mobile device when this equipment is provisioned for cellular-based communication on an MNO's cellular-based network. Examples of this other electronic equipment include in-vehicle devices, medical devices, industrial equipment, retail sales equipment, wholesale sales equipment, utility monitoring equipment, and other such equipment used by private, public, government, and other entities.

Mobile devices further have a collection of input/output ports for passing data over short distances to and from the mobile device. For example, serial ports, USB ports, WiFi ports, Bluetooth ports, IEEE 1394 FireWire, and the like can communicatively couple the mobile device to other computing apparatuses.

Mobile devices have a battery or other power source, and they may or may not have a display. In many mobile devices, a signal strength indicator is prominently positioned on the display to provide network communication connectivity information to the mobile device user.

A cellular transceiver is used to couple the mobile device to other communication devices through the cellular-based communication network. In some cases, software and data in a file system are communicated between the mobile device and a computing server via the cellular transceiver. That is, bidirectional communication between a mobile device and a computing server is facilitated by the cellular transceiver. For example, a computing server may download a new or updated version of software to the mobile device over the cellular-based communication network. As another example, the mobile device may communicate any other data to the computing server over the cellular-based communication network.

Each mobile device client has electronic memory accessible by at least one processing unit within the device. The memory is programmed with software that directs the one or more processing units. Some of the software modules in the memory control the operation of the mobile device with respect to generation, collection, and distribution or other use of data. In some cases, software directs the collection of individual datums, and in other cases, software directs the collection of sets of data.

Software may include a fully executable software program, a simple configuration data file, a link to additional directions, or any combination of known software types. When the computing server updates the software of a mobile device, the update may be small or large. For example, in some cases, a computing server downloads a small configuration data file to a mobile device as part of software, and in other cases, the computing server completely replaces all of the present software on the mobile device with a fresh version. In some cases, software, data, or software and data is encrypted, encoded, and/or otherwise compressed for reasons that include security, privacy, data transfer speed, data cost, or the like.

Database structures, if any are present in the distribution transformer monitoring systems described herein, may be formed in a single database or multiple databases. In some cases, hardware or software storage repositories are shared amongst various functions of the particular system or systems to which they are associated. A database may be formed as part of a local system or local area network. Alternatively, or in addition, a database may be formed remotely, such as within a distributed "cloud" computing system, which would be accessible via a wide area network or some other network.

Processing devices, which may also be referred to in the present disclosure as "processing circuits," "processors," or another like term, include central processing units (CPU's), microprocessors, microcontrollers (MCU), digital signal processors (DSP), application specific integrated circuits (ASIC), state machines, and the like. One or more processors working cooperatively may be referred to in the singular (e.g., as a processor) without departing from the inventive concepts disclosed herein. Accordingly, a processor as described herein includes any device, system, or part thereof that controls at least one operation, and such a device may be implemented in hardware, firmware, or software, or some combination of at least two of the same. The functionality associated with any particular processor may be centralized or distributed, whether locally or remotely. A processor may interchangeably refer to any type of electronic control circuitry configured to execute programmed software instructions. The programmed instructions may be high-level software instructions, compiled software instructions, assembly-language software instructions, object code, binary code, micro-code, or the like. The programmed instructions may reside in internal or external memory or may be hard-coded as a state machine or set of control signals. According to methods and devices referenced herein, one or more embodiments describe software executable by the processor or processing circuit, which when executed, carries out one or more of the method acts taught in the present disclosure.

The present application discusses several embodiments that include or otherwise cooperate with one or more computing devices. It is recognized that these computing devices are arranged to perform one or more algorithms to implement various concepts taught herein. Each of said algorithms is understood to be a finite sequence of steps for solving a logical or mathematical problem or performing a task. Any or all of the algorithms taught in the present disclosure may be demonstrated by formulas, flow charts, data flow diagrams, narratives in the specification, and other such means as evident in the present disclosure. Along these lines, the structures to carry out the algorithms disclosed herein include at least one processing device executing at least one software instruction retrieved from at least one memory device. The structures may, as the case may be, further include suitable input circuits known to one of skill in the art (e.g., keyboards, buttons, memory devices, communication circuits, touch screen inputs, and any other integrated and peripheral circuit inputs (e.g., accelerometers, thermometers, light detection circuits and other such sensors)), suitable output circuits known to one of skill in the art (e.g., displays, light sources, audio devices, tactile devices, control signals, switches, relays, and the like), and any additional circuits or other structures taught in the present disclosure. To this end, every invocation of means or step plus function elements in any of the claims, if so desired, will be expressly recited.

In some cases, the processor or processors described in the present disclosure, and additionally more or fewer circuits of the exemplary computing devices described in the present disclosure, may be provided in an integrated circuit. In some embodiments, all of the elements shown in the processors of the present figures (e.g., processors 162 of FIG. 7) may be provided in an integrated circuit. In alternative embodiments, one or more of the arrangements depicted in the present figures may be provided by two or more integrated circuits. Some embodiments may be implemented by one or more dies. The one or more dies may be packaged in the same or different packages. Some of the depicted components may be provided outside of an integrated circuit or die.

The processors shown in the present figures and described herein may be fixed at design time in terms of one or more of topology, maximum available bandwidth, maximum available operations per unit time, maximum parallel execution units, and other such parameters. Some embodiments of the processors may provide re-programmable functionality (e.g., reconfiguration of embedded processor modules and features to implement an artificial intelligence engine as taught herein) at run-time. Some or all of the re-programmable functionality may be configured during one or more initialization stages. Some or all of the re-programmable functionality may be configured, re-configured, or otherwise configured in real time with no latency, maskable latency, or an acceptable level of latency.

As known by one skilled in the art, a computing device, including a mobile computing device, has one or more memories, and each memory may comprise any combination of volatile and non-volatile computer-readable media for reading and writing. Volatile computer-readable media includes, for example, random access memory (RAM). Non-volatile computer-readable media includes, for example, any one or more of read only memory (ROM), magnetic media such as a hard-disk, an optical disk, a flash memory device, a CD-ROM, and the like. In some cases, a particular memory is separated virtually or physically into separate areas, such as a first memory, a second memory, a third memory, etc. In these cases, it is understood that the different divisions of memory may be in different devices or embodied in a single memory. Some or all of the stored contents of a memory may include software instructions executable by a processor to carry out one or more particular acts.

In the present disclosure, memory may be used in one configuration or another. The memory may be configured to store data. In the alternative or in addition, the memory may be a non-transitory computer readable medium (CRM) wherein the CRM is configured to store instructions executable by a processor. The instructions may be stored individually or as groups of instructions in files. The files may include functions, services, libraries, and the like. The files may include one or more computer programs or may be part of a larger computer program. Alternatively, or in addition, each file may include data or other computational support material useful to carry out the computing functions of the systems, methods, and apparatus described in the present disclosure.

The computing devices illustrated herein may further include operative software found in a conventional computing device such as an operating system or task loop, software drivers to direct operations through I/O circuitry, networking circuitry, and other peripheral component circuitry. In addition, the computing devices may include operative application software such as network software for communicating with other computing devices, database software for building and maintaining databases, and task management software where appropriate for distributing the communication and/or operational workload amongst various processors. In some cases, the computing device is a single hardware machine having at least some of the hardware and software listed herein, and in other cases, the computing device is a networked collection of hardware and software machines working together in a server farm to execute the functions of one or more embodiments described herein. Some aspects of the conventional hardware and software of the computing device are not shown in the figures for simplicity.

Amongst other things, at least certain ones of the exemplary computing devices of the present disclosure (e.g., computing server 160 and certain portions of the distribution transformer monitor 100*b* in FIG. 7) may be configured in any type of mobile or stationary computing device such as a remote cloud computer, a computing server, a smartphone, a tablet, a laptop computer, a wearable device (e.g., eyeglasses, jacket, shirt, pants, socks, shoes, other clothing, hat, helmet, other headwear, wristwatch, bracelet, pendant, other jewelry), vehicle-mounted device (e.g., train, plane, helicopter, unmanned aerial vehicle, unmanned underwater vehicle, unmanned land-based vehicle, automobile, motorcycle, bicycle, scooter, hover-board, other personal or commercial transportation device), industrial device (e.g., factory robotic device, home-use robotic device, retail robotic device, office-environment robotic device), or the like. Accordingly, the computing devices include other components and circuitry that is not illustrated, such as, for example, a display, a network interface, memory, one or more central processors, camera interfaces, audio interfaces, and other input/output interfaces. In some cases, the exemplary computing devices may also be configured in a different type of low-power device such as a mounted video camera, an Internet-of-Things (IoT) device, a multimedia device, a motion detection device, an intruder detection device, a security device, a crowd monitoring device, or some other device.

Input/output (I/O) circuitry and user interface (UI) modules include serial ports, parallel ports, universal serial bus (USB) ports, IEEE 802.11 transceivers and other transceivers compliant with protocols administered by one or more standard-setting bodies, displays, projectors, printers, keyboards, computer mice, microphones, micro-electro-mechanical (MEMS) devices such as accelerometers, and the like.

Buttons, keypads, computer mice, memory cards, serial ports, bio-sensor readers, touch screens, and the like may individually or in cooperation be useful to a user installing, maintaining, operating, overseeing, managing, or otherwise interested in the distribution transformer monitors of the present disclosure. The devices may, for example, input control information into the system. Displays, printers, memory cards, LED indicators, temperature sensors, audio devices (e.g., speakers, piezo device, etc.), vibrators, and the like are all useful to present output information to users of the distribution transformer monitors taught in the present disclosure. In some cases, the input and output devices are directly coupled to one or more processors 162 (FIG. 7) and electronically coupled to a processor or other operative circuitry. In other cases, the input and output devices pass information via one or more communication ports (e.g., RS-232, RS-485, infrared, USB, etc.).

In at least one embodiment, devices such as the computing server 160 and distribution transformer monitors 100*b* may communicate with other devices via communication over a network. The network may involve an Internet connection or some other type of local area network (LAN) or wide area network (WAN). Non-limiting examples of structures that enable or form parts of a network include, but are not limited to, an Ethernet, twisted pair Ethernet, digital subscriber loop (DSL) devices, wireless LAN, Wi-Fi, 4G, LTE, 5G, or the like.

FIG. 8 is a data flow diagram 200 illustrating one or more non-limiting processes that may be used by embodiments of computing devices such as the distribution transformer monitors 100*b* deployed on a light pole, power pole, in a vault, or in some other setting. In this regard, each described process may represent a module, segment, or portion of code, which comprises one or more executable instructions for implementing the specified logical function(s). It should also be noted that in some implementations, the functions noted in the process may occur in a different order, may include additional functions, may occur concurrently, and/or may be omitted.

The figures in the present disclosure illustrate portions of one or more non-limiting computing device embodiments such as one or more components of computing servers 160 and one or more components of distribution transformer monitors 100*b*. The computing devices may include operative hardware found in conventional computing device apparatuses such as one or more processors, volatile and non-volatile memory, serial and parallel input/output (I/O) circuitry compliant with various standards and protocols, wired and/or wireless networking circuitry (e.g., a communications transceiver), one or more user interface (UI) modules, logic, and other electronic circuitry.

The present application discusses several embodiments that include or otherwise cooperate with one or more computing devices. It is recognized that these computing devices are arranged to perform one or more algorithms to implement the inventive concepts taught herein. Each of said algorithms is understood to be a finite sequence of steps for solving a logical or mathematical problem or performing a task. Any or all of the algorithms taught in the present disclosure may be demonstrated by formulas, flow charts, data flow diagrams, narratives in the specification, and other such means as evident in the present disclosure. Along these lines, the structures to carry out the algorithms disclosed herein include at least one processor executing at least one software instruction retrieved from at least one memory device. The structures may, as the case may be, further include suitable input circuits known to one of skill in the art (e.g., keyboards, buttons, memory devices, communication circuits, touch screen inputs, and any other integrated and peripheral circuit inputs (e.g., accelerometers, thermometers, light detection circuits and other such sensors)), suitable output circuits known to one of skill in the art (e.g., displays, light sources, audio devices, tactile devices, control signals, switches, relays, and the like), and any additional circuits or other structures taught in the present disclosure. To this end, every invocation of means or step plus function elements in any of the claims, if so desired, will be expressly recited.

As used in the present disclosure, the term "module" refers to an application specific integrated circuit (ASIC), an electronic circuit, a processor and a memory operative to execute one or more software or firmware programs, combinational logic circuitry, or other suitable components (hardware, software, or hardware and software) that provide the functionality described with respect to the module.

The terms, "real-time" or "real time," as used herein and in the claims that follow, are not intended to imply instantaneous processing, transmission, reception, or otherwise as the case may be. Instead, the terms, "real-time" and "real time" imply that the activity occurs over an acceptably short period of time (e.g., over a period of microseconds or milliseconds), and that the activity may be performed on an ongoing basis (e.g., recording and reporting the collection of utility grade power metering data, recording and reporting IoT data, crowd control data, anomalous action data, and the like). An example of an activity that is not real-time is one that occurs over an extended period of time (e.g., hours or days)] or that occurs based on intervention or direction by a person or other activity.

In the absence of any specific clarification related to its express use in a particular context, where the terms "substantial" or "about" in any grammatical form are used as modifiers in the present disclosure and any appended claims (e.g., to modify a structure, a dimension, a measurement, or some other characteristic), it is understood that the characteristic may vary by up to 30 percent. For example, a distribution transformer monitor housing may be described as being mounted "substantially vertical," In these cases, a device that is mounted exactly vertical is mounted along an "X" axis and a "Y" axis that is normal (i.e., 90 degrees or at right angle) to a plane or line formed by a "Z" axis. Different from the exact precision of the term, "vertical," and the use of "substantially" or "about" to modify the characteristic permits a variance of the particular characteristic by up to 30 percent. As another example, a distribution transformer monitor housing having a particular linear dimension of between about five (5) inches and fourteen (14) inches includes such devices in which the linear dimension varies by up to 30 percent. Accordingly, the particular linear dimension of the distribution transformer monitor housing may be between 0.8 inches and 18.2 inches.

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges is also encompassed within the invention, subject to any specifically excluded limit in the stated range. Where the stated range includes one or both of the limits, ranges excluding either or both of those included limits are also included in the invention.

Unless defined otherwise, the technical and scientific terms used herein have the same meaning as commonly understood by one of ordinary skill in the art to which this invention belongs. Although any methods and materials similar or equivalent to those described herein can also be used in the practice or testing of the present invention, a limited number of the exemplary methods and materials are described herein.

In the present disclosure, when an element (e.g., component, circuit, device, apparatus, structure, layer, material, or the like) is referred to as being "on," "coupled to," or "connected to" another element, the elements can be directly on, directly coupled to, or directly connected to each other, or intervening elements may be present. In contrast, when an element is referred to as being "directly on," "directly coupled to," or "directly connected to" another element, there are no intervening elements present.

The terms "include" and "comprise" as well as derivatives and variations thereof, in all of their syntactic contexts, are to be construed without limitation in an open, inclusive sense, (e.g., "including, but not limited to"). The term "or," is inclusive, meaning and/or. The phrases "associated with" and "associated therewith," as well as derivatives thereof, can be understood as meaning to include, be included within, interconnect with, contain, be contained within, connect to or with, couple to or with, be communicable with, cooperate with, interleave, juxtapose, be proximate to, be bound to or with, have, have a property of, or the like.

Unless the context requires otherwise, throughout the specification and claims which follow, the word "comprise" and variations thereof, such as, "comprises" and "comprising," are to be construed in an open, inclusive sense, e.g., "including, but not limited to."

Reference throughout this specification to "one embodiment" or "an embodiment" and variations thereof means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the present disclosure, the terms first, second, etc., may be used to describe various elements, however, these elements are not be limited by these terms unless the context clearly requires such limitation. These terms are only used to distinguish one element from another. For example, a first machine could be termed a second machine, and, similarly, a second machine could be termed a first machine, without departing from the scope of the inventive concept.

As used in this specification and the appended claims, the singular forms "a," "an," and "the" include plural referents unless the content and context clearly dictates otherwise. It should also be noted that the conjunctive terms, "and" and "or" are generally employed in the broadest sense to include "and/or" unless the content and context clearly dictates inclusivity or exclusivity as the case may be. In addition, the composition of "and" and "or" when recited herein as "and/or" is intended to encompass an embodiment that includes all of the associated items or ideas and one or more other alternative embodiments that include fewer than all of the associated items or ideas.

In the present disclosure, conjunctive lists make use of a comma, which may be known as an Oxford comma, a Harvard comma, a serial comma, or another like term. Such lists are intended to connect words, clauses or sentences such that the thing following the comma is also included in the list.

As described herein, for simplicity, a user is in some case described in the context of the male gender. For example, the terms "his," "him," and the like may be used. It is understood that a user can be of any gender, and the terms "he," "his," and the like as used herein are to be interpreted broadly inclusive of all known gender definitions.

As the context may require in this disclosure, except as the context may dictate otherwise, the singular shall mean the plural and vice versa; all pronouns shall mean and include the person, entity, firm or corporation to which they relate; and the masculine shall mean the feminine and vice versa.

When so arranged as described herein, each computing device may be transformed from a generic and unspecific computing device to a combination device comprising hardware and software configured for a specific and particular purpose. When so arranged as described herein, to the extent that any of the inventive concepts described herein are found by a body of competent adjudication to be subsumed in an abstract idea, the ordered combination of elements and limitations are expressly presented to provide a requisite inventive concept by transforming the abstract idea into a tangible and concrete practical application of that abstract idea.

The embodiments described herein use computerized technology to improve the monitoring and safety of distribution transformers, but other techniques and tools remain available to monitor distribution transformers. Therefore, the claimed subject matter does not foreclose the whole or even substantial distribution transformers monitoring technological area. The innovation described herein uses both new and known building blocks combined in new and useful ways along with other structures and limitations to create something more than has heretofore been conventionally known. The embodiments improve on computing systems which, when un-programmed or differently programmed, cannot perform or provide the specific distribution transformer monitor features claimed herein. The embodiments described in the present disclosure improve upon known electrical device monitoring processes and techniques. The computerized acts described in the embodiments herein are not purely conventional and are not well understood. Instead, the acts are new to the industry. Furthermore, the combination of acts as described in conjunction with the present embodiments provides new information, motivation, and business results that are not already present when the acts are considered separately. There is no prevailing, accepted definition for what constitutes an abstract idea. To the extent the concepts discussed in the present disclosure may be considered abstract, the claims present significantly more tangible, practical, and concrete applications of said allegedly abstract concepts. And said claims also improve previously known computer-based systems that perform electrical device monitoring operations.

The headings and Abstract of the Disclosure provided herein are for convenience only and do not limit or interpret the scope or meaning of the embodiments.

The various embodiments described above can be combined to provide further embodiments. Aspects of the embodiments can be modified, if necessary to employ concepts of the various patents, application and publications to provide yet further embodiments.

In the embodiments of present disclosure, one or more particular sensors are arranged to generate data associated with certain conditions that exist in and around a distribution transformer. The various components and devices of the embodiments described herein are interchangeably described herein as "coupled," "connected," "attached," and the like. It is recognized that once assembled, the system is suitably sealed and suitably arranged to detect pressure in a distribution transformer vessel, to prevent oil from escaping a distribution transformer vessel, or to provide other determined features. The materials and the junctions formed at the point where two or more structures meet in the present embodiments are sealed or otherwise joined to a mechanically, electrically, or otherwise industrially acceptable level.

The distribution transformer monitoring systems described in the present disclosure provide several technical effects and advances to the field of electrical device monitoring.

Technical effects and benefits include the ability to improve the reliability and safety of the power grid by monitoring the internal and external operations of a distribution transformer in real time. For example, in at least one embodiment, sensors, such as infrared sensors, can be arranged outside of a distribution transformer vessel to monitor the internal temperature of various portions of the vessel. By monitoring the internal temperature, it can be learned in real time whether or not there is sufficient oil in a distribution transformer vessel and thereby prevent an explosion of the distribution transformer vessel if the oil level drops to low. In at least one embodiment, a pressure sensor can be arranged to monitor the internal pressure of a distribution transformer vessel. Monitoring the internal pressure is enabled via a pressure conveyance adapter. In at least one embodiment, sensors, such as audio sensors or infrared sensors, can be arranged to monitor operation of a surge arrestor. If the surge arrestor is used beyond a threshold number of times, and alert can be sent that indicates a possible future failure of the surge arrestor. In addition, or in the alternative, if the continuity of a surge arrestor is determined to have been broken, and more urgent alert can be sent that indicates that an imminent failure of the surge arrestor is possible.

The present disclosure sets forth details of various structural embodiments that may be arranged to carry the teaching of the present disclosure. By taking advantage of the flexible circuitry, mechanical structures, computing architecture, and communications means described herein, a number of exemplary devices and systems are now disclosed.

Example A-1 is a distribution transformer monitor, comprising a housing arranged for positioning in proximity to a distribution transformer vessel; a sensor arranged in the housing, the sensor positioned to generate digital data associated with at least one environmental condition that exists inside the distribution transformer vessel; and a processing circuit arranged to determine from the generated digital data that the at least one environmental condition has crossed a threshold.

Example A-2 may include the subject matter of Example A-1, and alternatively or additionally any other example herein, wherein the housing is between about four inches long (4 in.) and about fourteen inches long (14 in.), the housing is between about two inches wide (2 in.) and about seven inches wide (7 in.), and between about one inch tall (1 in.) and about six inches tall (6 in.).

Example A-3 may include the subject matter of Example A-2, and alternatively or additionally any other example herein, wherein the housing is formed, at least in part, from a glass-filled material.

Example A-4 may include the subject matter of Example A-2, and alternatively or additionally any other example herein, wherein the housing is formed, at least in part, from a nylon material.

Example A-5 may include the subject matter of Example A-2, and alternatively or additionally any other example herein, wherein the housing is formed, at least in part, from a polycarbonate material.

Example A-6 may include the subject matter of Example A-2, and alternatively or additionally any other example herein, wherein the housing is formed, at least in part, from a plastic resin material.

Example A-7 may include the subject matter of Example A-2, and alternatively or additionally any other example herein, wherein the housing is formed, at least in part, from an aluminum-based material.

Example A-8 may include the subject matter of Example A-2, and alternatively or additionally any other example herein, wherein the housing is formed, at least in part, from a heat stabilizing material.

Example A-9 may include the subject matter of Example A-2, and alternatively or additionally any other example herein, wherein the housing is formed, at least in part, from a heat conductive material.

Example A-10 may include the subject matter of Example A-2, and alternatively or additionally any other example herein, wherein the housing is formed, at least in part, from an electrical insulator material.

Example A-11 may include the subject matter of Example A-2, and alternatively or additionally any other example herein, wherein the housing is formed, at least in part, from an ultraviolet (UV) radiation resistant material.

Example A-12 may include the subject matter of Example A-2, and alternatively or additionally any other example herein, wherein the housing is formed, at least in part, from a material having an operating range of at least 140 degrees Fahrenheit.

Example A-13 may include the subject matter of Example A-2, and alternatively or additionally any other example herein, wherein the housing is formed, at least in part, from a heat-conductive material.

Example A-14 may include the subject matter of any of Examples A-1 to A-13, and alternatively or additionally any other example herein, wherein the processing circuit includes one or more processing devices working cooperatively.

Example A-15 may include the subject matter of any of Examples A-1 to A-13, and alternatively or additionally any other example herein, and further comprise the distribution transformer vessel and at least one distribution transformer arranged within the distribution transformer vessel.

Example A-16 may include the subject matter of any of Examples A-1 to A-13, and alternatively or additionally any other example herein, wherein the distribution transformer monitor is fixedly integrated with the distribution transformer vessel.

Example A-17 may include the subject matter of any of Examples A-1 to A-13, and alternatively or additionally any other example herein, wherein the distribution transformer monitor is removably integrated with the distribution transformer vessel.

Example A-18 may include the subject matter of any of Examples A-1 to A-13, and alternatively or additionally any other example herein, and further comprise at least one cable port arranged through the housing.

Example A-19 may include the subject matter of Example A-18, and alternatively or additionally any other example herein, wherein the at least one cable port includes at least one twist-lock connector arranged to provide cable access to an interior chamber of the housing.

Example A-20 may include the subject matter of Example A-18, and alternatively or additionally any other example herein, wherein the at least one cable port is arranged to receive a power-bearing cable.

Example A-21 may include the subject matter of Example A-18, and alternatively or additionally any other example herein, wherein the at least one cable port is a gland connector.

Example A-22 may include the subject matter of Example A-21, and alternatively or additionally any other example herein, wherein the at least one gland connector is arranged to receive a cable having an outside diameter of about two millimeters to about twenty millimeters (2-20 mm).

Example A-23 may include the subject matter of Example A-21, and alternatively or additionally any other example herein, wherein the at least one gland connector is arranged as a water-tight connector.

Example A-24 may include the subject matter of Example A-21, and alternatively or additionally any other example herein, wherein the at least one gland connector is arranged to provide strain relief to a cable passing through the at least one gland connector.

Example A-25 may include the subject matter of Example A-21, and alternatively or additionally any other example herein, wherein the at least one gland connector is arranged according to Ingress Protection standard IP67.

Example A-26 may include the subject matter of Example A-21, and alternatively or additionally any other example herein, wherein the at least one gland connector is arranged according to Ingress Protection standard IP68.

Example A-27 may include the subject matter of any of Examples A-1 to A-26, and alternatively or additionally any other example herein, and further comprise a plurality of cable ports arranged through the housing.

Example A-28 may include the subject matter of Example A-27, and alternatively or additionally any other example herein, wherein a first cable port of the plurality of cable ports is arranged to receive a power bearing cable and a second cable port of the plurality of cable ports is arranged to receive at least one of a camera information bearing cable, an infrared energy information bearing cable, and a current information bearing cable.

Example A-29 may include the subject matter of Example A-28, and alternatively or additionally any other example herein, wherein a third cable port of the plurality of cable ports is arranged to receive at least another one of the camera information bearing cable and the current information bearing cable.

Example A-30 may include the subject matter of any of Examples A-1 to A-29, and alternatively or additionally any other example herein, wherein the housing includes at least one right-angle indicator legend arranged to position the housing in a substantially vertical orientation relative to the distribution transformer vessel.

Example A-31 may include the subject matter of any of Examples A-1 to A-30, and alternatively or additionally any other example herein, and further comprise a pressure conveyance adapter, the pressure conveyance adapter having a substantially cylindrical barrel portion with a proximal end, a distal end, and a central portion, wherein an external surface of the proximal end of the barrel portion has integrated threads arranged to mate with a threaded aperture in the distribution transformer vessel, wherein an external surface of the distal end of the barrel portion is arranged to receive the housing, wherein an internal surface of the distal end of the barrel portion is threaded to rotatably receive a pressure relief valve, and wherein the barrel portion has at least one through-barrel aperture arranged to communicate a same level of pressure present inside the distribution transformer vessel through the pressure conveyance adapter.

Example A-32 may include the subject matter of Example A-31, and alternatively or additionally any other example herein, wherein the sensor is positioned proximate to the at least one through-barrel aperture and arranged to generate the digital data based on the communicated same level of pressure.

Example A-33 may include the subject matter of Example A-31, and alternatively or additionally any other example herein, and further comprise a locking collar, the locking collar arranged to bind the housing to distribution transformer vessel.

Example A-34 may include the subject matter of Example A-31, and alternatively or additionally any other example herein, and further comprise a sealing mechanism arranged to seal the at least one through-barrel aperture from an outside atmosphere when the housing is bound to the distribution transformer vessel.

Example A-35 may include the subject matter of Example A-34, and alternatively or additionally any other example herein, wherein the sealing mechanism includes at least one gasket and at least one sealing channel arranged to receive the at least one gasket, said at least one gasket in sealed communication with the pressure conveyance adapter and the housing when the housing is bound to the distribution transformer vessel.

Example A-36 may include the subject matter of any of Examples A-1 to A-35, and alternatively or additionally any other example herein, wherein the sensor is a pressure transducer, wherein the environmental condition is a pressure inside the distribution transformer vessel, and wherein the generated digital data represents the pressure.

Example A-37 may include the subject matter of any of Examples A-1 to A-36, and alternatively or additionally any other example herein, and further comprise a pressure conveyance adapter arranged to convey a pressure inside the distribution transformer vessel to a pressure relief valve and further arranged to expose the pressure inside the distribution transformer vessel to the sensor.

Example A-38 may include the subject matter of Example A-37, and alternatively or additionally any other example herein, wherein threads in the threaded aperture have a same pattern as threads on the internal surface of the distal end of the barrel portion.

Example A-39 may include the subject matter of any of Examples A-1 to A-38, and alternatively or additionally any other example herein, wherein the sensor is a pressure sensor.

Example A-40 may include the subject matter of Example A-39, and alternatively or additionally any other example herein, wherein the pressure sensor is a micro-electrical mechanical systems (MEMS) sensor.

Example A-41 may include the subject matter of Example A-39, and alternatively or additionally any other example herein, wherein the pressure sensor is configurable to detect pressure above a predetermined value.

Example A-42 may include the subject matter of Example A-39, and alternatively or additionally any other example herein, wherein the pressure sensor is arranged to detect a pressure greater than about two pounds per square inch (2 PSI).

Example A-43 may include the subject matter of Example A-39, and alternatively or additionally any other example herein, wherein the pressure sensor is arranged to detect a pressure greater than about ten pounds per square inch (10 PSI).

Example A-44 may include the subject matter of any of Examples A-1 to A-43, and alternatively or additionally any other example herein, wherein the sensor is a camera, and wherein the generated digital data includes one or more digital images of at least a portion of a wall of the distribution transformer vessel.

Example A-45 may include the subject matter of any of Examples A-1 to A-44, and alternatively or additionally any other example herein, wherein the sensor is a thermal imaging camera, and wherein the generated digital data indicates, based on temperature, how much radiation is being emitted from at least the portion of the wall of the distribution transformer vessel.

Example A-46 may include the subject matter of Example A-45, and alternatively or additionally any other example herein, wherein the portion of the wall includes at least at portion of at least two (2) vertical inches of the wall.

Example A-47 may include the subject matter of Example A-45, and alternatively or additionally any other example herein, wherein the portion of the wall includes at least at portion of at least six (6) vertical inches of the wall.

Example A-48 may include the subject matter of Example A-45, and alternatively or additionally any other example herein, wherein the portion of the wall includes at least at portion of at least twelve (12) vertical inches of the wall.

Example A-49 may include the subject matter of Example A-44, and alternatively or additionally any other example herein, wherein the camera is an infrared camera.

Example A-50 may include the subject matter of Example A-45, and alternatively or additionally any other example herein, wherein a spectral analysis of the generated digital data is performed to determine one or more temperatures of at least the portion of the wall of the distribution transformer vessel.

Example A-51 may include the subject matter of Example A-45, and alternatively or additionally any other example herein, wherein the thermal imaging camera has a field of view of at least 90 degrees.

Example A-52 may include the subject matter of Example A-45, and alternatively or additionally any other example herein, wherein the thermal imaging camera is positioned at least about one inch (1 in.) from the wall of the distribution transformer vessel.

Example A-53 may include the subject matter of Example A-45, and alternatively or additionally any other example herein, wherein the thermal imaging camera is positioned at least about one and one quarter inch (1.25 in.) from the wall of the distribution transformer vessel.

Example A-54 may include the subject matter of Example A-45, and alternatively or additionally any other example herein, wherein the thermal imaging camera is positioned at least about two inches (2 in.) from the wall of the distribution transformer vessel.

Example A-55 may include the subject matter of Example A-45, and alternatively or additionally any other example herein, wherein the thermal imaging camera is arranged to monitor at least about two inches (2 in.) of change in oil level within the distribution transformer vessel.

Example A-56 may include the subject matter of Example A-45, and alternatively or additionally any other example herein, wherein the thermal imaging camera is arranged to monitor at least about six inches (6 in.) of change in oil level within the distribution transformer vessel.

Example A-57 may include the subject matter of Example A-45, and alternatively or additionally any other example herein, wherein the thermal imaging camera is arranged to monitor at least about ten inches (10 in.) of change in oil level within the distribution transformer vessel.

Example A-58 may include the subject matter of Example A-45, and alternatively or additionally any other example herein, wherein a distance of the thermal imaging camera to at least the portion of the wall of the distribution transformer vessel is adjustable.

Example A-59 may include the subject matter of Example A-45, and alternatively or additionally any other example herein, wherein the thermal imaging camera is arranged to monitor an adjustable distance of oil level within the distribution transformer vessel.

Example A-60 may include the subject matter of Example A-45, and alternatively or additionally any other example herein, wherein the thermal imaging camera is mounted in a mechanically adjustable base.

Example A-61 may include the subject matter of Example A-45, and alternatively or additionally any other example herein, wherein the thermal imaging camera is mounted in an electromechanically adjustable base.

Example A-62 may include the subject matter of Example A-45, and alternatively or additionally any other example herein, wherein the thermal imaging camera is mounted in an electrically adjustable base.

Example A-62 may include the subject matter of Example A-44, and alternatively or additionally any other example herein, wherein the camera is an infrared camera, and wherein the at least one environmental condition is a temperature within the distribution transformer vessel.

Example A-63 may include the subject matter of Example A-62, and alternatively or additionally any other example herein, wherein the processing circuit is further arranged to determine, based on the temperature, that an oil level within the distribution transformer vessel has dropped below a determined oil level threshold.

Example A-64 may include the subject matter of any of Examples A-1 to A-63, and alternatively or additionally any other example herein, wherein the at least one environmental condition is a temperature of oil within the distribution transformer vessel.

Example A-65 may include the subject matter of any of Examples A-1 to A-64, and alternatively or additionally any other example herein, wherein the at least one environmental condition is a temperature of a gas within the distribution transformer vessel.

Example A-66 may include the subject matter of any of Examples A-1 to A-65, and alternatively or additionally any other example herein, wherein the at least one environmental condition is an oil level within the distribution transformer vessel.

Example A-67 may include the subject matter of any of Examples A-1 to A-66, and alternatively or additionally any other example herein, wherein the threshold is value representing a threshold temperature greater than about 180 degrees Fahrenheit.

Example A-68 may include the subject matter of any of Examples A-1 to A-67, and alternatively or additionally any other example herein, and further comprise a camera positioned to detect a status of a surge arrestor, the surge arrestor arranged to protect a distribution transformer within the distribution transformer vessel.

Example A-69 may include the subject matter of Example A-68, and alternatively or additionally any other example herein, wherein the camera is arranged to capture digital image data representing a current state of the surge arrestor, and wherein the processing circuit is further arranged to compare the captured digital image data with previously captured digital image data representing a previous state of the surge arrestor.

Example A-70 may include the subject matter of Example A-68, and alternatively or additionally any other example herein, wherein the processing circuit is arranged to automatically detect a misalignment of the camera.

Example A-71 may include the subject matter of Example A-68, and alternatively or additionally any other example herein, wherein the camera is a thermal imaging camera.

Example A-72 may include the subject matter of Example A-71, and alternatively or additionally any other example herein, wherein the processing circuit is further arranged to detect a utilization of the surge arrestor based on temperature data captured by the camera.

Example A-73 may include the subject matter of Example A-68, and alternatively or additionally any other example herein, wherein the surge arrestor is a metal oxide varistor.

Example A-74 may include the subject matter of Example A-68, and alternatively or additionally any other example herein, wherein the camera is arranged to capture a stream of digital image data.

Example A-75 may include the subject matter of Example A-68, and alternatively or additionally any other example herein, and further comprise a mounting mechanism for the camera.

Example A-76 may include the subject matter of Example A-75, and alternatively or additionally any other example herein, wherein the mounting mechanism includes at least one magnet arranged to mechanically couple the camera to the distribution transformer vessel.

Example A-77 may include the subject matter of Example A-75, and alternatively or additionally any other example herein, wherein the mounting mechanism is arranged to provide the camera with a line of sight view of the surge arrestor.

Example A-78 may include the subject matter of Example A-75, and alternatively or additionally any other example herein, and further comprise a camera information bearing cable arranged to communicate the camera information to the processing circuit.

Example A-79 may include the subject matter of any of Examples A-1 to A-78, and alternatively or additionally any other example herein, and further comprise a microphone circuit positioned to detect a gunshot audio pattern emanating from a surge arrestor electrically coupled to a distribution transformer within the distribution transformer vessel.

Example A-80 may include the subject matter of Example A-79, and alternatively or additionally any other example herein, wherein the surge arrestor is a metal oxide varistor, an air gap device, or a gas tube device.

Example A-81 may include the subject matter of any of Examples A-1 to A-78, and alternatively or additionally any other example herein, and further comprise a microphone circuit positioned to detect a status of a surge arrestor, the surge arrestor arranged to protect a distribution transformer within the distribution transformer vessel.

Example A-82 may include the subject matter of Example A-81, and alternatively or additionally any other example herein, wherein the microphone is arranged to capture digital audio data representing a current state of the surge arrestor, and wherein the processing circuit is further arranged to compare the captured digital audio data with previously captured digital audio data representing a previous state of the surge arrestor.

Example A-83 may include the subject matter of Example A-81, and alternatively or additionally any other example herein, wherein the microphone is arranged to capture digital audio data proximate the surge arrestor, and wherein the processing circuit is further arranged to determine that the captured digital audio data matches a pattern of a high current passing through the surge arrestor.

Example A-84 may include the subject matter of Example A-83, and alternatively or additionally any other example herein, wherein the high current condition indicates a lightning strike proximate the distribution transformer vessel.

Example A-85 may include the subject matter of Example A-83, and alternatively or additionally any other example herein, wherein the high current condition indicates a switching surge, transient, noise, incorrect electrical connection, static electricity discharge, power surge, or power spike.

Example A-86 may include the subject matter of Example A-83, and alternatively or additionally any other example herein, wherein the surge arrestor is an air gap surge arrestor or a gas tube surge arrestor.

Example A-87 may include the subject matter of Example A-81, and alternatively or additionally any other example herein, wherein the microphone is arranged to capture digital audio data representing a current state of the surge arrestor, and wherein the processing circuit is further arranged to execute a gunshot detection algorithm, said gunshot detection algorithm arranged to detect a lightning strike proximate the distribution transformer vessel.

Example A-88 may include the subject matter of Example A-81, and alternatively or additionally any other example herein, wherein the surge arrestor is a metal oxide varistor.

Example A-89 may include the subject matter of Example A-81, and alternatively or additionally any other example herein, wherein the microphone circuit is arranged to capture a stream of digital audio data, and wherein the processing circuit is arranged to determine a deterioration in effectiveness of the surge arrestor.

Example A-90 may include the subject matter of Example A-81, and alternatively or additionally any other example herein, further comprising a mounting mechanism for the microphone circuit.

Example A-91 may include the subject matter of Example A-90, and alternatively or additionally any other example herein, wherein the mounting mechanism includes at least one magnet arranged to mechanically couple the microphone circuit to the distribution transformer vessel.

Example A-92 may include the subject matter of Example A-90, and alternatively or additionally any other example herein, wherein the mounting mechanism is arranged to position the microphone circuit within audio proximity of the surge arrestor.

Example A-93 may include the subject matter of Example A-90, and alternatively or additionally any other example herein, and further comprise an audio information bearing cable arranged to communicate the audio information to the processing circuit.

Example A-94 may include the subject matter of any of Examples A-1 to A-93, and alternatively or additionally any other example herein, and further comprise a temperature sensor circuit positioned to detect an ambient temperature proximate to the distribution transformer vessel.

Example A-95 may include the subject matter of Example A-94, and alternatively or additionally any other example herein, wherein the temperature sensor circuit is arranged to generate temperature information, and wherein the processing circuit is arranged to algorithmically determine at least one temperature inside the distribution transformer vessel based at least in part on the temperature information.

Example A-96 may include the subject matter of any of Examples A-1 to A-95, and alternatively or additionally any other example herein, and further comprise a Rogowski coil circuit positioned to generate current information representing at least one current sourced from a secondary winding of a distribution transformer within the distribution transformer vessel.

Example A-97 may include the subject matter of Example A-96, and alternatively or additionally any other example herein, wherein the processing circuit is further arranged to determine that the at least one current has crossed a determined current threshold.

Example A-98 may include the subject matter of Example A-97, and alternatively or additionally any other example herein, wherein the determined current threshold is a determined minimum current.

Example A-99 may include the subject matter of Example A-97, and alternatively or additionally any other example herein, wherein the determined current threshold is a determined maximum current.

Example A-100 may include the subject matter of Example A-96, and alternatively or additionally any other example herein, wherein at least a portion of the Rogowski coil circuit is arranged in a sub-assembly, the sub-assembly remotely coupled to the housing.

Example A-101 may include the subject matter of Example A-96, and alternatively or additionally any other example herein, and further comprise a mounting mechanism arranged to couple the Rogowski coil circuit to the housing.

Example A-102 may include the subject matter of Example A-101, and alternatively or additionally any other example herein, wherein the mounting mechanism includes at least one magnet.

Example A-103 may include the subject matter of Example A-101, and alternatively or additionally any other example herein, wherein the mounting mechanism includes at least one wiring harness.

Example A-104 may include the subject matter of Example A-96, and alternatively or additionally any other example herein, wherein a primary winding of the distribution transformer is arranged to receive power supplied at 120 VAC, 208 VAC, 220 VAC, 240 VAC, 260 VAC, 277 VAC, 360 VAC, 415 VAC, 480 VAC, or 600 VAC.

Example A-105 may include the subject matter of any of Examples A-1 to A-104, and alternatively or additionally any other example herein, wherein the sensor is an accelerometer, and wherein the at least one environmental condition is a directional orientation of the distribution transformer vessel.

Example A-106 may include the subject matter of Example A-105, and alternatively or additionally any other example herein, wherein the sensor is an accelerometer, and wherein the at least one environmental condition is a directional orientation of the housing.

Example A-107 may include the subject matter of Example A-105, and alternatively or additionally any other example herein, wherein the sensor is an accelerometer, and wherein the at least one environmental condition is a vibration of the distribution transformer vessel.

Example A-108 may include the subject matter of Example A-107, and alternatively or additionally any other example herein, wherein the accelerometer is a microelectromechanical sensor (MEMS) based accelerometer.

Example A-109 may include the subject matter of any of Examples A-1 to A-108, and alternatively or additionally any other example herein, and further comprise a location determination circuit, the location determination circuit arranged to provide geographic information represent a geographic location of the housing.

Example A-110 may include the subject matter of Example A-109, and alternatively or additionally any other example herein, wherein the geographic information is unique geographic information in the world.

Example A-111 may include the subject matter of Example A-109, and alternatively or additionally any other example herein, wherein the geographic information is unique amongst a system that comprises a determined plurality of distribution transformer monitors.

Example A-112 may include the subject matter of Example A-109, and alternatively or additionally any other example herein, wherein the geographic information is a system-wide unique identifier.

Example A-113 may include the subject matter of Example A-112, and alternatively or additionally any other example herein, wherein the system-wide unique identifier is an alphabetic identifier, a numerical identifier, or an alphanumeric identifier.

Example A-114 may include the subject matter of Example A-109, and alternatively or additionally any other example herein, wherein the location determination circuit includes a global positioning system (GPS) device.

Example A-115 may include the subject matter of Example A-109, and alternatively or additionally any other example herein, wherein the location determination circuit includes a BeiDou navigation system device.

Example A-116 may include the subject matter of Example A-109, and alternatively or additionally any other example herein, wherein the location determination circuit includes a global navigation satellite system (GLONASS) device.

Example A-117 may include the subject matter of Example A-109, and alternatively or additionally any other example herein, wherein the location determination circuit includes a memory arranged to store a device identifier.

Example A-118 may include the subject matter of any of Examples A-1 to A-117, and alternatively or additionally any other example herein, and further comprise a transceiver, the transceiver arranged to communicate distribution transformer status information to at least one remote computing device.

Example A-119 may include the subject matter of Example A-118, and alternatively or additionally any other example herein, wherein the transceiver is a wireless transceiver.

Example A-120 may include the subject matter of Example A-119, and alternatively or additionally any other example herein, wherein the wireless transceiver is arranged to operate according to at least one cellular-based protocol.

Example A-121 may include the subject matter of Example A-119, and alternatively or additionally any other example herein, wherein the wireless transceiver is arranged to operate according to at least IEEE 802.11 (WiFi) protocol.

Example A-122 may include the subject matter of Example A-119, and alternatively or additionally any other example herein, wherein the wireless transceiver is arranged to operate according to at least one BLUETOOTH protocol.

Example A-123 may include the subject matter of Example A-118, and alternatively or additionally any other example herein, wherein the transceiver is a wired transceiver.

Example A-124 may include the subject matter of Example A-123, and alternatively or additionally any other example herein, wherein the wired transceiver is arranged to operate according to at least one Ethernet protocol.

Example A-125 may include the subject matter of Example A-123, and alternatively or additionally any other example herein, wherein the wired transceiver is arranged to operate according to at least one powerline communications (PLC) protocol.

Example A-126 may include the subject matter of Example A-118, and alternatively or additionally any other example herein, wherein the distribution transformer status information is encrypted prior to communication.

Example A-127 may include the subject matter of any of Examples A-1 to A-126, and alternatively or additionally any other example herein, and further comprise a human interface device (HID) circuit coupled to the processing circuit, the HID circuit arranged to communicate status information generated by the distribution transformer monitor.

Example A-128 may include the subject matter of Example A-127, and alternatively or additionally any other example herein, wherein the HID circuit includes at least one visual indicator.

Example A-129 may include the subject matter of Example A-127, and alternatively or additionally any other example herein, wherein the HID circuit includes a pilot light circuit, the pilot light circuit including at least one light source.

Example A-130 may include the subject matter of Example A-129, and alternatively or additionally any other example herein, wherein the light source includes at least one light emitting diode (LED).

Example A-131 may include the subject matter of Example A-127, and alternatively or additionally any other example herein, wherein the HID circuit includes at least one device arranged to produce video information.

Example A-132 may include the subject matter of Example A-127, and alternatively or additionally any other example herein, wherein the HID circuit includes at least one device arranged to project video information.

Example A-133 may include the subject matter of Example A-127, and alternatively or additionally any other example herein, wherein the HID circuit includes at least one audio indicator.

Example A-134 may include the subject matter of Example A-127, and alternatively or additionally any other example herein, wherein a human perceptible intensity of the status information is adjustable.

Example A-135 may include the subject matter of Example A-134, and alternatively or additionally any other example herein, wherein the HID circuit includes at least one light emitting diode (LED), and wherein the human perceptible intensity includes a brightness of the LED.

Example A-136 may include the subject matter of any of Examples A-1 to A-135, and alternatively or additionally any other example herein, and further comprise a remote computing device arranged to receive status information generated by the distribution transformer monitor.

Example A-137 may include the subject matter of Example A-136, and alternatively or additionally any other example herein, and further comprise a remote computing device, the remote computing device arranged to monitor status information from a plurality of distribution transformer monitors.

Example A-138 may include the subject matter of Example A-137, and alternatively or additionally any other example herein, wherein the remote computing device is arranged to implement at least one pattern matching algorithm.

Example A-139 may include the subject matter of Example A-138, and alternatively or additionally any other example herein, wherein the at least one pattern matching algorithm is arranged to identify a lightning strike in proximity to a certain distribution transformer vessel based on audio information collected from at least some of the plurality of distribution transformer monitors.

Example A-140 may include the subject matter of Example A-138, and alternatively or additionally any other example herein, wherein the at least one pattern matching algorithm is arranged to identify a lightning strike in proximity to a certain distribution transformer vessel based on video information collected from at least some of the plurality of distribution transformer monitors.

Example A-141 may include the subject matter of Example A-138, and alternatively or additionally any other example herein, wherein the at least one pattern matching algorithm is arranged to identify a lightning strike in proximity to a certain distribution transformer vessel based on temperature information collected from at least some of the plurality of distribution transformer monitors.

Example A-142 may include the subject matter of Example A-138, and alternatively or additionally any other example herein, wherein the at least one pattern matching algorithm is arranged to identify a lightning strike in proximity to a certain distribution transformer vessel based on infrared information collected from at least some of the plurality of distribution transformer monitors.

Example A-143 may include the subject matter of Example A-137, and alternatively or additionally any other example herein, wherein at least some of the status information is presentable via an Internet-accessible computing server.

Example A-144 may include the subject matter of Example A-143, and alternatively or additionally any other example herein, wherein the Internet-accessible computing server is configured as a web server.

Example A-145 may include the subject matter of Example A-137, and alternatively or additionally any other example herein, wherein at least some of the status information is receivable via at least one web page served from an Internet-connected computing server communicatively coupled to the remote computing device.

Example A-146 may include the subject matter of any of Examples A-1 to A-145, and alternatively or additionally any other example herein, wherein the at least one environmental condition is pressure within the distribution transformer vessel.

Example A-147 may include the subject matter of any of Examples A-1 to A-146, and alternatively or additionally any other example herein, wherein the at least one environmental condition is a gaseous pressure within the distribution transformer vessel.

Example A-148 may include the subject matter of any of Examples A-1 to A-147, and alternatively or additionally any other example herein, wherein the at least one environmental condition is a liquid pressure within the distribution transformer vessel.

Example A-149 may include the subject matter of any of Examples A-1 to A-148, and alternatively or additionally any other example herein, wherein the at least one environmental condition is a temperature within the distribution transformer vessel.

Example A-150 may include the subject matter of any of Examples A-1 to A-149, and alternatively or additionally any other example herein, wherein the at least one environmental condition is a temperature external and proximal to the distribution transformer vessel.

Example A-151 may include the subject matter of any of Examples A-1 to A-150, and alternatively or additionally any other example herein, wherein the at least one environmental condition is a temperature of oil within the distribution transformer vessel.

Example A-152 may include the subject matter of any of Examples A-1 to A-151, and alternatively or additionally any other example herein, wherein the at least one environmental condition is a temperature of a gas within the distribution transformer vessel.

Example A-153 may include the subject matter of any of Examples A-1 to A-152, and alternatively or additionally any other example herein, wherein the threshold is greater than two pounds per square inch (2 PSI).

Example A-154 may include the subject matter of any of Examples A-1 to A-153, and alternatively or additionally any other example herein, wherein the threshold is greater than five pounds per square inch (5 PSI).

Example A-155 may include the subject matter of any of Examples A-1 to A-154, and alternatively or additionally any other example herein, and further comprise: a substantially cylindrical insert having outside threads arranged to rotatably cooperate with a threaded aperture in the distribution transformer vessel.

Example A-156 may include the subject matter of Example A-155, and alternatively or additionally any other example herein, wherein the substantially cylindrical insert has a second set of outside threads arranged to receive a threaded binding structure, the threaded binding structure arranged to secure the housing.

Example A-157 may include the subject matter of Example A-156, and alternatively or additionally any other example herein, wherein the substantially threaded cylindrical insert has a set of inside threads proximate to the second set of outside threads, the set of inside threads arranged to receive a pressure relief valve Example A-158 may include the subject matter of any of Examples A-1 to A-157, and alternatively or additionally any other example herein, wherein the distribution transformer vessel is aerially mounted (e.g., on poles, buildings, or other structures), configured at or below ground level, or configured in a vault.

Example A-159 may include the subject matter of any of Examples A-1 to A-158, and alternatively or additionally any other example herein, wherein the distribution transformer vessel includes a mechanical pressure relief valve.

Example A-160 may include the subject matter of any of Examples A-1 to A-159, and alternatively or additionally any other example herein, wherein the distribution transformer monitor includes a user interface.

Example A-161 may include the subject matter of Example A-160, and alternatively or additionally any other example herein, wherein the user interface includes at least one of a website, a light source such as a controllable pilot light, a transceiver, an audio output device such as a horn, bell, or piezo-based device.

Example A-162 may include the subject matter of Example A-160, and alternatively or additionally any other example herein, wherein the user interface excludes any human-perceptible user-interface integrated or proximate the distribution transformer vessel.

Example A-163 may include the subject matter of any of Examples A-1 to A-162, and alternatively or additionally any other example herein, wherein the housing is internally coated, externally coated, internally and externally coated, or not coated at all.

Example A-164 may include the subject matter of Example A-163, and alternatively or additionally any other example herein, wherein the coating includes a paint, a dye, or a polymer that is sprayed, anodized, sputtered, brushed, immersed, layered, or baked-on.

Example B-1 is a method, comprising: collecting data with at least one electronic sensor positioned outside of a distribution transformer vessel, said distribution transformer vessel containing a distribution transformer that is electrically coupled to a high voltage line; receiving the collected data from the at least one electronic sensor at a processing device; monitoring, with the processing device, one or more environmental conditions present inside the distribution transformer vessel, said one or more environmental conditions being represented by at least some of the collected data; based on the monitoring, asserting a warning signal when a first environmental condition has crossed a predetermined threshold; and communicating digital data to a remote computing device, the digital data including at least one digital data value drawn from the collected data and the warning signal.

Example C-1 is a non-transitory computer-readable storage medium whose stored contents configure a computing system to perform a method, the method comprising: receiving electronic data generated by at least one sensor located external and adjacent to a distribution transformer vessel, said distribution transformer vessel containing a distribution transformer that is electrically coupled to a high voltage line, said electronic data being a representation of at least one condition inside the distribution transformer vessel; comparing at least some of the received electronic data to a predetermined threshold; and based on the comparing, asserting a warning signal indicating that at least some of the received electronic data has crossed the predetermined threshold.

Example D-1 is a monitor system for a distribution transformer, comprising: a processing circuit; and, optionally, any one or more of: a pressure sensor coupled to the processing circuit, the pressure sensor arranged to generate pressure data representing a pressure inside a distribution transformer vessel; a first camera coupled to the processing circuit, the first camera arranged to generate infrared temperature data representing temperature information inside the distribution transformer vessel; a thermometer coupled to the processing circuit, the thermometer arranged to generate ambient temperature data representing ambient temperature information outside the distribution transformer vessel; a second camera coupled to the processing circuit, the second camera arranged to generate digital picture information representing a state of a surge arrestor; an audio sensor coupled to the processing circuit, the audio sensor arranged to capture audio information in proximity to the distribution transformer; an electrical parameter detection circuit coupled to the processing circuit, the electrical parameter detection circuit arranged to generate electrical state information representing at least one of a voltage, a current, and a power generated in the distribution transformer; at least one accelerometer coupled to the processing circuit, the accelerometer arranged to generate physical status information associated with the distribution transformer; a location determination circuit coupled to the processing circuit, the location determination circuit arranged to generate location information associated with the distribution transformer; a transceiver coupled to the processing circuit; and a memory having processor circuit-executable instructions stored therein. The processing circuit-executable instructions are arranged to cause the processing circuit to: generate a first determination, based on the pressure data, whether a pressure threshold has been crossed; and/or generate a second determination, based on the infrared temperature data, whether a first temperature threshold has been crossed; and/or generate a third determination, based on the ambient temperature data, whether a second temperature threshold has been crossed; and/or generate a fourth determination, based on the audio information, whether a surge arrestor has been utilized, exhausted, depleted, expended, or otherwise consumed; and/or generate a fifth determination, based on the electrical state information, whether an electrical threshold has been crossed; and/or generate a sixth determination, based on the physical status information whether the distribution transformer has tilted beyond a first tilt threshold; and direct the transceiver to communicate an alert message in response to at least one determination, said alert message including the location information.

The various embodiments described above can be combined to provide further embodiments. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

This application claims the benefit of priority to U.S. Provisional Application No. 62/875,411, filed Jul. 17, 2019, which application is hereby incorporated by reference in its entirety.

The invention claimed is:

1. A distribution transformer monitor, comprising:
a housing arranged for positioning proximate to a distribution transformer vessel that is filled with a non-conductive medium;
a processing circuit arranged in the housing and configured to determine, from generated digital data, that at least one environmental condition existing inside the distribution transformer vessel has crossed a threshold; and
a sensor electrically coupled to the processing circuit, the sensor positioned to generate at least some of the digital data associated with the at least one environmental condition;
wherein the sensor includes an infrared camera sensor, and
wherein the housing is mechanically coupleable to the distribution transformer vessel in an orientation that aligns a field of view of the infrared camera sensor with a sidewall portion of the distribution transformer vessel that windows a fill level of the non-conductive medium.

2. The distribution transformer monitor of claim 1 wherein the processing circuit is further arranged to generate an alert based on a determination that the at least one environmental condition has crossed the threshold.

3. The distribution transformer monitor of claim 2 wherein the at least one environmental condition includes a temperature, a pressure, an electrical voltage, or an electrical current.

4. The distribution transformer monitor of claim 2, further comprising:
a transceiver arranged to wirelessly communicate the alert to a remote computing device.

5. The distribution transformer monitor of claim 1, further comprising:
a pressure sensor electrically coupled to the processing circuit, the pressure sensor arranged to generate pressure data representative of a pressure inside the distribution transformer vessel, wherein the generated digital data includes at least some of the pressure data.

6. The distribution transformer monitor of claim 1, further comprising:
a Rogowski circuit electrically coupled to the processing circuit, the Rogowski circuit arranged to generate electrical data representative of at least one of an electrical voltage and an electrical current inside the distribution transformer vessel, wherein the generated digital data includes at least some of the electrical data.

7. The distribution transformer monitor of claim 1 wherein the housing is between about three inches long (3 in.) and about twenty-four inches long (24 in.), the housing is between about two inches wide (2 in.) and about eight inches wide (8 in.), and between about one inch tall (1 in.) and about eight inches tall (8 in.).

8. The distribution transformer monitor of claim 1 wherein the housing includes at least one indicator legend arranged to facilitate positioning of the housing in a substantially vertical orientation relative to the distribution transformer vessel.

9. The distribution transformer monitor of claim 1, wherein the housing being mechanically coupleable to the distribution transformer vessel in an orientation that aligns the field of view of the infrared camera sensor with the sidewall portion of the distribution transformer vessel that windows the fill level of the non-conductive medium includes the infrared camera sensor being aligned relative to the sidewall portion of the distribution transformer vessel to obtain data to determine the fill level of the non-conductive medium.

10. The distribution transformer monitor of claim 1, wherein the housing being mechanically coupleable to the distribution transformer vessel in an orientation that aligns the field of view of the infrared camera sensor with the sidewall portion of the distribution transformer vessel that windows the fill level of the non-conductive medium includes the infrared camera sensor being aligned relative to the sidewall portion of the distribution transformer vessel to provide data to estimate the fill level of the non-conductive medium.

11. A method, comprising:
collecting data with at least one electronic sensor positioned outside of a distribution transformer vessel, said distribution transformer vessel containing a distribution transformer that is immersed in a non-conductive medium and electrically coupled to a high voltage line;
receiving the collected data from the at least one electronic sensor at a processing device arranged inside a housing of a distribution transformer monitor that is positioned proximate to a distribution transformer vessel;
monitoring, with the processing device, one or more environmental conditions present inside the distribution transformer vessel, said one or more environmental conditions being represented by at least some of the collected data;
based on the monitoring, asserting a warning signal when a first environmental condition has crossed a predetermined threshold; and
communicating digital data to a remote computing device, the digital data including at least one digital data value drawn from the collected data and the warning signal; and
positioning the housing of the distribution transformer monitor in a substantially vertical orientation relative to the distribution transformer vessel based at least in part on an indicator legend formed on the housing.

12. The method of claim 11 wherein the at least one electronic sensor includes at least one of an infrared camera sensor, a pressure sensor, and a Rogowski circuit.

13. The method of claim 11 wherein the one or more environmental conditions include a level of non-conductive medium inside the distribution transformer vessel.

14. The method of claim 11 wherein the one or more environmental conditions include at least one of a temperature, a pressure, an electrical voltage, and an electrical current.

15. The method of claim 11, further comprising:
processing, at the remote computing device, a plurality of sets of digital data received, respectively, from a plurality of distribution transformer monitors;
determining from the processing at least one pattern formed from data included in the plurality of sets of digital data; and
identifying an impending maintenance condition in at least one distribution transformer based on the at least pattern.

16. A non-transitory computer-readable storage medium whose stored contents configure a computing system to perform a method, the method comprising:
receiving electronic data generated by at least one sensor located external and proximate to a distribution transformer vessel, said distribution transformer vessel containing a distribution transformer that is immersed in a non-conductive medium and electrically coupled to a high voltage line, said electronic data being a representation of at least one condition inside the distribution transformer vessel;

comparing at least some of the received electronic data to a predetermined threshold; and based on the comparing, asserting an alert indicating that at least some of the received electronic data has crossed the predetermined threshold;

wirelessly communicating the alert to a remote computing device;

receiving a plurality of electronic data generated by a respective plurality of sensors located external and proximate to a respective plurality of distribution transformer vessels, each of said distribution transformer vessels containing a respective distribution transformer that is immersed in a respective non-conductive medium and electrically coupled to a respective high voltage line, said plurality of electronic data being a representation of at least one condition inside the respective distribution transformer vessel;

detecting at least one pattern in the plurality of received electronic data; and identifying at least one impending maintenance condition in at least one of the plurality of distribution transformers based on the at least one pattern.

17. The non-transitory computer-readable storage medium according to claim 16 whose stored contents configure the computing system to perform the method, the method further comprising:

wirelessly communicating the alert to a remote computing device.

18. The non-transitory computer-readable storage medium according to claim 16 whose stored contents configure the computing system to perform the method wherein the electronic data includes data representing at least one of a temperature, a pressure, an electrical voltage, and an electrical current present inside the distribution transformer vessel.

* * * * *